United States Patent
Lu et al.

(10) Patent No.: US 12,165,593 B2
(45) Date of Patent: Dec. 10, 2024

(54) DISPLAY PANEL AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Hongting Lu, Beijing (CN); Hang Dong, Beijing (CN); Xing Huang, Beijing (CN); Xingyu Chen, Beijing (CN); Lian Xiang, Beijing (CN); Yanping Ren, Beijing (CN); Xueying He, Beijing (CN); Changlong Yuan, Beijing (CN)

(73) Assignees: Beijing BOE Technology Development Co., Ltd., Beijing (CN); Chengdu BOE Optoelectronics Technology Co., Ltd., Sichuan (CN)

( * ) Notice: Subject to any disclaimer, the term of this patent is extended or adjusted under 35 U.S.C. 154(b) by 0 days.

(21) Appl. No.: 18/275,013

(22) PCT Filed: Jul. 21, 2022

(86) PCT No.: PCT/CN2022/107067
§ 371 (c)(1),
(2) Date: Jul. 30, 2023

(87) PCT Pub. No.: WO2023/005795
PCT Pub. Date: Feb. 2, 2023

(65) Prior Publication Data
US 2024/0312414 A1    Sep. 19, 2024

(30) Foreign Application Priority Data
Jul. 30, 2021    (CN) .......................... 202110873361.7

(51) Int. Cl.
G09G 3/3241    (2016.01)
G09G 3/20    (2006.01)
G11C 19/28    (2006.01)

(52) U.S. Cl.
CPC ......... *G09G 3/3241* (2013.01); *G11C 19/287* (2013.01); *G09G 3/2074* (2013.01);
(Continued)

(58) Field of Classification Search
CPC .............................. G09G 3/3241; G09G 3/20
See application file for complete search history.

(56) References Cited

U.S. PATENT DOCUMENTS

2006/0125807 A1    6/2006    Park et al.
2012/0293478 A1*   11/2012   Chaji .................... G09G 3/006
                                                      345/76
(Continued)

FOREIGN PATENT DOCUMENTS

CN    108878494 A    11/2018
CN    111696486 A    9/2020
(Continued)

OTHER PUBLICATIONS

International Search Report for PCT/CN2022/107067 Mailed Sep. 21, 2022.
Office Action dated May 30, 2023 for Chinese Patent Application No. 202110873361.7 and English Translation.
Office Action dated Nov. 9, 2023 for Chinese Patent Application No. 202110873361.7 and English Translation.

*Primary Examiner* — Kevin M Nguyen
(74) *Attorney, Agent, or Firm* — Ling Wu; Stephen Yang; Ling and Yang Intellectual Property

(57) ABSTRACT

A display panel and a display device. The display panel comprises: a substrate, a display area (100) provided with at least one light-emitting signal line (E), at least one first reset signal line (R) and sub-pixels arranged in an array, at least one sub-pixel (P1, P2, P3) comprising: a light-emitting device (L) and a pixel circuit. The first reset signal line (R)

(Continued)

is configured to provide a reset control signal for the pixel circuit, the light-emitting signal line is configured to provide a light-emitting control signal for the pixel circuit to provide a driving current. For the first reset signal line and the light-emitting signal line E connected to a same pixel circuit, the duration in which the signal of the light-emitting signal line is an invalid level signal is equal to the duration in which the signal of the first reset signal line is a valid level signal.

20 Claims, 19 Drawing Sheets

(52) U.S. Cl.
CPC ............... *G09G 2300/0819* (2013.01); *G09G 2300/0852* (2013.01); *G09G 2300/0861* (2013.01); *G09G 2310/0286* (2013.01); *G09G 2310/061* (2013.01); *G09G 2320/043* (2013.01)

(56) References Cited

U.S. PATENT DOCUMENTS

| | | |
|---|---|---|
| 2014/0292623 A1 | 10/2014 | Moon et al. |
| 2017/0249882 A1* | 8/2017 | Lee ..................... G09G 3/3241 |
| 2022/0270530 A1 | 8/2022 | Wang et al. |
| 2022/0301488 A1 | 9/2022 | Wang et al. |

FOREIGN PATENT DOCUMENTS

| | | |
|---|---|---|
| CN | 111754921 A | 10/2020 |
| CN | 111754922 A | 10/2020 |
| CN | 112233621 A | 1/2021 |
| CN | 112951160 A | 6/2021 |
| KR | 20060056786 A | 5/2006 |
| KR | 20140120167 A | 10/2014 |

\* cited by examiner

DISPLAY PANEL AND DISPLAY DEVICE

CROSS-REFERENCE TO RELATED APPLICATIONS

The present application is a U.S. National Phase Entry of International Application No. PCT/CN2022/107067 having an international filing date of Jul. 21, 2022, which claims priority to Chinese Patent Application No. 202110873361.7 entitled "Display Panel and Display Apparatus" and filed to the CNIPA on Jul. 30, 2021. The above-identified applications should be construed as being incorporated herein by reference in their entireties.

TECHNICAL FIELD

Embodiments of the present disclosure relate to, but are not limited to, the field of display technology, particularly to a display panel and a display apparatus.

BACKGROUND

An Organic Light Emitting Diode (OLED for short) and a Quantum dot Light Emitting Diode (QLED for short) are active light emitting display devices, and have advantages such as self-luminescence, a wide viewing angle, a high contrast ratio, low power consumption, an extremely high response speed, lightness and thinness, flexibility, and a low cost. With continuous development of display technologies, a flexible display that adopts an OLED or a QLED as a light emitting device and performs signal control by a Thin Film Transistor (TFT for short) has become a mainstream product in the field of display at present.

SUMMARY

The following is a summary of subject matter described herein in detail. The summary is not intended to limit the protection scope of claims.

In a first aspect, the present disclosure provides a display panel, including a substrate, which includes a display region and a non-display region, wherein the display region is provided with at least one light emitting signal line, at least one first reset signal line and sub-pixels arranged in an array, and at least one sub-pixel includes a light emitting device and a pixel circuit; the pixel circuit is connected with an anode of the light emitting device.

The pixel circuit is respectively connected with the first reset signal line and the light emitting signal line, wherein the first reset signal line is configured to provide a reset control signal to the pixel circuit to reset the anode of the light emitting device, and the light emitting signal line is configured to provide a light emitting control signal to the pixel circuit to provide a drive current to the anode of the light emitting device.

For a first reset signal line and a light emitting signal line connected with a same pixel circuit, when a signal of the first reset signal line is an effective level signal, a signal of the light emitting signal line is an ineffective level signal, and when the signal of the first reset signal line is the ineffective level signal, the signal of the light emitting signal line is the effective level signal.

A duration for which the signal of the light emitting signal line is the ineffective level signal is equal to a duration for which the signal of the first reset signal line is the effective level signal.

In some possible implementations, the display region is further provided with at least one second reset signal line, at least one scan signal line, at least one initial signal line, and at least one data signal line; and the pixel circuit is connected with a second reset signal line, a scan signal line, an initial signal line, and a data signal line, respectively.

In some possible implementations, the pixel circuit includes a first transistor to a seventh transistor and a storage capacitor.

A control electrode of the first transistor is connected to a second reset terminal, a first electrode of the first transistor is connected to an initial signal terminal, and a second electrode of the first transistor is connected to a second node. A control electrode of the second transistor is connected to a scan signal terminal, a first electrode of the second transistor is connected to the second node, and a second electrode of the second transistor is connected to a third node. A control electrode of the third transistor is connected to the second node, a first electrode of the third transistor is connected to a first node, and a second electrode of the third transistor is connected to the third node. A control electrode of the fourth transistor is connected to the scan signal terminal, a first electrode of the fourth transistor is connected to a data signal terminal, and a second electrode of the fourth transistor is connected to the first node. A control electrode of the fifth transistor is connected with a light emitting signal terminal, a first electrode of the fifth transistor is connected with a first power supply terminal, and a second electrode of the fifth transistor is connected with the first node. A control electrode of the sixth transistor T6 is connected with the light emitting signal terminal, a first electrode of the sixth transistor T6 is connected with the third node N3, and a second electrode of the sixth transistor T6 is connected with a light emitting device. A control electrode of the seventh transistor is connected with the scan signal terminal, a first electrode of the seventh transistor is connected with the initial signal terminal, and a second electrode of the seventh transistor is connected with a first electrode of the light emitting device; a first terminal of the storage capacitor is connected with the first power supply terminal, and a second terminal of the storage capacitor is connected with the second node.

For a pixel circuit in a sub-pixel of an i-th row and an j-th column, the scan signal terminal is connected to an i-th scan signal line, a first reset terminal is connected to an i-th first reset signal line, a second reset terminal is connected to an i-th second reset signal line, the initial signal terminal is connected to an i-th initial signal line, the light emitting signal terminal is connected to an i-th light emitting signal line, and the data signal terminal is connected to a j-th data signal line, wherein, $1 \leq i \leq M$, $1 \leq j \leq N$, M is the total number of rows of the sub-pixels, and N is the total number of columns of the sub-pixels.

In some possible implementations, the non-display region is provided with a scan drive circuit providing a drive signal to the scan signal line, a light emitting drive circuit providing a drive signal to the light emitting signal line, a first reset drive circuit providing a drive signal to the first reset signal line, and a second reset drive circuit providing a drive signal to the second reset signal line.

The light emitting drive circuit is located at a side of the display region, and the first reset drive circuit is located between the light emitting drive circuit and the display region; the scan drive circuit is located between the first reset drive circuit and the display region; and the second reset drive circuit is located between the scan drive circuit and the display region.

In some possible implementations, the non-display region is further provided with a light emitting initial signal line, a second light emitting clock line, a first light emitting clock line, a first high-level signal line, a first low-level signal line, a first reset initial signal line, a second reset clock line, a first reset clock line, a second high-level signal line, a second low-level signal line, a scan initial signal line, a second scan clock line, a first scan clock line, a third high-level signal line, a third low-level signal line, a second reset initial signal line, a third reset clock line, a fourth reset clock line, a fourth high-level signal line and a fourth low-level signal line.

The light emitting initial signal line, the second light emitting clock line, the first light emitting clock line and the first high-level signal line are located on a side of the light emitting drive circuit away from the display region, and the first low-level signal line is located on a side of a light emitting shift register close to the display region. The second light emitting clock line is located on a side of the initial light emitting signal line close to the display region, the first light emitting clock line is located on a side of the second light emitting clock line close to the display region, and the first high-level signal line is located on a side of the first light emitting clock line close to the display region.

The first reset initial signal line, the second reset clock line, the first reset clock line and the second high-level signal line are located on a side of the first reset drive circuit away from the display region, the second low-level signal line is located on a side of the first reset drive circuit close to the display region, the first reset initial signal line is located on a side of the first low-level signal line close to the display region, the second reset clock line is located on a side of the first reset initial signal line close to the display region, the first reset clock line is located on a side of the second reset clock signal line close to display region, and the second high-level signal line is located on a side of the first reset clock line close to the display region.

The scan initial signal line, the second scan clock line, the first scan clock line and the third high-level signal line are located on a side of the scan drive circuit away from the display region, the scan initial signal line is located on a side of the second low-level signal line close to the display region, the second scan clock line is located on a side of the scan initial signal line close to the display region, a first scan clock line is located on a side of the second scan clock line close to the display region, the third high-level signal line is located on a side of the first scan clock line close to the display region, and the third low-level signal line is located on a side of the third high-level signal line close to the display region.

The second reset initial signal line, the third reset clock line, the fourth reset clock line, and the fourth high-level signal line are located on a side of the second reset drive circuit away from the display region. Herein, the second reset initial signal line is located on a side of the third low-level signal line close the display region, the fourth reset clock line is located on a side of the second reset initial signal line close to the display region, the third reset clock line is located on a side of the fourth reset clock line close to the display region, the fourth high-level signal line is located on a side of the third reset clock line close to the display region, and the fourth low-level signal line is located on a side of the fourth high-level signal line close to the display region.

In some possible implementations, the light emitting drive circuit includes a plurality of light emitting shift registers, and the first reset drive circuit includes a plurality of first reset shift registers.

The light emitting shift register includes a plurality of light emitting transistors and a plurality of light emitting capacitors, and the first reset shift register includes a plurality of reset transistors and a plurality of reset capacitors.

A connection relationship between the plurality of light emitting transistors and the plurality of light emitting capacitors in the light emitting shift register is the same as a connection relationship between the plurality of reset transistors and the plurality of reset capacitors in the first reset shift register.

In some possible implementations, the plurality of light emitting shift registers in the light emitting drive circuit are cascaded; wherein each light emitting shift register includes a first light emitting transistor to a tenth light emitting transistor, and a first light emitting capacitor to a third light emitting capacitor.

A control electrode of the first light emitting transistor is connected with the first node, a first electrode of the first light emitting transistor is connected with the first power supply terminal, and a second electrode of the first light emitting transistor is connected with a first electrode of the second light emitting transistor; a control electrode of the second light emitting transistor is connected with the second clock signal terminal, and a second electrode of the second light emitting transistor is connected with the second node; a control electrode of the third light emitting transistor is connected with the second node, a first electrode of the third light emitting transistor is connected with the first node, and a second electrode of the third light emitting transistor is connected with the first clock signal terminal; a control electrode of the fourth light emitting transistor is connected with the first clock signal terminal, a first electrode of the fourth light emitting transistor is connected with the signal input terminal, and a second electrode of the fourth light emitting transistor is connected with the second node; a control electrode of the fifth light emitting transistor is connected with the first clock signal terminal, a first electrode of the fifth light emitting transistor is connected with the second power supply terminal, and a second electrode of the fifth light emitting transistor is connected with the first node; a control electrode of the sixth light emitting transistor is connected with the first node, a first electrode of the sixth light emitting transistor is connected with the second clock signal terminal, a second electrode of the sixth light emitting transistor is connected with a first electrode of the seventh light emitting transistor, and the second electrode of the sixth light emitting transistor is connected with the third node; a control electrode of the seventh light emitting transistor is connected with the second clock signal terminal, the first electrode of the seventh light emitting transistor is connected with the third node, and a second electrode of the seventh light emitting transistor is connected with the fourth node; a control electrode of the eighth light emitting transistor is connected with the first node, a first electrode of the eighth light emitting transistor is connected with the fourth node, and a second electrode of the eighth light emitting transistor is connected with the first power supply terminal; a control electrode of the ninth light emitting transistor is connected with the fourth node, a first electrode of the ninth light emitting transistor is connected with the first power supply terminal, and a second electrode of the ninth light emitting transistor is connected with the signal output terminal; a control electrode of the tenth light emitting transistor is connected with the first node, a first electrode of the tenth light emitting transistor is connected with the signal output terminal, and a second electrode of the tenth light emitting transistor is connected with the second power supply terminal; a first electrode plate of the first light emitting capacitor is connected with the fourth node, and a second electrode plate of the first light emitting capacitor is connected with the first power supply terminal; a first electrode plate of the second light emitting capacitor is connected with the first node, and a second electrode plate of the second light emitting capacitor is connected with the third node; and a first electrode plate of the third light emitting capacitor is connected with the second node, and a second electrode plate of the third light emitting capacitor is connected with the second clock signal terminal.

A signal input terminal of a light emitting shift register of a first stage is connected with the light emitting initial signal line, a signal output terminal of a light emitting shift register of an i-th stage is connected with a signal input terminal of a light emitting shift register of an (i+1)-th stage, a first power supply terminal of a light emitting shift register of each stage is connected with the first high-level signal line and the second high-level signal line, a second power supply terminal of a light emitting shift register of each stage is connected with the first low-level signal line, first clock signal terminals of light emitting shift registers of odd-numbered stages are connected with the first light emitting clock line, second clock signal terminals of light emitting shift registers of odd-numbered stages are connected with the second light emitting clock line, first clock signal terminals of light emitting shift registers of even-numbered stages are connected with the second light emitting clock line, and second clock signal terminals of light emitting shift registers of even-numbered stages are connected with the first light emitting clock line.

In some possible implementations, a plurality of first reset shift registers in the first reset drive circuit are cascaded; wherein each first reset shift register includes a first reset transistor to a tenth reset transistor, and a first reset capacitor to a third reset capacitor.

A control electrode of the first reset transistor is connected with the first node, a first electrode of the first reset transistor is connected with the first power supply terminal, and a second electrode of the first reset transistor is connected with a first electrode of the second reset transistor; a control electrode of the second reset transistor is connected with the second clock signal terminal, and a second electrode of the second reset transistor is connected with the second node; a control electrode of the third reset transistor is connected with the second node, a first electrode of the third reset transistor is connected with the first node, and a second electrode of the third reset transistor is connected with the first clock signal terminal; a control electrode of the fourth reset transistor is connected with the first clock signal terminal, a first electrode of the fourth reset transistor is connected with the signal input terminal, and a second electrode of the fourth reset transistor is connected with the second node; a control electrode of the fifth reset transistor is connected with the first clock signal terminal, a first electrode of the fifth reset transistor is connected with the second power supply terminal, and a second electrode of the fifth reset transistor is connected with the first node; a control electrode of the sixth reset transistor is connected with the first node, a first electrode of the sixth reset transistor is connected with the second clock signal terminal, a second electrode of the sixth reset transistor is connected with a first electrode of the seventh reset transistor, and the second electrode of the sixth reset transistor is connected with the third node; a control electrode of the seventh reset transistor is connected with the second clock signal terminal, the first electrode of the seventh reset transistor is connected with the third node, and a second electrode of the seventh reset transistor is connected with the fourth node; a control electrode of the eighth reset transistor is connected with the first node, a first electrode of the eighth reset transistor is connected with the fourth node, and a second electrode of the eighth reset transistor is connected with the first power supply terminal; a control electrode of the ninth reset transistor is connected with the fourth node, a first electrode of the ninth reset transistor is connected with the first power supply terminal, and a second electrode of the ninth reset transistor is connected with the signal output terminal; a control electrode of the tenth reset transistor is connected with the first node, a first electrode of the tenth reset transistor is connected with the signal output terminal, and a second electrode of the tenth reset transistor is connected with the second power supply terminal; a first electrode plate of the first reset capacitor is connected with the fourth node, and a second electrode plate of the first reset capacitor is connected with the first power supply terminal; a first electrode plate of the second reset capacitor is connected with the first node, and a second electrode plate of the second reset capacitor is connected with the third node; and a first electrode plate of the third reset capacitor is connected with the second node, and a second electrode plate of the third light emitting capacitor is connected with the second clock signal terminal.

A signal input terminal of a first reset shift register of a first stage is connected with the first reset initial signal line, a signal output terminal of a first reset shift register of an i-th stage is connected with a signal input terminal of a first reset shift register of an (i+1)-th stage, a first power supply terminal of a first reset shift register of each stage is connected with the second high-level signal line and the third high-level signal line, a second power supply terminal of a first reset shift register of each stage is connected with the second low-level signal line, first clock signal terminals of first reset shift registers of odd-numbered stages are connected with the first reset clock line, second clock signal terminals of first reset shift registers of odd-numbered stages are connected with the second reset clock line, first clock signal terminals of first reset shift registers of even-numbered stages are connected with the second reset clock line, and second clock signal terminals of first reset shift registers of even-numbered stages are connected with the first reset clock line.

In some possible implementations, the scan drive circuit includes a plurality of cascaded scan shift registers; each scan shift register includes a first scan transistor to an eighth scan transistor, a first scan capacitor and a second scan capacitor.

A control electrode of the first scan transistor is connected with the first clock signal terminal, a first electrode of the first scan transistor is connected with the signal input terminal, and a second electrode of the first scan transistor is connected with the first node; a control electrode of the second scan transistor is connected with the first node, a first electrode of the second scan transistor is connected with the second node, and a second electrode of the second scan transistor is connected with the first clock signal terminal; a control electrode of the third scan transistor is connected with the first clock signal terminal, a first electrode of the third scan transistor is connected with the second power supply terminal, and a second electrode of the third scan transistor is connected with the second node; a control electrode of the fourth scan transistor is connected with the second node, a first electrode of the fourth scan transistor is connected with the first power supply terminal, and a second electrode of the fourth scan transistor is connected with the signal output terminal; a control electrode of the fifth scan transistor is connected with the third node, a first electrode of the fifth scan transistor is connected with the signal output terminal, and a second electrode of the fifth scan transistor is connected with the second clock signal terminal; a control electrode of the sixth scan transistor is connected with the second node, a first electrode of the sixth scan transistor is connected with the first power supply terminal, and a second electrode of the sixth scan transistor is connected with the a first electrode of the seventh scan transistor; a control electrode of the seventh scan transistor is connected with the second clock signal terminal, and a second electrode of the seventh scan transistor is connected with the first node; a control electrode of the eighth scan transistor is connected with the second power supply terminal, a first electrode of the eighth scan transistor is connected with the first node, and a second electrode of the eighth scan transistor is connected with the third node; a first electrode plate of the first scan capacitor is connected with the first power supply terminal, and a second electrode plate of the first scan capacitor is connected with the second node; and a first electrode plate of the second scan capacitor is connected with the signal output terminal, and a second electrode plate of the second scan capacitor is connected with the third node.

A signal input terminal of a scan shift register of a first stage is connected with the scan initial signal line, and a signal output terminal of a scan shift register of an i-th stage is connected with a signal input terminal of a scan shift register of an (i+1)-th stage; a first power supply terminal of a scan shift register of each stage is connected with the third high-level signal line; a second power supply terminal of a scan shift register of each stage is connected with the third low-level signal line; and first clock signal terminals of scan shift registers of odd-numbered stages are connected with the first scan clock line, second clock signal terminals of scan shift registers of odd-numbered stages are connected with the second scan clock line, first clock signal terminals of scan shift registers of even-numbered stages are connected with the second scan clock line, and second clock signal terminals of scan shift registers of even-numbered stages are connected with the first scan clock line.

In some possible implementations, the second reset drive circuit includes a plurality of cascaded second reset shift registers; each second reset drive circuit includes an eleventh reset transistor to an eighteenth reset transistor, a third reset capacitor and a fourth reset capacitor.

A control electrode of the eleventh reset transistor is connected with the first clock signal terminal, a first electrode of the eleventh reset transistor is connected with the signal input terminal, and a second electrode of the eleventh reset transistor is connected with the first node; a control electrode of the twelfth reset transistor is connected with the first node, a first electrode of the twelfth reset transistor is connected with the second node, and a second electrode of the twelfth reset transistor is connected with the first clock signal terminal; a control electrode of the thirteenth reset transistor is connected with the first clock signal terminal, a first electrode of the thirteenth reset transistor is connected with the second power supply terminal, and a second electrode of the thirteenth reset transistor is connected with the second node; a control electrode of the fourteenth reset transistor is connected with the second node, a first electrode of the fourteenth reset transistor is connected with the first power supply terminal, and a second electrode of the fourteenth reset transistor is connected with the signal output terminal; a control electrode of the fifteenth reset transistor is connected with the third node, a first electrode of the fifteenth reset transistor is connected with the signal output terminal, and a second electrode of the fifteenth reset transistor is connected with the second clock signal terminal; a control electrode of the sixteenth reset transistor is connected with the second node, a first electrode of the sixteenth reset transistor is connected with the first power supply terminal, and a second electrode of the sixteenth reset transistor is connected with a first electrode of the seventeenth reset transistor; a control electrode of the seventeenth reset transistor is connected with the second clock signal terminal, and a second electrode of the seventeenth reset transistor is connected with the first node; a control electrode of the eighteenth reset transistor is connected with the second power supply terminal, a first electrode of the eighteenth reset transistor is connected with the first node, and a second electrode of the eighteenth reset transistor is connected with the third node; a first electrode plate of the third reset capacitor is connected with the first power supply terminal, and a second electrode plate of the third reset capacitor is connected with the second node; and a first electrode plate of the fourth reset capacitor is connected with the signal output terminal, and a second electrode plate of the fourth reset capacitor is connected with the third node.

A signal input terminal of a second reset shift register of a first stage is connected with the second reset initial signal line, and a signal output terminal of a second reset shift register of an i-th stage is connected with a signal input terminal of a second reset shift register of an (i+1)-th stage; a first power supply terminal of a second reset shift register of each stage is connected with the fourth high-level signal line; a second power supply terminal of a second reset shift register of each stage is connected with the fourth low-level signal line; and first clock signal terminals of second reset shift registers of odd-numbered stages are connected with the third reset clock line, second clock signal terminals of second reset shift registers of odd-numbered stages are connected with the fourth reset clock line, first clock signal terminals of second reset shift registers of even-numbered stages are connected with the fourth reset clock line, and second clock signal terminals of second reset shift registers of even-numbered stages are connected with the third reset clock line.

In some possible implementations, the scan initial signal line includes a first sub-scan initial signal line and a second sub-scan initial signal line arranged in different layers and connected to each other; the first scan clock line includes a first sub-scan clock line and a second sub-scan clock line arranged in different layers and connected with each other; the second scan clock line includes a third sub-scan clock line and a fourth sub-scan clock line arranged in different layers and connected with each other; the first reset initial signal line includes a first sub-reset initial signal line and a second sub-reset initial signal line arranged in different layers and connected with each other; the first reset clock line includes a first sub-reset clock line and a second sub-reset clock line arranged in different layers and connected with each other; the second reset clock line includes a third sub-reset clock line and a fourth sub-reset clock line arranged in different layers and connected with each other; the second reset initial signal line includes a third sub-reset initial signal line and a fourth sub-reset initial signal line arranged in different layers and connected with each other; the third reset clock line includes a fifth sub-reset clock line and a sixth sub-scan clock line arranged in different layers and connected with each other; the fourth reset clock line may include a seventh sub-reset clock line and an eighth sub-scan clock line arranged in different layers and connected to each other.

An orthographic projection of the first sub-scan initial signal line on the substrate is at least partially overlapped with an orthographic projection of the second sub-scan initial signal line on the substrate; an orthographic projection of the first sub-scan clock line on the substrate is at least partially overlapped with an orthographic projection of the second sub-scan clock line on the substrate; an orthographic projection of the third sub-scan clock line on the substrate is at least partially overlapped with an orthographic projection of the fourth sub-scan clock line on the substrate; an orthographic projection of the first sub-reset initial signal line on the substrate is at least partially overlapped with an orthographic projection of the second sub-reset initial signal line on the substrate; an orthographic projection of the first sub-reset clock line on the substrate is at least partially overlapped with an orthographic projection of the second sub-reset clock line on the substrate; an orthographic projection of the third sub-reset clock line on the substrate is at least partially overlapped with an orthographic projection of the fourth sub-reset clock line on the substrate; an orthographic projection of the third sub-reset initial signal line on the substrate is at least partially overlapped with an orthographic projection of the fourth sub-reset initial signal line on the substrate; an orthographic projection of the fifth sub-reset clock line on the substrate is at least partially overlapped with an orthographic projection of the sixth sub-scan clock line on the substrate; and an orthographic projection of the seventh sub-reset clock line on the substrate is at least partially overlapped with an orthographic projection of the eighth sub-scan clock line on the substrate.

In some possible implementations, the non-display region is further provided with a first connection electrode to a fourteenth connection electrode.

The first connection electrode to the sixth connection electrode is arranged in a same layer, the seventh connection electrode to the ninth connection electrode is arranged in a same layer, and the tenth connection electrode to the fourteenth connection electrode is arranged in a same layer.

The first connection electrode is connected to the second high-level signal line, the second connection electrode is respectively connected to the signal output terminal of the light emitting shift register and the tenth connection electrode, the third connection electrode is connected to the third high-level signal line, the fourth connection electrode is respectively connected to the signal output terminal of the first reset shift register and the eleventh connection electrode, the fifth connection electrode is respectively connected to the signal output terminal of the scan drive circuit and the thirteenth connection electrode, the sixth connection electrode is respectively connected to the twelfth connection electrode and the fourteenth connection electrode, the seventh connection electrode is respectively connected to the tenth connection electrode and the twelfth connection electrode, the eighth connection electrode is respectively connected to the signal output terminal of the second reset shift register, and the ninth connection electrode is respectively connected to the eleventh connection electrode; and the eighth connection electrode is connected to the second reset signal line, the ninth connection electrode is respectively connected to the first reset signal line, the thirteenth connection electrode is connected to the scan signal line, and the fourteenth connection electrode is connected to the light emitting signal line.

In some possible implementations, the display panel further includes a drive circuit layer and a light emitting structure layer stacked on the substrate sequentially; wherein the drive circuit layer includes an active layer, a first insulation layer, a first conductive layer, a second insulation layer, a second conductive layer, a third insulation layer, a third conductive layer, a fourth insulation layer and a fourth conductive layer which are stacked sequentially on a substrate.

The active layer includes an active layer of a first light emitting transistor to an active layer of a tenth light emitting transistor, an active layer of a first reset transistor to an active layer of a tenth reset transistor, an active layer of a first scan transistor to an active layer of an eighth scan transistor, an active layer of an eleventh reset transistor to an active layer of an eighteenth reset transistor.

The first conductive layer includes a control electrode of the first light emitting transistor to a control electrode of the tenth light emitting transistor, a first electrode plate of the first light emitting capacitor to a first electrode plate of the third light emitting capacitor, a control electrode of the first reset transistor to a control electrode of the tenth reset transistor, a first electrode plate of the first reset capacitor to a first electrode plate of the third reset transistor, a control electrode of the first scan transistor to a control electrode of the eighth scan transistor, a second electrode plate of the first scan capacitor, a second electrode plate of the second scan capacitor, a control electrode of the eleventh reset transistor to a control electrode of the eighteenth reset transistor, a second electrode plate of the third reset capacitor, a second electrode of the fourth reset capacitor and a first connection electrode to a sixth connection electrode.

The second conductive layer includes a second electrode plate of the first light emitting capacitor to a second electrode plate of the third light emitting capacitor, a second electrode plate of the first reset capacitor to a second electrode plate of the third reset capacitor, a first electrode plate of the first scan capacitor, a first electrode plate of the second scan capacitor, a first electrode plate of the third reset capacitor, a first electrode plate of the fourth reset capacitor, and a seventh connection electrode to a ninth connection electrode.

The third conductive layer includes a tenth connection electrode to a fourteenth connection electrode, a light emitting initial signal line, a second light emitting clock line, a first light emitting clock line, a first high-level signal line, a first low-level signal line, a first sub-reset initial signal line, a third sub-reset clock line, a first sub-reset clock line, a second high-level signal line, a second low-level signal line, a first sub-scan initial signal line, a third sub-scan clock line, a first sub-scan clock line, a third high-level signal line, a third low-level signal line, a third sub-reset initial signal line, a fifth sub-reset clock line, a seventh sub-reset clock line, a fourth high-level signal line, a fourth low-level signal line, first and second electrodes of the first light emitting transistor to first and second electrodes of the tenth light emitting transistor, first and second electrodes of first reset transistor to first and second electrodes of tenth reset transistor, first and second electrodes of the first scan transistor to first and second electrodes of the eighth scan transistor, first and second electrodes of the eleventh reset transistor to first and second electrodes of the eighteenth reset transistor.

The fourth conductive layer includes a second sub-reset initial signal line, a fourth sub-reset clock line, a second sub-reset clock line, a second sub-scan initial signal line, a fourth sub-scan clock line, a second sub-scan clock line, a fourth sub-reset initial signal line, an eighth sub-scan clock line, and a sixth sub-scan clock line.

In some possible implementations, the non-display region is further provided with fifteenth to seventeenth connection electrodes located in the first conductive layer and first, second and third connection lines located in the third conductive layer.

The fifteenth connection electrode is connected to the first sub-reset initial signal line of the first reset initial signal line and the first connection line, respectively.

The sixteenth connection electrode is connected to the third sub-reset clock line of the second reset clock line and the second connection line, respectively.

The seventeenth connection electrode is connected to the first sub-reset clock line of the first reset clock line and the third connection line, respectively.

In second aspect, the present disclosure further provides a display apparatus including the display panel described above.

Other aspects may be understood upon reading and understanding drawings and detailed description.

BRIEF DESCRIPTION OF DRAWINGS

The accompanying drawings are used for providing understanding of technical solutions of the present disclosure, and constitute a part of the specification. They are used for explaining the technical solutions of the present disclosure together with the embodiments of the present disclosure, but do not constitute a limitation on the technical solutions of the present disclosure.

DETAILED DESCRIPTION

Figure 1:
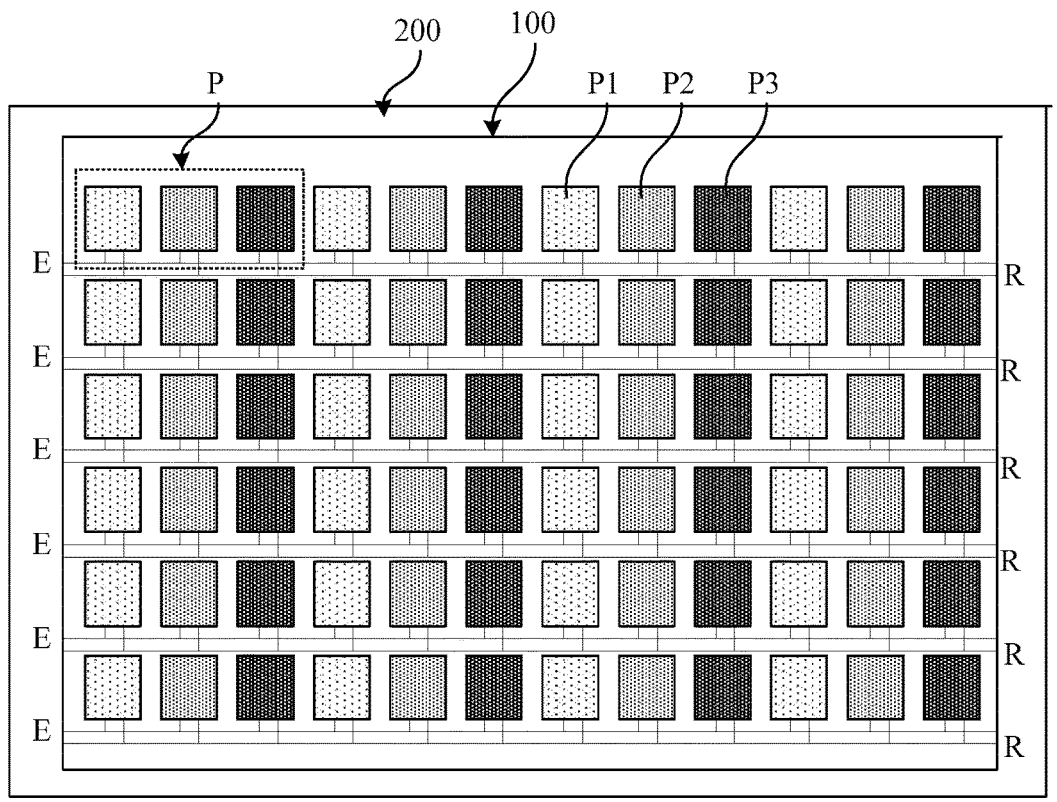
FIG. 1 is a schematic diagram of a structure of a display panel in accordance with an embodiment of the present disclosure.

To make objectives, technical solutions, and advantages of the present disclosure more clear, the embodiments of the present disclosure will be described in detail below with reference to the accompanying drawings. It is to be noted that implementations may be implemented in a plurality of different forms. Those of ordinary skills in the art may easily understand such a fact that modes and contents may be transformed into various forms without departing from the purpose and scope of the present disclosure. Therefore, the present disclosure should not be explained as being limited to contents described in the following implementations only. The embodiments in the present disclosure and features in the embodiments may be combined randomly with each other without conflict.

In the drawings, sizes of various constituent elements, a thickness of a layer, or a region is exaggerated sometimes for clarity. Therefore, one implementation of the present disclosure is not necessarily limited to the dimensions, and shapes and sizes of various components in the drawings do not reflect actual scales. In addition, the drawings schematically illustrate ideal examples, and one implementation of the present disclosure is not limited to the shapes, numerical values, or the like shown in the drawings.

Ordinal numerals such as "first", "second", and "third" in the specification are set to avoid confusion of constituent elements, but not to set a limit in quantity.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Thus, the above wordings cannot be considered as limitations on the present disclosure. The positional relationships between the constituent elements are changed as appropriate according to directions for describing various constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, a connection may be a fixed connection, a detachable connection, or an integrated connection; it may be a mechanical connection or an electrical connection; it may be a direct mutual connection, or an indirect connection through middleware, or internal communication between two elements. Those of ordinary skills in the art may understand specific meanings of these terms in the present disclosure according to specific situations.

In the specification, an "electrical connection" includes a case that constituent elements are connected together through an element with a certain electrical effect. The "element with the certain electrical effect" is not particularly limited as long as electrical signals may be sent and received between the connected constituent elements. Examples of the "element with the certain electrical effect" not only include electrodes and wirings, but also include switching elements (such as transistors), resistors, inductors, capacitors, other elements with various functions, etc.

Those skilled in the art may understand that a transistor employed in all embodiments of the present disclosure may be a thin film transistor or a field effect transistor or another device having same characteristics. The thin film transistor may be an oxide semiconductor thin film transistor, a low temperature poly silicon thin film transistor, an amorphous silicon thin film transistor, or a microcrystalline silicon thin film transistor. A thin film transistor with a bottom gate structure or a thin film transistor with a top gate structure may be specifically selected as the thin film transistor, as long as they can achieve a switching function. Since a source and a drain of the transistor used here are symmetric, the drain and the source thereof may be interchanged.

In the specification, "parallel" refers to a state in which an angle formed by two straight lines is −10° or more and 100 or less, and thus also includes a state in which the angle is −5° or more and 5° or less. In addition, "perpendicular" refers to a state in which an angle formed by two straight lines is 800 or more and 1000 or less, and thus also includes a state in which the angle is 850 or more and 950 or less.

In the specification, "parallel" refers to a state in which an angle formed by two straight lines is −10° or more and 100 or less, and thus also includes a state in which the angle is −5° or more and 5° or less. In addition, "perpendicular" refers to a state in which an angle formed by two straight lines is 800 or more and 1000 or less, and thus also includes a state in which the angle is 850 or more and 950 or less.

In the specification, a "film" and a "layer" are interchangeable. For example, a "conductive layer" may be replaced with a "conductive film" sometimes. Similarly, an "insulation film" may be replaced with an "insulation layer" sometimes.

In the present disclosure, "about" refers to that a boundary is not defined so strictly and numerical values within process and measurement error ranges are allowed.

A sub-pixel in a display panel includes a pixel circuit and a light emitting device. In order to achieve a normal display of the light emitting device, the pixel circuit should reset an anode of the light emitting device. However, pulse time of a signal controlling the reset of the anode of the light emitting device in a display panel is too short to maintain a voltage of the reset of the anode, thus reducing a service life of the display panel.

FIG. 1 is a schematic diagram of a structure of a display panel according to an embodiment of the present disclosure. As shown in FIG. 1, the display panel may include a substrate including a display region 100 and a non-display region 200 located at the periphery of the display region 100. The display region may be provided with at least one light emitting signal line E, at least one first reset signal line R and sub-pixels arranged in an array, wherein at least one sub-pixel includes a light emitting device and a pixel circuit, and the pixel circuit is connected with an anode of the light emitting device. The pixel circuit is respectively connected with the first reset signal line R and a light emitting signal line R, wherein the first reset signal line R is configured to provide a reset control signal to the pixel circuit to reset the anode of the light emitting device, and the light emitting signal line E is configured to provide a light emitting control signal to the pixel circuit to provide a drive current to the anode of the light emitting device.

For the first reset signal line R and the light emitting signal line E connected to the same pixel circuit, when a signal of the first reset signal line is an effective level signal, a signal of the light emitting signal line is an ineffective level signal, and when the signal of the first reset signal line is an ineffective level signal, the signal of the light emitting signal line is an effective level signal. The duration for which the signal of the light emitting signal line is an ineffective level signal is equal to the duration for which the signal of the first reset signal line is an effective level signal.

In an exemplary embodiment, the substrate may be a rigid substrate or a flexible substrate, wherein the rigid substrate may be, but is not limited to, one or more of glass and metal foils; and the flexible substrate may be, but is not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers.

In an exemplary embodiment, the light emitting device L may be an Organic light emitting Diode (OLED), including a first electrode (anode), an organic light emitting layer, and a second electrode (cathode) that are stacked.

In an exemplary embodiment, at least one light emitting signal line extends along the second direction, and may be arranged sequentially along the first direction. At least one first reset signal line extends along the second direction and is arranged sequentially along the first direction. Herein, the first direction intersects with the second direction.

In an exemplary embodiment, intersection of the first direction and the second direction means that an included angle between the first direction and the second direction is about 70 degrees to 90 degrees. The first direction and the second direction may be located in a same plane. For example, the first direction may be a row direction, and the second direction may be a column direction.

In an exemplary embodiment, a sub-pixel includes a first sub-pixel P1 emitting light of a first color, a second sub-pixel P2 emitting light of a second color, and a third sub-pixel P3 emitting light of a third color, wherein the first sub-pixel P1, the second sub-pixel P2, and the third sub-pixel P3 each includes a pixel circuit and a light emitting device. The pixel circuits in the first sub-pixel P1, the second sub-pixel P2, and the third sub-pixel P3 each are connected with a scan signal line, a data signal line, and a light emitting signal line respectively, and the pixel circuit is configured to receive a data voltage transmitted by the data signal line under control of the scan signal line and the light emitting signal line, and output a corresponding current to the light emitting device. The light emitting devices in the first sub-pixel P1, the second sub-pixel P2, and the third sub-pixel P3 are respectively connected with respective pixel circuits of sub-pixels where light emitting devices are located, and the light emitting device is configured to emit light with a corresponding brightness in response to a current output by the pixel circuit of the sub-pixel where the light emitting device is located.

In an exemplary embodiment, one pixel unit P is formed by a plurality of sub-pixels, wherein the pixel unit P may include a Red (R) sub-pixel, a Green (G) sub-pixel, and a Blue (B) sub-pixel, or may include a red sub-pixel, a green sub-pixel, a blue sub-pixel, and a white sub-pixel, which is not limited in the present disclosure. In an exemplary embodiment, the sub-pixels in the pixel unit may be rectangular, rhombic, pentagonal or hexagonal in shape. When the pixel unit includes three sub-pixels, the three sub-pixels may be disposed side by side horizontally, side by side vertically, or in the form of a Chinese character " 品 " or the like. When the pixel unit includes four sub-pixels, the four sub-pixels may be disposed side by side horizontally, side by side vertically, or in the shape of a square or the like. The present disclosure is not limited thereto.

The display panel provided by an embodiment of the present disclosure includes a substrate, which includes a display region and a non-display region. The display region is provided with at least one light emitting signal line, at least one first reset signal line and sub-pixels arranged in an array. At least one sub-pixel includes a light emitting device and a pixel circuit; wherein the pixel circuit is connected with an anode of the light emitting device. The pixel circuit is respectively connected with a first reset signal line and a light emitting signal line, wherein the first reset signal line is configured to provide a reset control signal to the pixel circuit to reset the anode of the light emitting device, and the light emitting signal line is configured to provide a light emitting control signal to the pixel circuit to provide a drive current to the anode of the light emitting device. For the first reset signal line and the light emitting signal line connected to the same pixel circuit, when a signal of the first reset signal line is an effective level signal, a signal of the light emitting signal line is an ineffective level signal, and when the signal of the first reset signal line is an ineffective level signal, the signal of the light emitting signal line is an effective level signal, a duration for which the signal of the light emitting signal line is an ineffective level signal is equal to a duration for which the signal of the first reset signal line is an effective level signal. According to the present disclosure, when the signal of the first reset signal line is an effective level signal, the signal of the light emitting signal line is an ineffective level signal, and the duration for which the signal of the light emitting signal line is an ineffective level signal is equal to the duration for which the signal of the first reset signal line is an effective level signal, thus prolonging the reset time of the anode of the light emitting device and increasing the service life of the display panel.

In an exemplary embodiment, the display region is further provided with at least one second reset signal line, at least one scan signal line, at least one initial signal line, and at least one data signal line.

In an exemplary embodiment, at least one second reset signal line extends along the second direction, and is arranged sequentially along the first direction. At least one scan signal line extends along the second direction, and is arranged sequentially along the first direction. At least one initial signal line extends along the second direction, and is arranged sequentially along the first direction. At least one data signal line extends along the first direction, and is arranged sequentially along the second direction.

Figure 2:
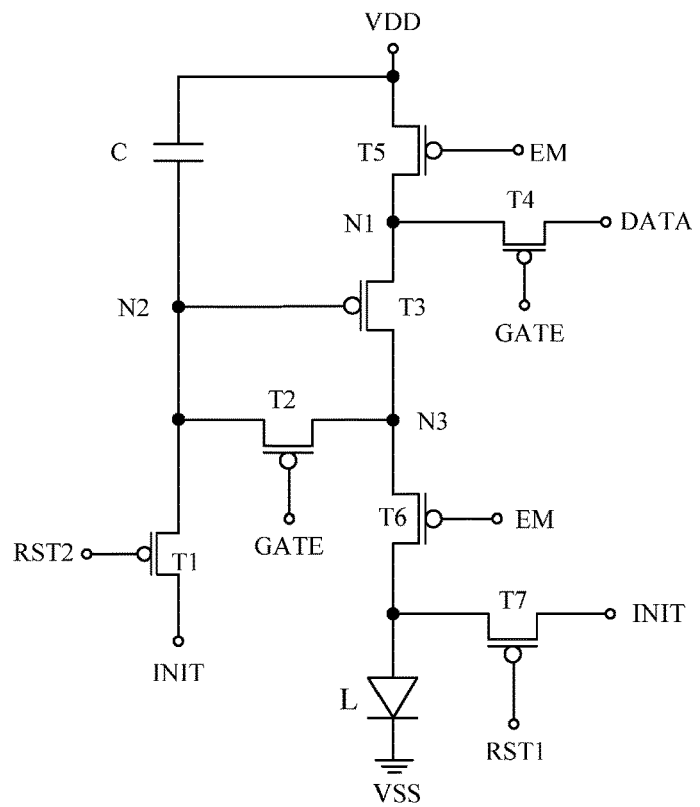
FIG. 2 is an equivalent circuit diagram of a pixel circuit.

In an exemplary embodiment, FIG. 2 is an equivalent circuit diagram of a pixel circuit. As shown in FIG. 2, the pixel circuit may include seven transistors (a first transistor T1 to a seventh transistor T7), one storage capacitor C, and eight signal terminals (a data signal terminal DATA, a scan signal terminal GATE, a first reset terminal RST1, a second reset terminal RST2, a light emitting signal terminal EM, an initial signal terminal INIT, a first power supply terminal VDD and a second power supply terminal VSS).

In an exemplary embodiment, a control electrode of the first transistor T1 is connected to the second reset terminal RST2, a first electrode of the first transistor T1 is connected to the initial signal terminal INIT, and a second electrode of the first transistor T1 is connected to a second node N2. A control electrode of the second transistor T2 is connected to the scan signal terminal GATE, a first electrode of the second transistor T2 is connected to the second node N2, and a second electrode of the second transistor T2 is connected to a third node N3. A control electrode of the third transistor T3 is connected with the second node N2, that is, the control electrode of the third transistor T3 is connected with a second terminal of the storage capacitor C, a first electrode of the third transistor T3 is connected with a first node N1, and a second electrode of the third transistor T3 is connected with the third node N3. A control electrode of the fourth transistor T4 is connected to the scan signal terminal GATE, a first electrode of the fourth transistor T4 is connected to the data signal terminal DATA, and a second electrode of the fourth transistor T4 is connected to the first node N1. A control electrode of the fifth transistor T5 is connected to the light emitting signal terminal EM, a first electrode of the fifth transistor T5 is connected to the first power supply terminal VDD, and a second electrode of the fifth transistor T5 is connected to the first node N1. A control electrode of the sixth transistor T6 is connected with the light emitting signal terminal EM, a first electrode of the sixth transistor T6 is connected with the third node N3, and a second electrode of the sixth transistor T6 is connected with a first electrode of a light emitting device L. A control electrode of the seventh transistor T7 is connected with the scan signal terminal GATE, a first electrode of the seventh transistor T7 is connected with the initial signal terminal INIT, and a second electrode of the seventh transistor T7 is connected with the first electrode of the light emitting device L. A first terminal of the storage capacitor C is connected to the first power supply terminal VDD, and a second terminal of the storage capacitor C is connected to the second node N2, that is, the second terminal of the storage capacitor C is connected to the control electrode of the third transistor T3.

In an exemplary embodiment, for a pixel circuit in a sub-pixel of an i-th row and a j-th column, the scan signal terminal is connected to an i-th scan signal line, a first reset terminal is connected to an i-th first reset signal line, a second reset terminal is connected to an i-th second reset signal line, the initial signal terminal is connected to an i-th initial signal line, the light emitting signal terminal is connected to an i-th light emitting signal line, and the data signal terminal is connected to a j-th data signal line, wherein, $1 \leq i \leq M$, $1 \leq j \leq N$, M is the total number of rows of the sub-pixels, and N is the total number of columns of the sub-pixels.

In an exemplary embodiment, the first power supply terminal VDD may maintain to provide a high-level signal, and the second power supply terminal VSS may maintain to provide a low-level signal.

In an exemplary embodiment, a voltage value of the signal of the initial signal terminal VINT is smaller than a voltage value of the second power supply terminal VSS.

In an exemplary embodiment, the first transistor T1, the second transistor T2, the fourth transistor T4, the fifth transistor T5, the sixth transistor T6 and the seventh transistor T7 may be switching transistors.

In an exemplary embodiment, the third transistor T3 may be referred to as a drive transistor. The third transistor T3 determines a drive current flowing between the first power supply terminal VDD and the second power supply terminal VSS according to a potential difference between the control electrode and the first electrode of the third transistor T3.

In an exemplary embodiment, the first transistor T1 to the seventh transistor T7 may be P-type transistors or N-type transistors. Using a same type of transistors in the pixel circuit may simplify a process flow, reduce process difficulties of a display panel, and improve a yield of products. Exemplarily, the first transistor T1 to the seventh transistor T7 may include the P-type transistor and the N-type transistor.

Figure 3:
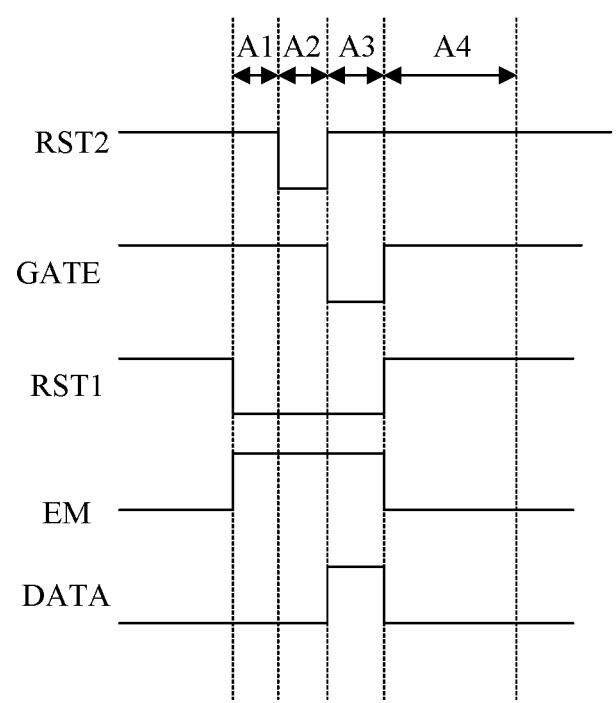
FIG. 3 is a working timing diagram of a pixel circuit.

FIG. 3 is a working timing diagram of a pixel circuit. An exemplary embodiment of the present disclosure will be explained below by the operation process of the pixel circuit illustrated in FIG. 2. The pixel circuit in FIG. 2 includes seven transistors (a first transistor T1 to a seventh transistor T7), one storage capacitor C, and eight signal input terminals (a signal terminal DATA, a scan signal terminal GATE, a first reset terminal RST1, a second reset terminal RST2, a light emitting signal terminal EM, an initial signal terminal INIT, a first power supply terminal VDD and a second power supply terminal VSS). The seven transistors being all P-type transistors are illustrated as an example in FIG. 3. The operating process of the pixel circuit may include the following stages.

In a first stage A1, a signal of the first reset terminal RST1 is a low-level signal, and signals of the second reset terminal RST2, the scan signal terminal GATE and the light emitting signal terminal EM are high-level signals. A signal of the first reset terminal RST1 is a low-level signal, which enables the seventh transistor T7 to be turned on, and a signal of the initial signal line INIT is provided to an anode of the light emitting device L to initialize (reset) an anode of light emitting device L, clear its internal pre-stored voltage, complete initialization, and ensure that the light emitting device L does not emit light. The signals of the second reset terminal RST2, the scan signal terminal GATE and the light emitting signal terminal EM are high-level signals, so that the first transistor T1, the second transistor T2, the fourth transistor T4, the fifth transistor T5 and the sixth transistor T6 are turned off. The light emitting device does not emit light in this stage.

In a second stage A2, signals of the first reset terminal RST1 and the second reset terminal RST2 are low-level signals, and signals of the scan signal terminal GATE and the light emitting signal terminal EM are high-level signals. The signal of the first reset terminal RST1 maintains to be a low-level signal, so that the seventh transistor T7 maintains to be turned on, and the signal from the initial signal line INIT continues to be provided to the anode of the light emitting device L to maintain to initialize (reset) the anode of light emitting device L. The signal of the second reset terminal RST2 is a low-level signal, so that the first transistor T1 is turned on, and the signal of the initial signal line INIT is provided to a second node N2 to initialize the storage capacitor C to clear an original data voltage in the storage capacitor. The signals of the scan signal terminal GATE and the light emitting signal terminal EM are high-level signals, so that the second transistor T2, the fourth transistor T4, the fifth transistor T5, the sixth transistor T6 and the seventh transistor T7 are turned off. The light emitting device L does not emit light in this stage.

In a third stage A3, which is called a data writing stage or a threshold compensation stage, signals of the first reset terminal RST1 and the scan signal terminal GATE are low-level signals, signals of the second reset terminal RST2 and the light emitting signal terminal EM are high-level signals, and the data signal terminal DATA outputs a data voltage. In this stage, because a signal of the second node is a low-level signal, the third transistor T3 is turned on.

The signal of the first reset terminal RST1 maintains to be a low-level signal, so that the seventh transistor T7 maintains turned-on, and the signal of the initial signal line INIT continues to be provided to the anode of the light emitting device L to maintain to initialize (reset) the anode of light emitting device L. The signal of the scan signal terminal GATE is a low-level signal, so that the second transistor T2 and the fourth transistor T4 are turned on. The second transistor T2 and the fourth transistor T4 are turned on, which enables the data voltage outputted by the data signal terminal DATA to be provided to the second node N2 through the first node N1, the turned-on third transistor T3, the third node N3 and the turned-on second transistor T2 till the voltage of the second node N2 is Vd−|Vth|, wherein Vd is the data voltage outputted by the data signal terminal DATA and Vth is a threshold voltage of the third transistor T3. The signals of the second reset terminal RST2 and the light emitting signal terminal EM are high-level signals, so that the first transistor T1, the fifth transistor T5 and the sixth transistor T6 are turned off. The light emitting device L does not emit light in this stage.

In a fourth stage A4, which is referred to as a light emitting stage, the signal of the light emitting signal terminal EM is a low-level signal, and the signals of the first reset terminal RST1, the second reset terminal RST2 and the scan signal terminal GATE are high-level signals. The signal of the light emitting signal terminal EM is a low-level signal, so that the fifth transistor T5 and the sixth transistor T6 are turned on, and a power supply voltage outputted by the first power supply terminal VDD provides a drive voltage to the anode of the light emitting device L through the turned-on fifth transistor T5, third transistor T3 and sixth transistor T6, to drive the light emitting device L to emit light. The signals of the first reset terminal RST1, the second reset terminal RST2 and the light emitting signal terminal EM are high-level signals, so that the first transistor T1, the second transistor T2, the fourth transistor T4 and the seventh transistor T7 are turned off.

In a drive process of the pixel circuit, a drive current flowing through the third transistor T3 (the drive transistor) is determined by a voltage difference between the control electrode and first electrode of the third transistor T3. Because the voltage of the second node N2 is Vdata−|Vth|, the drive current of the third transistor T3 satisfies:

$$I = K^*(Vgs-Vth)^2 = K^*[(Vdd-Vd+|Vth|)-Vth]^2 = K^*[(Vdd-Vd)]^2$$

Herein, I is a drive current flowing through the third transistor T3, that is, the drive current for driving the OLED, K is a constant, Vgs is a voltage difference between the control electrode and the first electrode of the third transistor T3, Vth is a threshold voltage of the third transistor T3, Vd is a data voltage outputted by the data signal terminal DATA, and Vdd is a power supply voltage outputted by the first power supply terminal VDD.

In the present disclosure, the signals of the first reset terminal RST1 are all effective levels in the first, second and third stages, and is an ineffective level only in the fourth stage. The signal of the light emitting signal terminal EM, on the contrary, is an ineffective level in the first, second and third stages, and is an effective level only in the fourth stage.

Herein, a duration for which the signal of the first reset terminal is an effective level is equal to a duration for which the signal of the light emitting signal terminal is an ineffective level. The display panel provided by the present disclosure sufficiently prolongs the time for maintaining the voltage for resetting the anode of the light emitting device L, increasing the service life of the display panel.

Figure 4:
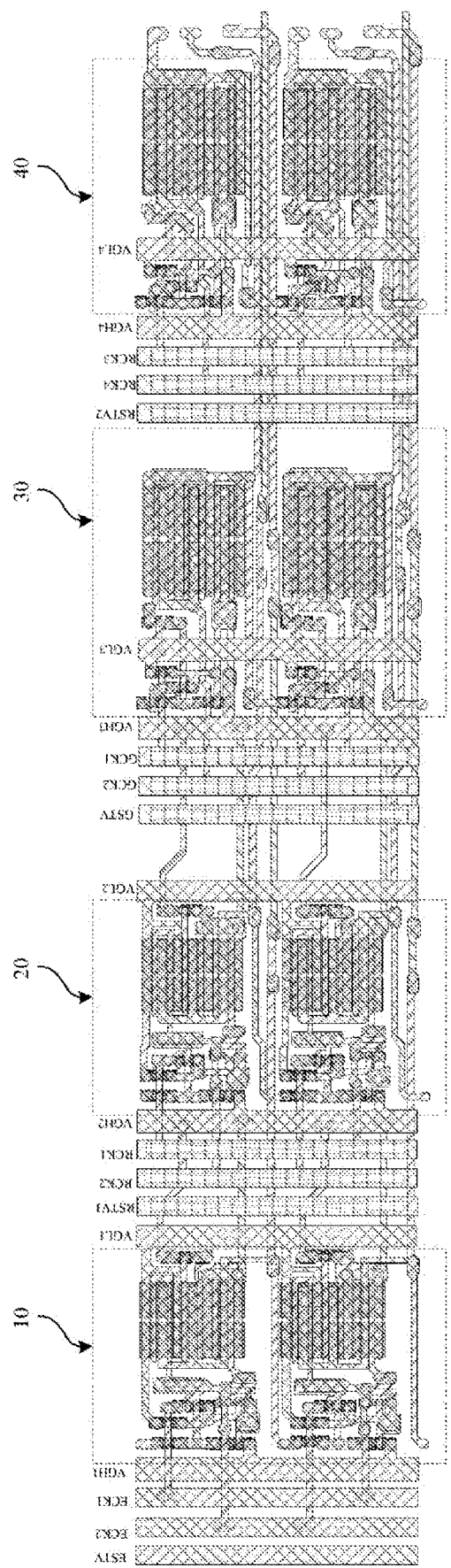
FIG. 4 is a partial schematic diagram of a non-display region provided by an exemplary embodiment.

In some exemplary embodiments, FIG. 4 is a partial schematic diagram of a non-display region provided by an exemplary embodiment. As shown in FIG. 4, the non-display region is provided with a light emitting drive circuit 10 that provides a drive signal to the light emitting signal line, a first reset drive circuit 20 that provides a drive signal to the first reset signal line, a scan drive circuit 30 that provides a drive signal to the scan signal line, and a second reset drive circuit 40 that provides a drive signal to the second reset signal line. The light emitting drive circuit 10, the first reset drive circuit 20, the scan drive circuit 30 and the second reset drive circuit 40 are collectively referred to as gate drive circuits.

The light emitting drive circuit 10 is located at a side of the display region, and the first reset drive circuit 20 is located between the light emitting drive circuit 10 and the display region; the scan drive circuit 30 is located between the first reset drive circuit 20 and the display region; and the second reset drive circuit 40 is located between the scan drive circuit 30 and the display region.

In an exemplary embodiment, the light emitting drive circuit may be located at the left and right sides of the display region, or may be located at the left side of the display region, or may be located at the right side of the display region.

In some exemplary embodiments, the gate drive circuit may be arranged on the left or right side of the display region, and the timing controller and the source drive circuit may be arranged on the upper or lower side of the display region. Herein, the source drive circuit may provide data signals to a plurality of columns of sub-pixels through a plurality of data signal lines. The scan drive circuit may provide scan signals to a plurality of rows of sub-pixels through a plurality of scan signal lines. The light emitting drive circuit may provide light emitting signals to a plurality of rows of sub-pixels through a plurality of light emitting signal lines. The first reset drive circuit may provide first reset signals to a plurality of rows of sub-pixels through a plurality of first reset signal lines. The second reset drive circuit may provide second reset signals to a plurality of rows of sub-pixels through a plurality of second reset signal lines.

In an exemplary embodiment, the timing controller may provide gray-scale values and control signals that are adaptable to specifications of the source drive circuit to the source drive circuit, provide clock signals and scan starting signals that are adaptable to specifications of the scan drive circuit to the scan drive circuit, and provide clock signals and emission stop signals that are adaptable to specifications of the light emitting drive circuit to the light emitting drive circuit.

In an exemplary embodiment, the source drive circuit may generate data voltages to be provided to data lines using the gray-scale value and the control signal received from the timing controller.

In an exemplary embodiment, the scan drive circuit may generate scan signals to be provided to the scan lines by receiving the clock signal, the scan starting signal, or the like, from the timing controller. For example, the scan drive circuit may provide the scan signals to the scan signal lines sequentially. For example, the scan drive circuit may be composed of a plurality of cascaded shift registers, and may enable various shift registers to sequentially generate scan signals under control of the clock signal.

In an exemplary embodiment, the light emitting drive circuit may generate light emitting signals to be provided to the light emitting signal lines by receiving the clock signal, the emission stop signal, or the like, from the timing controller. For example, the light emitting drive circuit may sequentially provide the light emitting signals to the light emitting signal lines. For example, the light emitting drive circuit may be composed of a plurality of cascaded shift registers, and may enable various shift registers to sequentially generate light emitting signals under control of the clock signal.

In an exemplary embodiment, the display panel may further include a first power supply line and a second power supply line which extend along the first direction, wherein the first power supply line provides a high-level signal continuously, and the second power supply line VGL may provide a low-level signal continuously.

For a pixel circuit in each sub-pixel, a first power supply terminal is connected to the first power supply line, and a second power supply terminal is connected to the second power supply line.

In an exemplary embodiment, as shown in FIG. 4, the display panel may further include a light emitting initial signal line ESTV, a second light emitting clock line ECK2, a first light emitting clock line ECK1, a first high-level signal line VGH1, a first low-level signal line VGL1, a first reset initial signal line RSTV1, a second reset clock line ECK2, a first reset clock line RCK1, a second high-level signal line VGH2, a second low-level signal line VGL2, a scan initial signal line GSTV, a second scan clock line GCK2, a first scan clock line GCK1, a third high-level signal line VGH3, a third low-level signal line VGL3, a second reset initial signal line RSTV2, a third reset clock line ECK3, a fourth reset clock line RCK4, a fourth high-level signal line VGH4 and a fourth low-level signal line VGL4.

In an exemplary embodiment, the first high-level signal line VGH1, the second high-level signal line VGH2, the third high-level signal line VGH3, and the fourth high-level signal line VGH4 all continuously provide high-level signals. The first low-level signal line VGL1, the second low-level signal line VGL2, the third low-level signal line VGL3, and the fourth low-level signal line VGL4 all continuously provide low-level signals.

In an exemplary embodiment, the light emitting initial signal line ESTV, the second light emitting clock line ECK2, the first light emitting clock line ECK1 and the first high-level signal line VGH1 are all located on a side of the light emitting drive circuit away from the display region, and the first low-level signal line VGL1 is located on a side of a light emitting shift register close to the display region. The second light emitting clock line ECK2 is located on a side of the initial light emitting signal line ESTV close to the display region, the first light emitting clock line ECK1 is located on a side of the second light emitting clock line ECK2 close to the display region, and the first high-level signal line VGH1 is located on a side of the first light emitting clock line ECK1 close to the display region. The first reset initial signal line RSTV1, the second reset clock line ECK2, the first reset clock line RCK1, and the second high-level signal line VGH2 are located on a side of the first reset drive circuit away from the display region, and the second low-level signal line VGL2 is located on a side of the first reset drive circuit close to the display region. The first reset initial signal line RSTV1 is located on a side of the first low-level signal line VGL1 close to the display region, the second reset clock line RCK2 is located on a side of the first reset initial signal line RSTV1 close to the display region, the first reset clock line RCK1 is located on a side of the second reset clock line ECK2 close to the display region, and the second high-level signal line VGH2 is located on a side of the first reset clock line RCK1 close to the display region. The scan initial signal line GSTV, the second scan clock line GCK2, the first scan clock line GCK1, and the third high-level signal line VGH3 are located on a side of the scan drive circuit away from the display region. The scan initial signal line GSTV is located on a side of the second low-level signal line VGL2 close to the display region, the second scan clock line GCK2 is located on a side of the scan initial signal line GSTV close to the display region, the first scan clock line GCK1 is located on a side of the second scan clock line GCK2 close to the display region, the third high-level signal line VGH3 is located on a side of the first scan clock line GCK1 close to the display region, and the third low-level signal line VGL3 is located on a side of the third high-level signal line VGH3 close to the display region. The second reset initial signal line RSTV2, the third reset clock line ECK3, the fourth reset clock line RCK4, and the fourth high-level signal line VGH4 are located on a side of the second reset drive circuit away from the display region. Herein, the second reset initial signal line RSTV2 is located on a side of the third low-level signal line VGL3 close to the display region, the fourth reset clock line RCK4 is located on a side of the second reset initial signal line RSTV2 close to the display region, the third reset clock line ECK3 is located on a side of the fourth reset clock line RCK4 close to the display region, the fourth high-level signal line VGH4 is located on a side of the third reset clock line ECK3 close to the display region, and the fourth low-level signal line VGL4 is located on a side of the fourth high-level signal line VGH4 close to the display region.

In an exemplary embodiment, the light emitting drive circuit includes a plurality of light emitting shift registers, and the first reset drive circuit includes a plurality of first reset shift registers. Herein, the light emitting shift register includes a plurality of light emitting transistors and a plurality of light emitting capacitors, and the first reset shift register includes a plurality of reset transistors and a plurality of reset capacitors; and a connection relationship between the plurality of light emitting transistors and the plurality of light emitting capacitors in the light emitting shift register is the same as a connection relationship between the plurality of reset transistors and the plurality of reset capacitors in the first reset shift register.

In an exemplary embodiment, the connection relationship between the plurality of light emitting transistors and the plurality of light emitting capacitors in the light emitting shift register is the same as the connection relationship between the plurality of reset transistors and the plurality of reset capacitors in the first reset shift register, which means that an equivalent circuit structure of the light emitting shift register is the same as that of the first reset shift register. The first reset shift register in the present application adopts the equivalent circuit structure of the light emitting shift register, which may make the first reset shift register output a pulse signal with a longer duration, prolonging the service life of the display panel.

Figure 5:
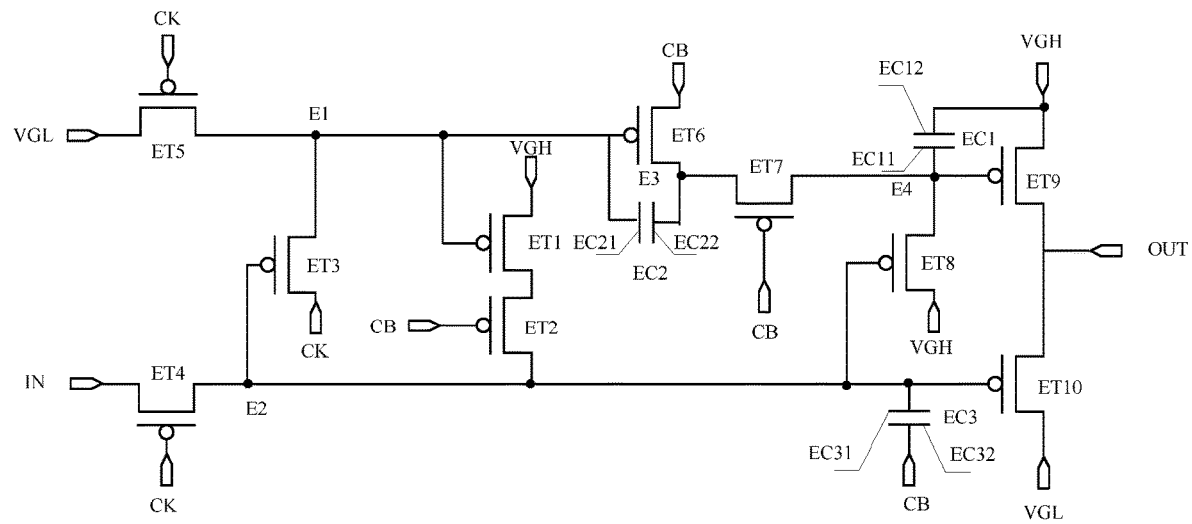
FIG. 5 is an equivalent circuit diagram of a light emitting shift register.

In an exemplary embodiment, the plurality of light emitting shift registers in the light emitting drive circuit are cascaded. FIG. 5 is an equivalent circuit diagram of a light emitting shift register. As shown in FIG. 5, each light emitting shift register includes first to tenth light emitting transistors ET1 to ET10, and first to third light emitting capacitors EC1 to EC3. The first light emitting capacitor EC1 includes a first electrode plate EC11 and a second electrode plate EC12, the second light emitting capacitor EC2 includes a first electrode plate EC21 and a second electrode plate EC22, and the third light emitting capacitor EC3 includes a first electrode plate EC31 and a second electrode plate EC32.

In an exemplary embodiment, a control electrode of the first light emitting transistor ET1 is connected to a first node E1, a first electrode of the first light emitting transistor ET1 is connected to a first power supply terminal VGH, and a second electrode of the first light emitting transistor ET1 is connected to a first electrode of the second light emitting transistor ET2. A control electrode of the second light emitting transistor ET1 is connected to a second clock signal terminal CB, and a second electrode of the second light emitting transistor ET2 is connected to a second node E2. A control electrode of the third light emitting transistor ET3 is connected to the second node E2, a first electrode of the third light emitting transistor ET3 is connected to the first node E1, and a second electrode of the third light emitting transistor ET3 is connected to a first clock signal terminal CK. A control electrode of the fourth light emitting transistor ET4 is connected to the first clock signal terminal CK, a first electrode of the fourth light emitting transistor ET4 is connected to a signal input terminal IN, and a second electrode of the fourth light emitting transistor ET4 is connected to the second node E2. A control electrode of the fifth light emitting transistor ET5 is connected to the light emitting signal terminal CK, a first electrode of the fifth light emitting transistor ET5 is connected to a second power supply terminal VGL, and a second electrode of the fifth light emitting transistor ET5 is connected to the first node E1. A control electrode of the sixth light emitting transistor ET6 is connected to the first node E1, a first electrode of the sixth light emitting transistor ET6 is connected to the second clock signal terminal CB, a second electrode of the sixth light emitting transistor ET6 is connected to a first electrode of the seventh light emitting transistor ET7, and the second electrode of the sixth light emitting transistor ET6 is connected to a third node E3. A control electrode of the seventh light emitting transistor ET7 is connected to the second clock signal terminal CB, the first electrode of the seventh light emitting transistor ET7 is connected to the third node E3, and a second electrode of the seventh light emitting transistor ET7 is connected to a fourth node E4. A control electrode of the eighth light emitting transistor ET8 is connected to the first node E1, a first electrode of the eighth light emitting transistor ET8 is connected to the fourth node E4, and a second electrode of the eighth light emitting transistor ET8 is connected to the first power supply terminal VGH. A control electrode of the ninth light emitting transistor ET9 is connected to the fourth node E4, a first electrode of the ninth light emitting transistor ET9 is connected to the first power supply terminal VGH, and a second electrode of the ninth light emitting transistor ET9 is connected to a signal output terminal OUT. A control electrode of the tenth light emitting transistor ET10 is connected to the first node E1, a first electrode of the tenth light emitting transistor ET10 is connected to the signal output terminal OUT, and a second electrode of the tenth light emitting transistor ET10 is connected to the second power supply terminal VGL. A first electrode plate EC11 of the first light emitting capacitor EC1 is connected to the first node E4, and a second electrode plate EC12 of the first light emitting capacitor EC1 is connected to the first power supply terminal VGH. A first electrode plate EC21 of the second light emitting capacitor EC2 is connected to the first node E1, and a second electrode plate EC22 of the second light emitting capacitor EC2 is connected to the third node E3. A first electrode plate E31 of the third light emitting capacitor EC3 is connected to the second node E2, and a second electrode plate E32 of the third light emitting capacitor EC3 is connected to the second clock signal terminal CB.

In an exemplary embodiment, the first power supply terminal VGH may continuously provide a high-level signal, and the second power supply terminal VGL may continuously provide a low-level signal.

In an exemplary embodiment, the first light emitting transistor ET1 to the tenth light emitting transistor ET10 may be P-type transistors or N-type transistors. Use of the same type of transistors in the light emitting drive circuit may simplify process flows, reduce process difficulties of the display panel, and improve yield of the products.

In an exemplary embodiment, a signal input terminal of a light emitting shift register of a first stage is connected with the light emitting initial signal line ESTV, and a signal output terminal of a light emitting shift register of an i-th stage is connected with a signal input terminal of a light emitting shift register of an (i+1)-th stage. A first power supply terminal of a light emitting shift register of each stage is connected to the first high-level signal line VGH1 and the second high-level signal line VGH2. A second power supply terminal of a light emitting shift register of each stage is connected to the first low-level signal line VGL1. First clock signal terminals of shift registers of odd-numbered stages are connected to the first light emitting clock line ECK1, second clock signal terminals of shift registers of odd-numbered stages are connected to the second light emitting clock line ECK2, first clock signal terminals of shift registers of even-numbered stages are connected to the second light emitting clock line ECK2, and second clock signal terminals of shift registers of even-numbered stages are connected to the first light emitting clock line ECK1.

Figure 6:
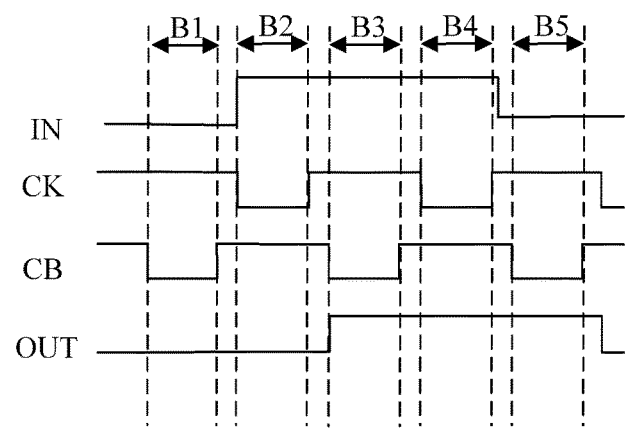
FIG. 6 is a signal timing diagram of the light emitting shift register provided in FIG. 5.

FIG. 6 is a signal timing diagram of the light emitting shift register provided in FIG. 5. FIG. 6 is illustrated by taking first to tenth light emitting transistors ET1 to ET10 being P-type transistors as an example. As shown in FIG. 6, a working process of the light emitting shift register in accordance with an exemplary embodiment may include the following stages.

In a first stage B1, signals of the signal input terminal IN and the second clock signal terminal CB are low-level signals, and a signal of the first clock signal terminal CK is a high-level signal. The signal of the first clock signal terminal CK is a high-level signal, the fourth light emitting transistor ET4 and the fifth light emitting transistor ET5 are turned off, the signal of the signal input terminal IN cannot be written to the second node E2, and the signal of the second power supply terminal VGL cannot be written to the first node E1. Under the action of the third light emitting capacitor EC3, the signal of the second node E2 maintains to be a low-level signal, the third light emitting transistor ET3, the eighth light emitting transistor ET8 and the tenth light emitting transistor ET10 are turned on, the high-level signal of the first clock signal terminal CK is written to the first node E1, the first light emitting transistor ET1 and the sixth light emitting transistor ET6 are turned off, the high-level signal of the first power supply terminal VGH is written to the fourth node E4, and the low-level signal of the second power supply terminal VGL is written to the signal output terminal OUT. The signal of the third node E3 maintains to be a high-level signal, the signal of the second clock signal terminal CB is a low-level signal, the second light emitting transistor ET2 and the seventh light emitting transistor ET7 are turned on, the signal of the third node E3 is written to the fourth node E4, the signal of the fourth node E4 maintains to be a high-level signal, and the ninth light emitting transistor ET9 is turned off. The signal output terminal OUT outputs a low-level signal in this stage.

In a second stage B2, the signal of the first clock signal terminal CK are a low-level signal, and the signals of the signal input terminal IN and the second clock signal terminal CB are high-level signals. The signal of the second clock signal terminal CB is a high-level signal, and the second light emitting transistor ET2 and the seventh light emitting transistor ET7 are turned off. The signal of the first clock signal terminal CK is a low-level signal, and the fourth light emitting transistor ET4 and the fifth light emitting transistor ET5 are turned on. The high-level signal of the signal input terminal IN is written to the second node E2, the third light emitting transistor ET3, the eighth light emitting transistor ET8 and the tenth light emitting transistor ET10 are turned off, the signal of the first clock signal terminal CK cannot be written to the first node E1, the signal of the first power supply terminal VGH cannot be written to the fourth node E4, the signal of the second power supply terminal VGL cannot be written to the signal output terminal OUT, the low-level signal of the second power supply terminal VGL is written to the first node E1, the first light emitting transistor ET1 and the sixth light emitting transistor ET6 are turned on, and the signal of the second clock signal terminal CB is written to the third node E3. Because the seventh light emitting transistor ET7 is turned off, the signal of the third node E3 cannot be written to the fourth node E4. The signal output terminal OUT maintains to be the low-level signal of the previous stage in this stage.

In a third stage B3, the signal of the second clock signal terminal CB is a low-level signal, and the signals of the signal input terminal IN and of the first clock signal terminal CK are high-level signals. The signal of the first clock signal terminal CK is a high-level signal, the fourth light emitting transistor ET4 and the fifth light emitting transistor ET5 are turned off, the signal of the signal input terminal IN cannot be written to the second node E2, and the signal of the second power supply terminal VGL cannot be written to the first node E1. Under the action of the third light emitting capacitor EC3, the signal of the second node E2 maintains to be the high-level signal of the previous stage. Under the action of the second light emitting capacitor EC2, the signal of the first node E1 maintains to be the low-level signal of the previous stage, the first light emitting transistor ET1 and the sixth light emitting transistor ET6 are turned on, the high-level signal of the first power supply terminal VGH is written to the second node E2, so that the second node E2 maintains to be the high-level signal, the low-level signal of the second clock signal terminal CB is written to the third node E3, the signal of the third node E3 is written to the fourth node E4, the ninth light emitting transistor E9 is turned on, and the high-level signal of the first power supply terminal VGH is written to the signal output terminal OUT. The signal output terminal OUT outputs a high-level signal in this stage.

In a fourth stage B4, the signal of the first clock signal terminal CK is a low-level signal, and the signals of the signal input terminal IN and the second clock signal terminal CB are high-level signals. The signal of the second clock signal terminal CB is a high-level signal, and the second light emitting transistor ET2 and the seventh light emitting transistor ET7 are turned off. The signal of the first clock signal terminal CK is a low-level signal, and the fourth light emitting transistor ET4 and the fifth light emitting transistor ET5 are turned on. The high-level signal of the signal input terminal IN is written to the second node E2, the third light emitting transistor ET3, the eighth light emitting transistor ET8 and the tenth light emitting transistor ET10 are turned off, the signal of the first clock signal terminal CK cannot be written to the first node E1, the signal of the first power supply terminal VGH cannot be written to the fourth node E4, the signal of the second power supply terminal VGL cannot be written to the signal output terminal OUT, the low-level signal of the second power supply terminal VGL is written to the first node E1, the first light emitting transistor ET1 and the sixth light emitting transistor ET6 are turned on, and the signal of the second clock signal terminal CB is written to the third node E3. Because the seventh light emitting transistor ET7 is turned off, the signal of the third node E3 cannot be written to the fourth node E4. The signal output terminal OUT maintains the high-level signal of the previous stage in this stage.

In a fifth stage B5, the signal of the first clock signal terminal CK is a high-level signal, and the signals of the signal input terminal IN and the second clock signal terminal CB are low-level signals. The signal of the first clock signal terminal CK is a high-level signal, the fourth light emitting transistor ET4 and the fifth light emitting transistor ET5 are turned off, the signal of the signal input terminal IN cannot be written to the second node E2, and the signal of the second power supply terminal VGL cannot be written to the first node E1. Under the action of the third light emitting capacitor EC3, the signal of the second node E2 maintains to be the high-level signal of the previous stage. Under the action of the second light emitting capacitor EC2, the signal of the first node E1 maintains to be the low-level signal of the previous stage, the first light emitting transistor ET1 and the sixth light emitting transistor ET6 are turned on, the high-level signal of the first power supply terminal VGH is written to the second node E2, so that the second node E2 maintains to be the high-level signal, the low-level signal of the second clock signal terminal CB is written to the third node E3, the signal of the third node E3 is written to the fourth node E4, the ninth light emitting transistor E9 is turned on, and the high-level signal of the first power supply terminal VGH is written to the signal output terminal OUT. The signal output terminal OUT outputs a high-level signal in this stage.

Figure 7:
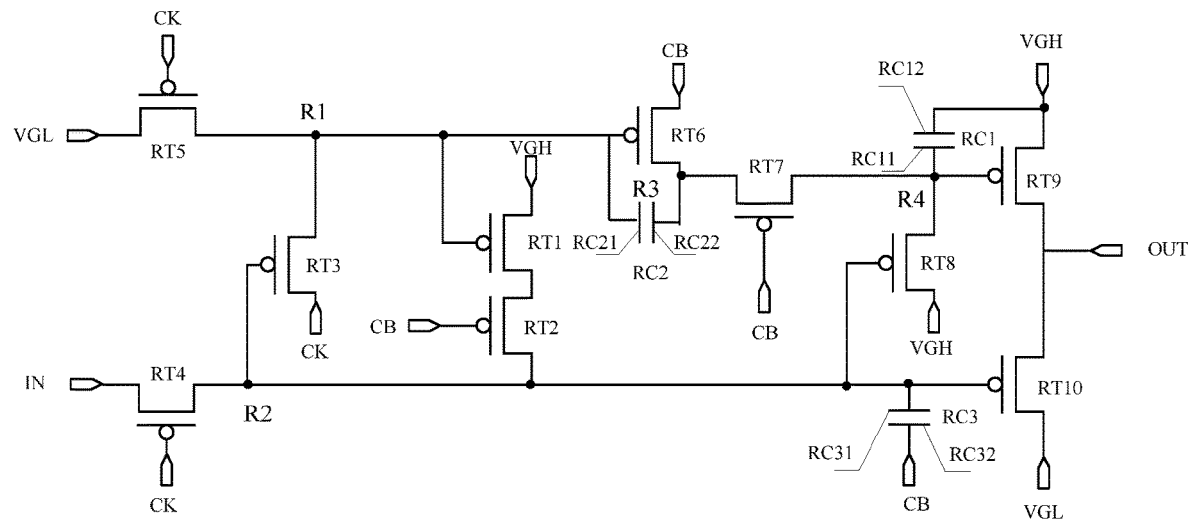
FIG. 7 is an equivalent circuit diagram of a first reset shift register.

In an exemplary embodiment, the plurality of first reset shift registers in the first reset drive circuit are cascaded. FIG. 7 is an equivalent circuit diagram of a first reset shift register. As shown in FIG. 7, each first reset shift register includes a first reset transistor RT1 to a tenth reset transistor RT10, and a first reset capacitor RC1 to a third reset capacitor RC3. The first reset capacitor RC1 includes a first electrode plate RC11 and a second electrode plate RC12, the second reset capacitor RC2 includes a first electrode plate RC21 and a second electrode plate RC22, and the third reset capacitor RC3 includes a first electrode plate RC31 and a second electrode plate RC32.

In an exemplary embodiment, a control electrode of the first reset transistor RT1 is connected to the first node R1, a first electrode of the first reset transistor RT1 is connected to a first power supply terminal VGH, and a second electrode of the first reset transistor RT1 is connected to a first electrode of the second reset transistor RT2. A control electrode of the second reset transistor RT1 is connected to the second clock signal terminal CB, and a second electrode of the second reset transistor RT2 is connected to the second node R2. A control electrode of the third reset transistor RT3 is connected to the second node R2, a first electrode of the third reset transistor RT3 is connected to the first node R1, and a second electrode of the third reset transistor RT3 is connected to the first clock signal terminal CK. A control electrode of the fourth reset transistor RT4 is connected to the first clock signal terminal CK, a first electrode of the fourth light emitting transistor RT4 is connected to the signal input terminal IN, and a second electrode of the fourth reset transistor RT4 is connected to the second node R2. A control electrode of the fifth reset transistor RT5 is connected to the first clock signal terminal CK, a first electrode of the fifth reset transistor RT5 is connected to the second power supply terminal VGL, and a second electrode of the fifth reset transistor RT5 is connected to the first node R1. A control electrode of the sixth reset transistor RT6 is connected to the first node R1, a first electrode of the sixth reset transistor RT6 is connected to the second clock signal terminal CB, a second electrode of the sixth reset transistor RT6 is connected to a first electrode of the seventh reset transistor RT7, and the second electrode of the sixth reset transistor RT6 is connected to the third node R3. A control electrode of the seventh reset transistor RT7 is connected to the second clock signal terminal CB, the first electrode of the seventh reset transistor RT7 is connected to the third node R3, and a second electrode of the seventh reset transistor RT7 is connected to a fourth node R4. A control electrode of the eighth reset transistor RT8 is connected to the first node R1, a first electrode of the eighth reset transistor RT8 is connected to the fourth node R4, and a second electrode of the eighth reset transistor RT8 is connected to the first power supply terminal VGH. A control electrode of the ninth reset transistor RT9 is connected to the fourth node R4, a first electrode of the ninth reset transistor RT9 is connected to the first power supply terminal VGH, and a second electrode of the ninth reset transistor RT9 is connected to the signal output terminal OUT. A control electrode of the tenth reset transistor RT10 is connected to the first node R1, a first electrode of the tenth reset transistor RT10 is connected to the signal output terminal OUT, and a second electrode of the tenth reset transistor RT10 is connected to the second power supply terminal VGL. A first electrode plate RC11 of the first reset capacitor RC1 is connected to the fourth node R4, and a second electrode plate RC12 of the first reset capacitor RC1 is connected to the first power supply terminal VGH. A first electrode plate RC21 of the second reset capacitor RC2 is connected to the first node R1, and a second electrode plate RC22 of the second reset capacitor RC2 is connected to the third node R3. A first electrode plate R31 of the third reset capacitor RC3 is connected to the second node R2, and a second electrode plate R32 of the third reset capacitor RC3 is connected to the second clock signal terminal CB.

In an exemplary embodiment, the first power supply terminal VGH may continuously provide a high-level signal, and the second power supply terminal VGL may continuously provide a low-level signal.

In an exemplary embodiment, the first reset transistor RT1 to the tenth reset transistor RT10 may be P-type transistors or N-type transistors. Use of the same type of transistors in the reset drive circuit may simplify process flows, reduce process difficulties of the display panel, and improve yield of the products.

A signal input terminal of a first reset shift register of a first stage is connected to the first reset initial signal line RSTV1, and a signal output terminal of first reset shift register of an i-th stage is connected to a signal input terminal of a first reset shift register of an (i+1)-th stage. A first power supply terminal of a first reset shift register of each stage is connected to the second high-level signal line VGH2 and the third high-level signal line VGH3. A second power supply terminal of a first reset shift register of each stage is connected to the second low-level signal line VGL2. First clock signal terminals of first reset shift registers of odd-numbered stages are connected with the first reset clock line RCK1, second clock signal terminals of first reset shift registers of odd-numbered stages are connected with the second reset clock line RCK2, first clock signal terminals of first reset shift registers of even-numbered stages are connected with the second reset clock line RCK2, and second clock signal terminals of first reset shift registers of even-numbered stages are connected with the first reset clock line RCK1.

Figure 8:
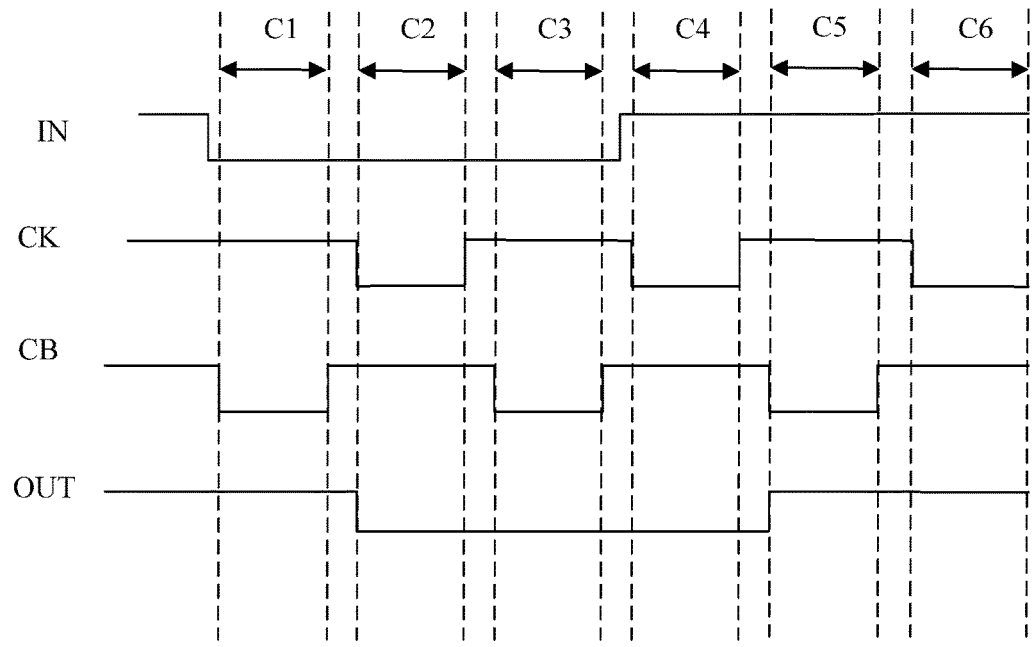
FIG. 8 is a signal timing diagram of the first reset shift register provided in FIG. 7.

FIG. 8 is a signal timing diagram of the first reset drive circuit provided in FIG. 7. FIG. 8 is illustrated by taking the first reset transistor RT1 to the tenth reset transistor RT10 being P-type transistors as an example. As shown in FIG. 8, a working process of the first reset shift register provided by an exemplary embodiment may include the following stages.

In a first stage C1, signals of the signal input terminal IN and the second clock signal terminal CB are low-level signals, and a signal of the first clock signal terminal CK is a high-level signal. The signal of the second clock signal terminal CB is a low-level signal, and the second reset transistor RT2 and the seventh reset transistor RT7 are turned on. The signal of the first clock signal terminal CK is a high-level signal, the fourth reset transistor RT4 and the fifth reset transistor RT5 are turned off, the signal of the signal input terminal IN cannot be written to the second node R2, the signal of the second power supply terminal VGL cannot be written to the first node R1, the third reset transistor RT3, the sixth reset transistor RT6, the eighth reset transistor RT8 and the tenth reset transistor RT10 are turned off, and the signal output terminal OUT maintains to be the high-level signal of the previous stage.

In a second stage C2, the signals of the signal input terminal IN and the first clock signal terminal CK are low-level signals, and the signal of the second clock signal terminal CB is a high-level signal. The signal of the second clock signal terminal CB is a high-level signal, the second reset transistor RT2 and the seventh reset transistor RT7 are turned off. The signal of the first clock signal terminal CK is a low-level signal, the fourth reset transistor RT4 and the fifth reset transistor RT5 are turned on. The low-level signal of the signal input terminal IN is written to the second node R2, the third reset transistor RT3, the eighth reset transistor RT8 and the tenth reset transistor RT10 are turned on, the signal of the first clock signal terminal CK is written to the first node R1, the high-level signal of the first power supply terminal VGH is written to a fourth node R4, the ninth reset transistor RT9 is turned off, and the low-level signal of the second power supply terminal VGL is written to the signal output terminal OUT. The low-level signal of the second power supply terminal VGL is written to the first node R1, the first reset transistor RT1 and the sixth reset transistor RT6 are turned on, and the high-level signal of the second clock signal terminal CB is written to the third node R3. Because the seventh reset transistor RT7 is turned off, the signal of the third node R3 cannot be written to the fourth node R4. The signal output terminal OUT outputs a low-level signal in this stage.

In a third stage C3, the signals of the signal input terminal IN and the second clock signal terminal CB are low-level signals, and the signal of the first clock signal terminal CK is a high-level signal. The signal of the first clock signal terminal CK is a high-level signal, the fourth reset transistor RT4 and the fifth reset transistor RT5 are turned off, the signal of the signal input terminal IN cannot be written to the second node R2, and the signal of the second power supply terminal VGL cannot be written to the first node R1. Under the action of the third reset capacitor, the signal of the second node R2 maintains to be a low-level signal, the third reset transistor RT3, the eighth reset transistor RT8 and the tenth reset transistor RT10 are turned on, the high-level signal of the first clock signal terminal CK is written to the first node R1, the first reset transistor RT1 and the sixth reset transistor RT6 are turned off, the high-level signal of the first power supply terminal VGH is written to the fourth node R4, and the low-level signal of the second power supply terminal VGL is written to the signal output terminal OUT. The signal of the third node R3 maintains to be a high-level signal, the signal of the second clock signal terminal CB is a low-level signal, the second reset transistor RT2 and the seventh reset transistor RT7 are turned on, the signal of the third node R3 is written to the fourth node R4, the signal of the fourth node R4 maintains to be a high level signal, and the ninth reset transistor RT9 is turned off. The signal output terminal OUT outputs a low-level signal in this stage.

In a fourth stage C4, the signal of the first clock signal terminal CK is a low-level signal, and the signals of the signal input terminal IN and the second clock signal terminal CB are high-level signals. The signal of the second clock signal terminal CB is a high-level signal, the second reset transistor RT2 and the seventh reset transistor RT7 are turned off. The signal of the first clock signal terminal CK is a low-level signal, the fourth reset transistor RT4 and the fifth reset transistor RT5 are turned on. The high-level signal of the signal input terminal IN is written to the second node R2, the third reset transistor RT3, the eighth reset transistor RT8 and the tenth reset transistor RT10 are turned off, the signal of the first clock signal terminal CK cannot be written to the first node R1, the signal of the first power supply terminal VGH cannot be written to the fourth node R4, the signal of the second power supply terminal VGL cannot be written to the signal output terminal OUT, the low-level signal of the second power supply terminal VGL is written to the first node R1, the first reset transistor RT1 and the sixth reset transistor RT6 are turned on, and the signal of the second clock signal terminal CB is written to the third node R3. Because the seventh reset transistor RT7 is turned off, the signal of the third node R3 cannot be written to the fourth node R4. The signal output terminal OUT maintains to be the low-level signal of the previous stage in this stage.

In a fifth stage C5, the signal of the second clock signal terminal CB is a low-level signal, and the signals of the signal input terminal IN and the first clock signal terminal CK are high-level signals. The signal of the first clock signal terminal CK is a high-level signal, the fourth reset transistor RT4 and the fifth reset transistor RT5 are turned off, the signal of the signal input terminal IN cannot be written to the second node R2, and the signal of the second power supply terminal VGL cannot be written to the first node R1. Under the action of the third reset capacitor RC3, the signal of the second node R2 maintains to be a high-level signal of the previous stage. Under the action of the second reset capacitor RC2, the signal of the first node R1 maintains to be a low-level signal of the previous stage, the first reset transistor RT1 and the sixth reset transistor RT6 are turned on, the high-level signal of the first power supply terminal VGH is written to the second node R2, so that the second node R2 maintains to be a high-level signal, the low-level signal of the second clock signal terminal CB is written to the third node R3, the signal of the third node R3 is written to the fourth node R4, the ninth reset transistor R9 is turned on, and the high-level signal of the first power supply terminal VGH is written to the signal output terminal OUT. The signal output terminal OUT outputs a high-level signal in this stage.

In a sixth stage C6, the signal of the first clock signal terminal CK is a low-level signal, and the signals of the signal input terminal IN and the second clock signal terminal CB are high-level signals. The signal of the second clock signal terminal CB is a high-level signal, the second reset transistor RT2 and the seventh reset transistor RT7 are turned off. The signal of the first clock signal terminal CK is a low-level signal, the fourth reset transistor RT4 and the fifth reset transistor RT5 are turned on. The high-level signal of the signal input terminal IN is written to the second node R2, the third reset transistor RT3, the eighth reset transistor RT8 and the tenth reset transistor RT10 are turned off, the signal of the first clock signal terminal CK cannot be written to the first node R1, the signal of the first power supply terminal VGH cannot be written to the fourth node R4, the signal of the second power supply terminal VGL cannot be written to the signal output terminal OUT, the low-level signal of the second power supply terminal VGL is written to the first node R1, the first reset transistor RT1 and the sixth reset transistor RT6 are turned on, and the signal of the second clock signal terminal CB is written to the third node R3. Because the seventh reset transistor RT7 is turned off, the signal of the third node R3 cannot be written to the fourth node R4. The signal output terminal OUT maintains to be a high-level signal of the previous stage in this stage.

After the sixth stage C6, the fifth and sixth stages of the first reset shift register are performed alternately until the signal of the signal input terminal IN becomes a low-level signal.

The first reset shift register in the present disclosure has a 10T3C circuit structure, which is the same as the light emitting shift register, so that the first reset shift register may output a pulse signal with a longer duration.

Figure 9:
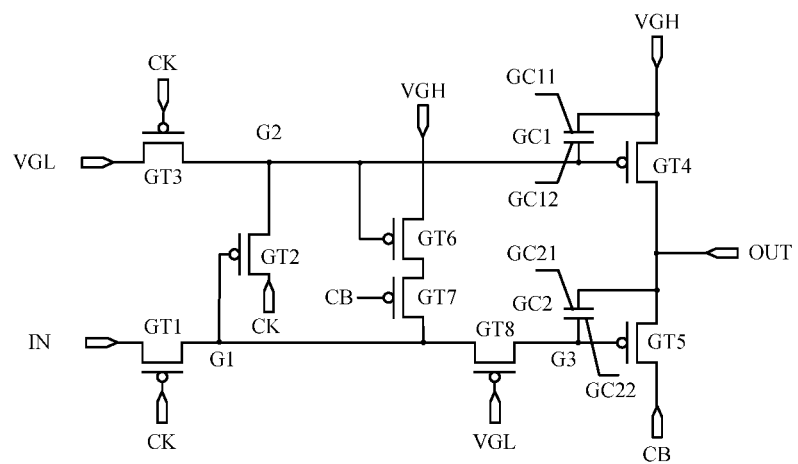
FIG. 9 is an equivalent circuit diagram of a scan shift register.

In an exemplary embodiment, as shown in FIG. 4, the scan drive circuit includes a plurality of cascaded scan shift registers. FIG. 9 is an equivalent circuit diagram of a scan shift register. As shown in FIG. 9, the scan shift register includes a first scan transistor GT1 to an eighth scan transistor GT8, a first scan capacitor GC1 and a second scan capacitor GC2. The first scan capacitor GC1 includes a first electrode plate GC11 and a second electrode plate GC12, and the second scan capacitor GC2 includes a first electrode plate GC21 and a second electrode plate GC22.

In an exemplary embodiment, a control electrode of the first scan transistor GT1 is connected to a first clock signal terminal CK, a first electrode of the first scan transistor GT1 is connected to a signal input terminal IN, and a second electrode of the first scan transistor GT1 is connected to a first node G1. A control electrode of the second scan transistor GT2 is connected to the first node G1, a first electrode of the second scan transistor GT2 is connected to a second node G2, and a second electrode of the second scan transistor GT2 is connected to the first clock signal terminal CK. A control electrode of the third scan transistor GT3 is connected to the first clock signal terminal CK, a first electrode of the third scan transistor GT3 is connected to a second power supply terminal VGL, and a second electrode of the third scan transistor GT3 is connected to the second node G2. A control electrode of the fourth scan transistor GT4 is connected to the second node G2, a first electrode of the fourth scan transistor GT4 is connected to a first power supply terminal VGH, and a second electrode of the fourth scan transistor GT4 is connected to an output terminal OUT. A control electrode of the fifth scan transistor GT5 is connected to a third node G3, a first electrode of the fifth scan transistor GT5 is connected to the signal output terminal OUT, and a second electrode of the fifth scan transistor GT5 is connected to the second clock signal terminal CB. A control electrode of the sixth scan transistor GT6 is connected to the second node G2, a first electrode of the sixth scan transistor GT6 is connected to the first power supply terminal VGH, and a second electrode of the sixth scan transistor GT6 is connected to a first electrode of the seventh scan transistor GT7. A control electrode of the seventh scan transistor GT7 is connected to the second clock signal terminal CB, and a second electrode of the seventh scan transistor GT7 is connected to the first node G1. A control electrode of the eighth scan transistor GT8 is connected to the second power supply terminal VGL, a first electrode of the eighth scan transistor GT8 is connected to the first node G1, and a second electrode of the eighth scan transistor GT8 is connected to the third node G3. A first electrode plate GC11 of the first scan capacitor GC1 is connected to the first power supply terminal VGH, and a second electrode plate GC12 of the first scan capacitor GC1 is connected to the second node G2. A first electrode plate GC21 of the second scan capacitor GC2 is connected to the signal output terminal OUT, and a second electrode plate GC22 of the second scan capacitor GC2 is connected to the third node G3.

In an exemplary embodiment, the first power supply terminal VGH may continuously provide a high-level signal, and the second power supply terminal VGL may continuously provide a low-level signal.

In an exemplary embodiment, the first scan transistor GT1 to the eighth scan transistor GT8 may be P-type transistors or N-type transistors. Use of the same type of transistors in the scan drive circuit may simplify process flows, reduce process difficulties of the display panel, and improve yield of the products.

In an exemplary embodiment, a signal input terminal of a scan shift register of a first stage is connected with the scan initial signal line GSTV, and a signal output terminal of a scan shift register of an i-th stage is connected with a signal input terminal of a stage scan shift register of an (i+1)-th stage. A first power supply terminal of a scan shift register of each stage is connected to a third high-level signal line VGH3. A second power supply terminal of a scan shift register of each stage is connected to the third low-level signal line VGL3. First clock signal terminals of scan shift registers of odd-numbered stages are connected with the first scan clock line GCK1, second clock signal terminals of scan shift registers of odd-numbered stages are connected with the second scan clock line GCK2, first clock signal terminals of the scan shift registers of even-numbered stages are connected with the second scan clock line GCK2, and second clock signal terminals of scan shift registers of even-numbered stages are connected with the first scan clock line GCK1.

Figure 10:
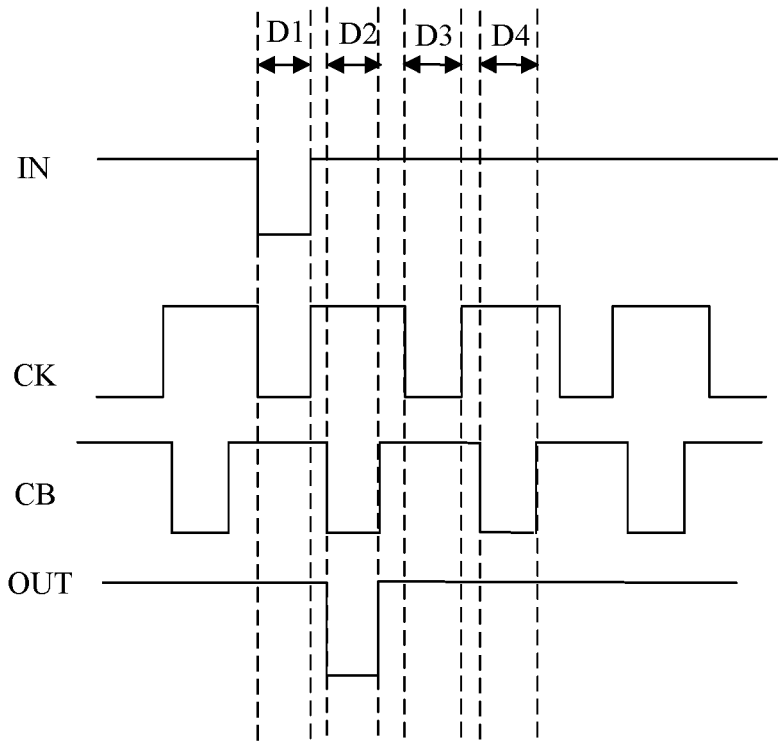
FIG. 10 is a signal timing diagram of the scan shift register provided in FIG. 9.

FIG. 10 is a signal timing diagram of the scan shift register provided in FIG. 9. are FIG. 10 is illustrated by taking the first to eighth scan transistors GT1 to GT8 being P-type transistors as an example. As shown in FIG. 10, a working process of a scan shift register in accordance with an exemplary embodiment may include the following stages.

In a first stage D1, signals of the signal input terminal IN and the first clock signal terminal CK are low-level signals, and a signal of the second clock signal terminal CB is a high-level signal. The signal of the first clock signal terminal CK is a low-level signal, the first scan transistor GT1 and the third scan transistor GT3 are turned on, and the signal of the eighth scan transistor GT8 receives a low-level signal of the second power supply terminal VGL to maintain turned-on. The signal of the signal input terminal IN is written to the first node G1, the signal of the first node G1 is written to the third node G3, the fifth scan transistor GT5 is turned on, and the signal of the second clock signal terminal CB is transmitted to the signal output terminal OUT via the fifth scan transistor GT5. In addition, the low-level signal of the second power supply terminal VGL is written to the second node G2, the fourth scan transistor GT4 and the sixth scan transistor GT6 are turned on, and the high-level signal of the first power supply terminal VGH is written to the signal output terminal OUT. Because the signal of the second scan clock signal terminal CB is a high-level signal, the seventh scan transistor GT7 is turned off. The signal outputted by the signal output terminal OUT is a high-level signal in this stage.

In a second stage D2, the signals of the signal input terminal IN and the first clock signal terminal CK are high-level signals, and the signal of the second clock signal terminal CB is a low-level signal. The signal of the first clock signal terminal CK is a high-level signal, the first scan transistor GT1 and the third scan transistor GT3 are turned off, the signal of the first node G1 maintains to be a low-level signal, and the signal of the eighth scan transistor GT8 receives the low-level signal of the second power supply terminal VGL to maintain turned-on. Due to the bootstrap action of the second scan capacitor GC2, the fifth scan transistor GT5 is turned on, and the signal of the second clock signal terminal CB is written to the signal output terminal OUT. In addition, the signal of the first clock signal terminal CK is a high-level signal, the second scan transistor GT2 is turned on, and the signal of the first clock signal terminal CK is written to the second node G2, thus both the fourth scan transistor GT4 and the sixth scan transistor GT6 are turned off. The signal outputted by the signal output terminal OUT is a low-level signal in this stage.

In a third stage D3, the signal of the first clock signal terminal CK is a low-level signal, and the signals of the signal input terminal IN and the second clock signal terminal CB are high-level signals. The signal of the first clock signal terminal CK is a low-level signal, the first scan transistor GT1 and the third scan transistor GT3 are turned on, the signal of the signal input terminal IN is written to the first node G1, and the second scan transistor GT2 is turned off. Because the eighth scan transistor GT8 maintains turned-on, the signal of the first node G1 is written to the third node G3, and the fifth scan transistor GT5 is turned off. The signal of the second power supply terminal VGL is written to the second node G2, the fourth scan transistor GT4 and the sixth scan transistor GT6 are turned on, and the high-level signal of the third power supply terminal VGH is written to the signal output terminal OUT. The signal outputted by the signal output terminal OUT is a high-level signal in this stage.

In a fourth stage D4, the signal of the second clock signal terminal CB is a low-level signal, and the signals of the signal input terminal IN and the first clock signal terminal CK are high-level signals. The signal of the first clock signal terminal CK is a high-level signal, the first scan transistor GT1 and the third scan transistor GT3 are turned off, the first node G1 maintains to be a high-level signal of the previous stage, and the second scan transistor GT2 is turned off. Because the eighth scan transistor GT8 maintains turned-on, the signal of the first node G1 is written to the third node G3, and the fifth scan transistor GT5 is turned off. The second node G2 maintains to be a low-level signal, the fourth scan transistor GT4 and the sixth scan transistor GT6 are turned on, and the high-level signal of the third power supply terminal VGH is written to the signal output terminal OUT. The signal outputted by the signal output terminal OUT is a high-level signal in this stage.

After the fourth stage D4, the third and fourth stages of the scan shift register are performed alternately until the signal of the signal input terminal IN becomes a low-level signal.

Figure 11:
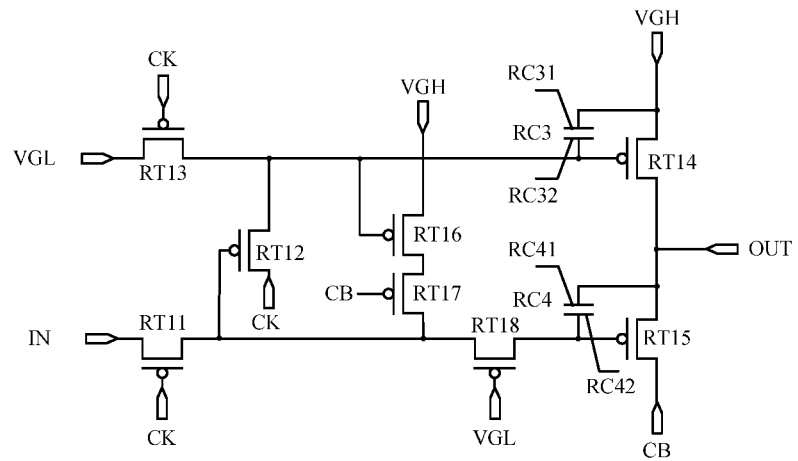
FIG. 11 is an equivalent circuit diagram of a second reset drive circuit.

In an exemplary embodiment, as shown in FIG. 4, the second reset drive circuit includes a plurality of cascaded second reset shift registers. FIG. 11 is an equivalent circuit diagram of a second reset drive circuit. As shown in FIG. 11, the second reset shift register includes an eleventh reset transistor RT11 to an eighteenth reset transistor RT18, a third reset capacitor RC3, and a fourth reset capacitor RC4, wherein the third reset capacitor RC3 includes a first electrode plate RC31 and a second electrode plate RC32, and the fourth reset capacitor RC4 includes a first electrode plate RC41 and a second electrode plate RC42.

In an exemplary embodiment, a control electrode of the eleventh reset transistor RT11 is connected to the first clock signal terminal CK, a first electrode of the eleventh reset transistor RT11 is connected to the signal input terminal IN, and a second electrode of the eleventh reset transistor RT11 is connected to the first node R1. A control electrode of the twelfth reset transistor RT12 is connected to the first node R1, a first electrode of the twelfth reset transistor RT12 is connected to the second node R2, and a second electrode of the twelfth reset transistor RT12 is connected to the first clock signal terminal CK. A control electrode of the thirteenth reset transistor RT13 is connected to the first clock signal terminal CK, a first electrode of the thirteenth reset transistor RT13 is connected to the second power supply terminal VGL, and a second electrode of the thirteenth reset transistor RT13 is connected to the second node R2. A control electrode of the fourteenth reset transistor RT14 is connected to the second node R2, a first electrode of the fourteenth reset transistor RT14 is connected to the first power supply terminal VGH, and a second electrode of the fourteenth reset transistor RT14 is connected to the signal output terminal OUT. A control electrode of the fifteenth reset transistor RT15 is connected to a third node R3, a first electrode of the fifteenth reset transistor RT15 is connected to the signal output terminal OUT, and a second electrode of the fifteenth reset transistor RT15 is connected to the second clock signal terminal CB. A control electrode of the sixteenth reset transistor RT16 is connected to the second node R2, a first electrode of the sixteenth reset transistor RT16 is connected to the first power supply terminal VGH, and a second electrode of the sixteenth reset transistor RT16 is connected to a first electrode of the seventeenth reset transistor RT17. A control electrode of the seventeenth reset transistor RT17 is connected to the second clock signal terminal CB, and a second electrode of the seventeenth reset transistor RT17 is connected to the first node R1. A control electrode of the eighteenth reset transistor RT18 is connected to the second power supply terminal VGL, a first electrode of the eighteenth reset transistor RT18 is connected to the first node R1, and a second electrode of the eighteenth reset transistor RT18 is connected to the third node R3. A first electrode plate RC31 of the third reset capacitor RC3 is connected to the first power supply terminal VGH, and a second electrode plate RC32 of the third reset capacitor RC3 is connected to the second node R2. A first electrode plate RC41 of the fourth reset capacitor RC4 is connected to the signal output terminal OUT, and a second electrode plate RC42 of the fourth reset capacitor RC4 is connected to the third node R3.

In an exemplary embodiment, the first power supply terminal VGH may continuously provide a high-level signal, and the second power supply terminal VGL may continuously provide a low-level signal.

In an exemplary embodiment, the eleventh reset transistor RT11 to the eighteenth reset transistor RT18 may be P-type transistors or N-type transistors. Use of the same type of transistors in the reset drive circuit may simplify process flows, decrease process difficulties of the display panel, and improve yield of the products.

In an exemplary embodiment, a signal input terminal of a second reset shift register of a first stage is connected with a second reset initial signal line RSTV2, and a signal output terminal of a second reset shift register of an i-th stage is connected with a signal input terminal of a second reset shift register of an (i+1)-th stage. A first power supply terminal of a second reset shift register of each stage is connected with the fourth high-level signal line VGH4. A second power supply terminal of a second reset shift register of each stage is connected with the fourth low-level signal line VGL4. First clock signal terminals of second reset shift registers of odd-numbered stages are connected with the third reset clock line RCK3, second clock signal terminals of second reset shift registers of odd-numbered stages are connected with the fourth reset clock line RCK4, first clock signal terminals of second reset shift registers of even-numbered stages are connected with the fourth reset clock line RCK4, and second clock signal terminals of second reset shift registers of even-numbered stages are connected with the third reset clock line RCK3.

Figure 12:
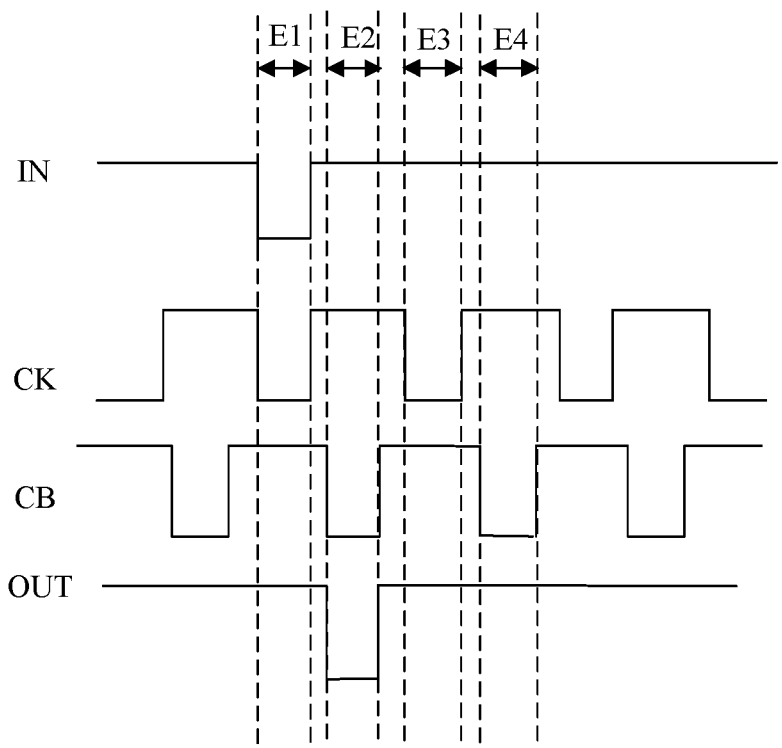
FIG. 12 is a signal timing diagram of the second reset shift register provided in FIG. 11.

FIG. 12 is a signal timing diagram of the second reset shift register provided in FIG. 11. FIG. 12 is illustrated by taking the eleventh reset transistor RT11 to the eighteenth reset transistor RT18 being P-type transistors as an example. As shown in FIG. 12, a working process of the second reset shift register in accordance with an exemplary embodiment may include the following stages.

In a first stage E1, the signals of the signal input terminal IN and the first clock signal terminal CK are low-level signals, and the signal of the second clock signal terminal CB is a high-level signal. The signal of the first clock signal terminal CK is a low-level signal, the eleventh reset transistor RT11 and the thirteenth reset transistor RT13 are turned on, and the signal of the eighteenth reset transistor RT18 receives a low-level signal of the second power supply terminal VGL to maintain turned-on. The signal of the signal input terminal IN is written to the first node R1, the signal of the first node R1 is written to the third node R3, the fifteenth reset transistor RT15 is turned on, and the signal of the second clock signal terminal CB is transmitted to the signal output terminal OUT via the fifteenth reset transistor RT15. In addition, the low-level signal of the second power supply terminal VGL is written to the second node R2, the fourteenth reset transistor RT14 and the sixteenth reset transistor RT16 are turned on, and the high-level signal of the first power supply terminal VGH is written to the signal output terminal OUT. Because the signal of the second clock signal terminal CB is a high-level signal, the seventeenth reset transistor RT17 is turned off. The signal outputted by the signal output terminal OUT is a high-level signal in this stage.

In a second stage E2, the signals of the signal input terminal IN and the first clock signal terminal CK are high-level signals, and the signal of the second clock signal terminal CB is a low-level signal. The signal of the first clock signal terminal CK is a high-level signal, the eleventh reset transistor RT11 and the thirteenth reset transistor RT13 are turned off, the signal of the first node R1 maintains to be a low-level signal, and the signal of the eighth reset transistor RT18 receives a low-level signal of the second power supply terminal VGL to maintain turned-on. Due to the bootstrap action of the fourth reset capacitor RC4, the fifteenth reset transistor RT15 is turned on, and the signal of the second clock signal terminal CB is written to the signal output terminal OUT. In addition, the signal of the first clock signal terminal CK is a high-level signal, the twelfth reset transistor RT12 is turned on, and the signal of the first clock signal terminal CK is written to the second node R2, thus both the fourteenth reset transistor RT14 and the sixteenth reset transistor RT16 are turned off. The signal outputted by the signal output terminal OUT is a low-level signal in this stage.

In a third stage E3, the signal of the first clock signal terminal CK is a low-level signal, and the signals of the signal input terminal and the second clock signal terminal CB are high-level signals. The signal of the first clock signal terminal CK is a low-level signal, the eleventh reset transistor RT11 and the thirteenth reset transistor RT13 are turned on, the signal of the signal input terminal IN is written to the first node R1, and the twelfth reset transistor RT12 is turned off. Because the eighteenth reset transistor RT18 maintains turned-on, the signal of the first node R1 is written to the third node R3, and the fifteenth reset transistor RT15 is turned off. The signal of the second power supply terminal VGL is written to the second node R2, the fourteenth reset transistor RT14 and the sixteenth reset transistor RT16 are turned on, and the high-level signal of the third power supply terminal VGH is written to the signal output terminal OUT. The signal outputted by the signal output terminal OUT is a high-level signal in this stage.

In a fourth stage E4, the signal of the second clock signal terminal CB is a low-level signal, and the signals of the signal input terminal IN and the first clock signal terminal CK are high-level signals. The signal of the first clock signal terminal CK is a high-level signal, the eleventh reset transistor RT11 and the thirteenth reset transistor RT13 are turned off, the first node R1 maintains to be a high-level signal of the previous stage, and the twelfth reset transistor RT12 is turned off. Because the eighteenth reset transistor RT18 maintains turned-on, the signal of the first node R1 is written to the third node R3, and the fifteenth reset transistor RT15 is turned off. The second node R2 maintains to be a low-level signal, the fourteenth reset transistor RT14 and the sixteenth reset transistor RT16 are turned on, and the high-level signal of the third power supply terminal VGH is written to the signal output terminal OUT. The signal outputted by the signal output terminal OUT is a high-level signal in this stage.

After the fourth stage E4, the third and fourth stages of the second reset shift register are performed alternately until the signal of the signal input terminal IN becomes a low-level signal.

In an exemplary embodiment, the scan initial signal line GSTV may include a first sub-scan initial signal line GSTV_1 and a second sub-scan initial signal line GSTV_2 arranged in different layers and connected to each other.

In an exemplary embodiment, an orthographic projection of the first sub-scan initial signal line GSTV_1 on the substrate is at least partially overlapped with an orthographic projection of the second sub-scan initial signal line GSTV_2 on the substrate.

In an exemplary embodiment, the first scan clock line GCK1 may include a first sub-scan clock line GCK1_1 and a second sub-scan clock line GCK1_2 arranged in different layers and connected to each other.

In an exemplary embodiment, an orthographic projection of the first sub-scan clock line GCK1_1 on the substrate is at least partially overlapped with an orthographic projection of the second sub-scan clock line GCK1_2 on the substrate.

In an exemplary embodiment, the second scan clock line GCK2 may include a third sub-scan clock line GCK2_1 and a fourth sub-scan clock line GCK2_2 arranged in different layers and connected to each other.

In an exemplary embodiment, an orthographic projection of the third sub-scan clock line GCK2_1 on the substrate is at least partially overlapped with an orthographic projection of the fourth sub-scan clock line GCK2_2 on the substrate.

In an exemplary embodiment, the first reset initial signal line RSTV1 may include a first sub-reset initial signal line RSTV1_1 and a second sub-reset initial signal line RSTV1_2 arranged in different layers and connected to each other.

In an exemplary embodiment, an orthographic projection of the first sub-reset initial signal line RSTV1_1 on the substrate is at least partially overlapped with an orthographic projection of the second sub-reset initial signal line RSTV1_2 on the substrate.

In an exemplary embodiment, the first reset clock line RCK1 may include a first sub-reset clock line RCK1_1 and a second sub-reset clock line RCK1_2 arranged in different layers and connected to each other.

In an exemplary embodiment, an orthographic projection of the first sub-reset clock line RCK1_1 on the substrate is at least partially overlapped with an orthographic projection of the second sub-reset clock line RCK1_2 on the substrate.

In an exemplary embodiment, the second reset clock line RCK2 may include a third sub-reset clock line RCK2_1 and a fourth sub-reset clock line RCK2_2 arranged in different layers and connected to each other.

In an exemplary embodiment, an orthographic projection of the third sub-reset clock line RCK2_1 on the substrate is at least partially overlapped with an orthographic projection of the fourth sub-reset clock line RCK2_2 on the substrate.

In an exemplary embodiment, the second reset initial signal line RSTV2 may include a third sub-reset initial signal line RSTV2_1 and a fourth sub-reset initial signal line RSTV2_2 arranged in different layers and connected to each other.

In an exemplary embodiment, an orthographic projection of the third sub-reset initial signal line RSTV2_1 on the substrate is at least partially overlapped with an orthographic projection of the fourth sub-reset initial signal line RSTV2_2 on the substrate.

In an exemplary embodiment, the third reset clock line ECK3 may include a fifth sub-reset clock line RCK3_1 and a sixth sub-scan clock line RCK3_2 arranged in different layers and connected to each other.

In an exemplary embodiment, an orthographic projection of the fifth sub-reset clock line RCK3_1 on the substrate is at least partially overlapped with an orthographic projection of the sixth sub-scan clock line RCK3_2 on the substrate.

In an exemplary embodiment, the fourth reset clock line RCK4 may include a seventh sub-reset clock line RCK4_1 and an eighth sub-scan clock line RCK4_2 arranged in different layers and connected to each other.

In an exemplary embodiment, an orthographic projection of the seventh sub-reset clock line RCK4_1 on the substrate is at least partially overlapped with an orthographic projection of the eighth sub-scan clock line RCK4_2 on the substrate.

In an exemplary embodiment, the non-display region is further provided with first to fourteenth connection electrodes, wherein the first connection electrode to the sixth connection electrode are arranged in the same layer, the seventh connection electrode to the ninth connection electrode are arranged in the same layer, and the tenth connection electrode to the fourteenth connection electrode are arranged in the same layer.

In an exemplary embodiment, the first connection electrode is connected to the second high-level signal line, the second connection electrode is respectively connected to the signal output terminal of the light emitting shift register and the tenth connection electrode, the third connection electrode is connected to the third high-level signal line, the fourth connection electrode is respectively connected to the signal output terminal of the first reset shift register and the eleventh connection electrode, the fifth connection electrode is respectively connected to the signal output terminal of the scan drive circuit and the thirteenth connection electrode, the sixth connection electrode is respectively connected to the twelfth connection electrode and the fourteenth connection electrode, the seventh connection electrode is respectively connected to the tenth connection electrode and the twelfth connection electrode, the eighth connection electrode is respectively connected to the signal output terminal of the second reset shift register and the second reset signal line, the ninth connection electrode is respectively connected to the eleventh connection electrode and the first reset signal line, the thirteenth connection electrode is connected with the scan signal line, and the fourteen connection electrode is connected with the light emitting signal line.

In an exemplary embodiment, the display panel may further include a drive structure layer and a light emitting structure layer which are sequentially stacked on the substrate. The drive structure layer includes an active layer, a first insulation layer, a first conductive layer, a second insulation layer, a second conductive layer, a third insulation layer, a third conductive layer, a fourth insulation layer, a fourth conductive layer, a fifth insulation layer and a planarization layer which are sequentially stacked on the substrate.

Figure 13:
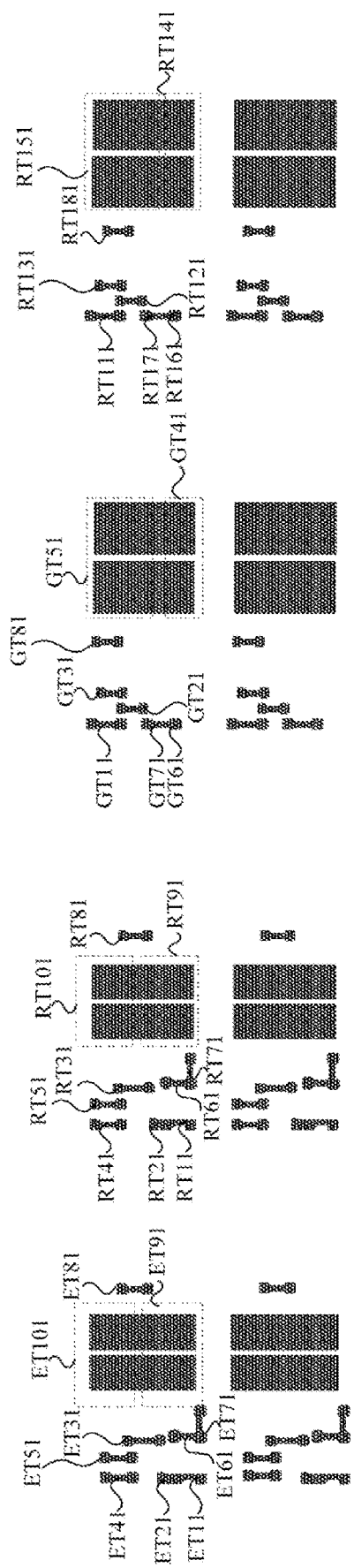
FIG. 13 is a schematic diagram of a film layer of an active layer of a display panel provide by an exemplary embodiment.
Figure 14:
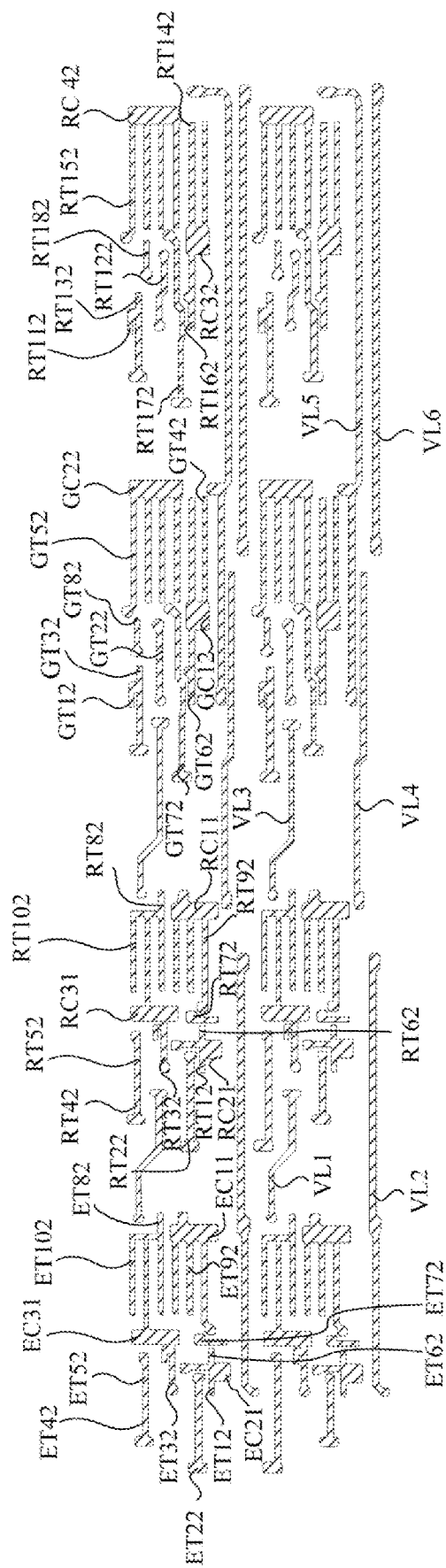
FIG. 14 is a schematic diagram of a film layer of a first conductive layer of a display panel provide by an exemplary embodiment.
Figure 15:
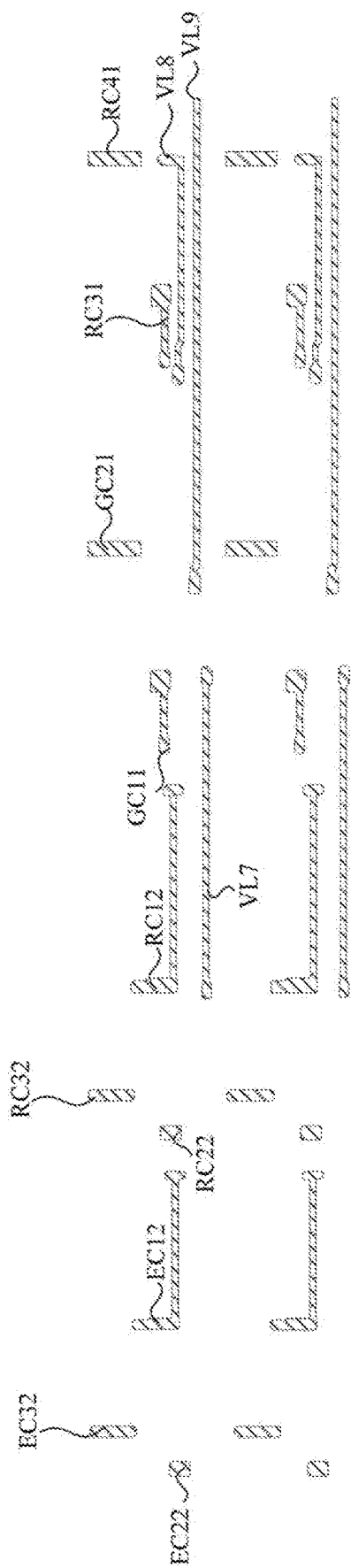
FIG. 15 is a schematic diagram of a film layer of a second conductive layer of a display panel provide by an exemplary embodiment.
Figure 16:
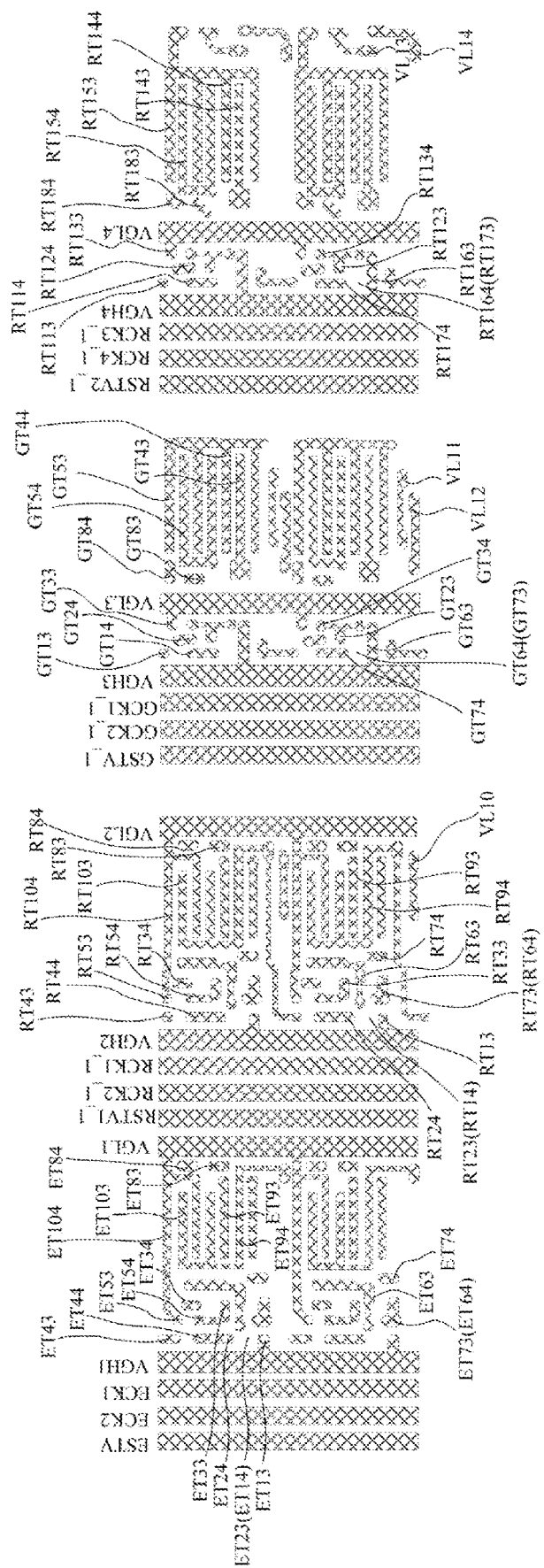
FIG. 16 is a schematic diagram of a film layer of a third conductive layer of a display panel provide by an exemplary embodiment.
Figure 17:
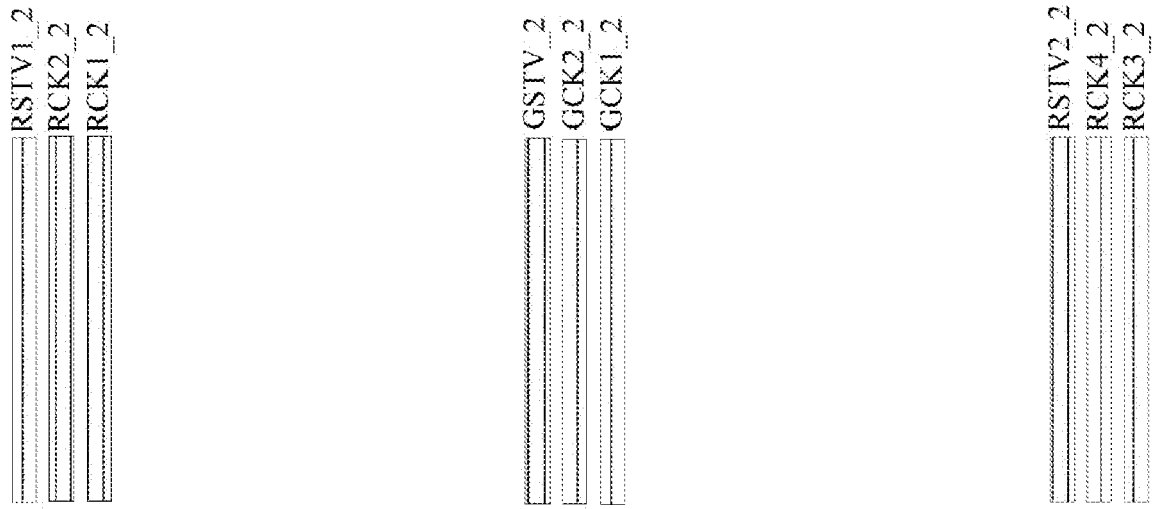
FIG. 17 is a schematic diagram of a film layer of a fourth conductive layer of a display panel provide by an exemplary embodiment.

FIG. 13 is a schematic diagram of a film layer of an active layer of a display panel provided by an exemplary embodiment, FIG. 14 is a schematic diagram of a film layer of a first conductive layer of a display panel provided by an exemplary embodiment, FIG. 15 is a schematic diagram of a film layer of a second conductive layer of the display panel provided by an exemplary embodiment, and FIG. 16 is a schematic diagram of a film layer of a third conductive layer of the display panel provided by an exemplary embodiment. FIG. 17 is a schematic diagram of a film layer of a fourth conductive layer of a display panel provided by an exemplary embodiment.

In an exemplary embodiment, as shown in FIG. 13, the active layer may include an active layer ET11 of the first light emitting transistor to an active layer ET101 of the tenth light emitting transistor, an active layer RT11 of the first reset transistor to an active layer RT101 of the tenth reset transistor, an active layer GT11 of the first scan transistor to an active layer GT81 of the eighth scan transistor, and an active layer RT111 of the eleventh reset transistor to an active layer RT181 of the eighteenth reset transistor.

In an exemplary embodiment, the active layer ET11 of the first light emitting transistor to the active layer ET21 of the second light emitting transistor form an integrated structure. The active layer ET61 of the sixth light emitting transistor and the active layer ET71 of the seventh light emitting transistor form an integrated structure. The active layer ET91 of the ninth light emitting transistor and the active layer ET101 of the tenth light emitting transistor form an integrated structure. The active layer ET11 of the first light emitting transistor, the active layer ET21 of the second light emitting transistor, the active layer ET31 of the third light emitting transistor, the active layer ET41 of the fourth light emitting transistor, the active layer ET51 of the fifth light emitting transistor, the active layer ET61 of the sixth light emitting transistor, the active layer ET81 of the eighth light emitting transistor, the active layer ET91 of the ninth light emitting transistor and the active layer ET101 of the tenth light emitting transistor extend along the first direction, and the active layer ET71 of the seventh light emitting transistor extends along the second direction.

In an exemplary embodiment, a conductive portion connected between the active layer of the first light emitting transistor and the active layer of the second light emitting transistor is reused as a second electrode ET14 of the first light emitting transistor and a first electrode ET23 of the second light emitting transistor.

In an exemplary embodiment, the active layer RT11 of the first reset transistor and the active layer RT21 of the second reset transistor form an integrated structure. The active layer RT61 of the sixth reset transistor and the active layer RT71 of the seventh reset transistor form an integrated structure. The active layer RT91 of the ninth reset transistor and the active layer RT101 of the tenth reset transistor form an integrated structure. The active layer RT11 of the first reset transistor, the active layer RT21 of the second reset transistor, the active layer RT31 of the third reset transistor, the active layer RT41 of the fourth reset transistor, the active layer RT51 of the fifth reset transistor, the active layer RT61 of the sixth reset transistor, the active layer RT81 of the eighth reset transistor, the active layer RT91 of the ninth reset transistor and the active layer RT101 of the tenth reset transistor extend along the first direction, and the active layer RT71 of the seventh reset transistor extends along the second direction.

In an exemplary embodiment, a conductive portion connected between the active layer of the first reset transistor and the active layer of the second reset transistor is reused as a second electrode RT14 of the first reset transistor and a first electrode RT23 of the second reset transistor.

In an exemplary embodiment, the active layer GT41 of the fourth scan transistor and the active layer GT51 of the fifth scan transistor form an integrated structure. The active layer GT61 of the sixth scan transistor and the active layer GT71 of the seventh scan transistor form an integrated structure. The active layer GT11 of the first scan transistor to the active layer GT81 of the eighth scan transistor extend along the first direction.

In an exemplary embodiment, a conductive portion connected between the active layer of the sixth scan transistor and the active layer of the seventh scan transistor is reused as a second electrode GT64 of the sixth scan transistor and a first electrode 73 of the seventh scan transistor.

In an exemplary embodiment, the active layer RT141 of the fourteenth reset transistor and the active layer RT151 of the fifteenth reset transistor form an integrated structure. The active layer RT161 of the sixteenth reset transistor and the active layer RT171 of the seventeenth reset transistor form an integrated structure. The active layer RT111 of the eleventh reset transistor to the active layer RT181 of the eighteenth reset transistor extend along the first direction.

In an exemplary embodiment, a conductive portion connected between the active layer of the sixteenth reset transistor and the active layer of the seventeenth reset transistor is reused as a second electrode RT164 of the sixteenth reset transistor and a first electrode RT173 of the seventeenth reset transistor.

In an exemplary embodiment, as shown in FIG. 14, the first conductive layer may include a control electrode ET12 of the first light emitting transistor to a control electrode ET102 of the tenth light emitting transistor, a first electrode plate EC11 of the first light emitting capacitor, a first electrode plate EC21 of the second light emitting capacitor, a first electrode plate EC31 of the third light emitting capacitor, a control electrode RT12 of the first reset transistor to a control electrode RT102 of the tenth reset transistor, a first electrode plate RC11 of the first reset capacitor, a first electrode plate RC21 of the second reset capacitor, a first electrode plate RC31 of the third reset capacitor, a control electrode GT12 of the first scan transistor to a control electrode GT82 of the eighth scan transistor, a second electrode plate GC12 of the first scan capacitor, a second electrode plate GC22 of the second scan capacitor, a control electrode RT112 of the eleventh reset transistor to a control electrode RT182 of the eighteenth reset transistor, and a second electrode plate RC32 of the third reset capacitor and a second electrode plate RC42 of the fourth reset capacitor.

In an exemplary embodiment, the control electrode ET42 of the fourth light emitting transistor and the control electrode ET52 of the fifth light emitting transistor form an integrated structure. The control electrode ET32 of the third light emitting transistor, the first electrode EC31 of the third light emitting capacitor, the control electrode ET102 of the tenth light emitting transistor, and the control electrode ET82 of the eighth light emitting transistor form an integrated structure. The control electrode ET12 of the first light emitting transistor, the first electrode EC21 of the second light emitting capacitor, and the control electrode ET62 of the sixth light emitting transistor form an integrated structure. The control electrode ET92 of the ninth light emitting transistor and the first electrode plate EC11 of the first light emitting capacitor form an integrated structure.

In an exemplary embodiment, the control electrode RT42 of the fourth reset transistor and the control electrode RT52 of the fifth reset transistor form an integrated structure. The control electrode RT32 of the third reset transistor, the first electrode plate RC31 of the third reset capacitor, the control electrode RT102 of the tenth reset transistor, and the control electrode RT82 of the eighth reset transistor form an integrated structure. The control electrode RT12 of the first reset transistor, the first electrode plate RC21 of the second reset capacitor, and the control electrode RT62 of the sixth reset transistor form an integrated structure. The control electrode RT92 of the ninth reset transistor and the first electrode plate RC11 of the first reset capacitor form an integrated structure.

In an exemplary embodiment, the control electrode GT12 of the first scan transistor and the control electrode GT32 of the third scan transistor form an integrated structure. The control electrode GT42 of the fourth scan transistor, the control electrode GT62 of the sixth scan transistor and the second electrode plate GC12 of the first scan capacitor form an integrated structure. The control electrode GT52 of the fifth scan transistor and the second electrode plate GC22 of the second scan capacitor form an integrated structure.

In an exemplary embodiment, the control electrode RT112 of the eleventh reset transistor and the control electrode RT132 of the thirteenth reset transistor form an integrated structure. The control electrode RT142 of the fourteenth reset transistor, the control electrode RT142 of the fourteenth reset transistor and the second electrode plate RC32 of the third reset capacitor form an integrated structure. The control electrode RT152 of the fifteenth reset transistor and the second electrode RC42 of the fourth reset capacitor form an integrated structure.

In an exemplary embodiment, the first conductive layer may further include a first connection electrode VL1, a second connection electrode VL2, a third connection electrode VL3, a fourth connection electrode VL4, and a fifth connection electrode VL5 and a sixth connection electrode VL6 that extend along the second direction.

In an exemplary embodiment, as shown in FIG. 15, the second conductive layer may include a first electrode plate EC12 of the first light emitting capacitor, a second electrode plate EC22 of the second light emitting capacitor, a first electrode plate EC32 of the third light emitting capacitor, a second electrode plate RC12 of the first reset capacitor, a first electrode plate RC22 of the second reset capacitor, a second electrode plate RC32 of the third reset capacitor, a first electrode plate GC11 of the first scan capacitor, a second electrode plate GC21 of the second scan capacitor, a second electrode plate RC31 of the third reset capacitor, and a second electrode plate RC41 of the fourth reset capacitor.

In an exemplary embodiment, as shown in FIG. 15, the second conductive layer may further include a seventh connection electrode VL7, an eighth connection electrode VL8, and a ninth connection electrode VL9 that extend along the second direction.

In an exemplary embodiment, as shown in FIG. 16, the third conductive layer may include a tenth connection electrode VL10 to a fourteenth connection electrode VL14, a light emitting initial signal line ESTV, a second light emitting clock line ECK2, a first light emitting clock line ECK1, a first high-level signal line VGH1, a first low-level signal line VGL1, a first sub-reset initial signal line RSTV1_1, a third sub-reset clock line RCK2_1, a first sub-reset clock line RCK1_1, a second high-level signal line VGH2, a second low-level signal line VGL2, a first sub-scan initial signal line GSTV1, a third sub-scan clock line GCK2_1, a first sub-scan clock line GCK1_1, a third high-level signal line VGH3, a third low-level signal line VGL3, a third sub-reset initial signal line RSTV2_1, a fifth sub-reset clock line RCK3_1, a seventh sub-reset clock line RCK4_1, a fourth high-level signal line VGH4, a fourth low-level signal line VGL4, a first electrode ET13 of the first light emitting transistor, a second electrode ET24 of the second light emitting transistor, a first electrode ET33 and a second electrode ET34 of the third light emitting transistor, a first electrode ET43 and a second electrode ET44 of the fourth light emitting transistor, a first electrode ET53 and a second electrode ET54 of the fifth light emitting transistor, a first electrode ET63 and a second electrode ET64 of the sixth light emitting transistor, a first electrode ET73 and a second electrode ET74 of the seventh light emitting transistor, a first electrode ET83 and a second electrode ET84 of the eighth light emitting transistor, a first electrode ET93 and a second electrode ET94 of the ninth light emitting transistor, a first electrode ET103 and a second electrode ET104 of the tenth light emitting transistor, a first electrode RT13 of the first reset transistor, a second electrode RT24 of the second reset transistor, a first electrode RT33 and a second electrode RT34 of the third reset transistor, a first electrode RT43 and a second electrode RT44 of the fourth reset transistor, a first electrode RT53 and a second electrode RT54 of the fifth reset transistor, a first electrode RT63 and a second electrode RT64 of the sixth reset transistor, a first electrode RT73 and a second electrode RT74 of the seventh reset transistor, a first electrode RT83 and a second electrode RT84 of the eighth reset transistor, a first electrode RT93 and a second electrode RT94 of the ninth reset transistor, a first electrode RT103 and a second electrode RT104 of the tenth reset transistor, a first electrode GT13 and a second electrode GT14 of the first scan transistor, a first electrode GT23 and a second electrode GT24 of the second scan transistor, a first electrode GT33 and a second electrode GT34 of the third scan transistor, a first electrode GT43 and a second electrode GT44 of the fourth scan transistor, a first electrode GT53 and a second electrode GT54 of the fifth scan transistor, a first electrode GT63 of the sixth scan transistor, a second electrode GT74 of the seventh scan transistor, a first electrode GT83 and a second electrode GT84 of the eighth scan transistor, a first electrode RT113 and a second electrode RT114 of the eleventh reset transistor, a first electrode RT123 and a second electrode RT124 of the twelfth reset transistor, a first electrode RT133 and a second electrode RT134 of the thirteenth reset transistor, a first electrode RT143 and a second electrode RT144 of the fourteenth reset transistor, a first electrode RT153 and a second electrode RT154 of the fifteenth reset transistor, a first electrode RT163 of the sixteenth reset transistor, a second electrode RT174 of the seventeenth reset transistor, and a first electrode RT183 and a second electrode RT184 of the eighteenth reset transistor.

In an exemplary embodiment, the second electrode ET24 of the second light emitting transistor and the second electrode ET44 of the fourth light emitting transistor form an integrated structure. The first high-level signal line VGH1 and the first electrode ET13 of the first light emitting transistor form an integrated structure. The second electrode ET64 of the sixth light emitting transistor and the first electrode ET73 of the seventh light emitting transistor form an integrated structure. The first electrode ET53 of the fifth light emitting transistor, the second electrode ET104 of the tenth light emitting transistor and the first low-level signal line VGL1 form an integrated structure. The first electrode ET33 of the third light emitting transistor and the second electrode ET54 of the fifth light emitting transistor form an integrated structure. The second electrode ET94 of the ninth light emitting transistor and the first electrode ET103 of the tenth light emitting transistor form an integrated structure.

In an exemplary embodiment, the second electrode RT24 of the second reset transistor and the second electrode RT44 of the fourth reset transistor form an integrated structure. The second high-level signal line VGH2 and the first electrode RT13 of the first reset transistor form an integrated structure. The second electrode RT64 of the sixth reset transistor and the first electrode RT73 of the seventh reset transistor form an integrated structure. The first electrode RT53 of the fifth reset transistor, the second electrode RT104 of the tenth reset transistor, and the second low-level signal line VGL2 form an integrated structure. The first electrode RT33 of the third reset transistor and the second electrode RT54 of the fifth reset transistor form an integrated structure.

The second electrode RT94 of the ninth reset transistor and the first electrode RT103 of the tenth reset transistor form an integrated structure.

In an exemplary embodiment, the second electrode GT14 of the first scan transistor and the second electrode GT74 of the seventh scan transistor form an integrated structure. The first electrode GT33 of the third scan transistor and the third low-level signal line VGL3 form an integrated structure. The first electrode GT63 of the sixth scan transistor and the third high-level signal line VGH3 form an integrated structure. The first electrode GT23 of the second scan transistor and the second electrode GT34 of the third scan transistor form an integrated structure. The second electrode GT44 of the fourth scan transistor and the first electrode GT53 of the fifth scan transistor form an integrated structure.

In an exemplary embodiment, the second electrode RT114 of the eleventh reset transistor and the second electrode RT174 of the seventeenth reset transistor form an integrated structure. The first electrode RT133 of the thirteenth reset transistor and the fourth low-level signal line VGL4 form an integrated structure. The first electrode RT163 of the sixth reset transistor and the fourth high-level signal line VGH4 form an integrated structure. The first electrode RT123 of the twelfth reset transistor and the second electrode RT134 of the thirteenth reset transistor form an integrated structure. The second electrode RT144 of the fourteenth reset transistor and the first electrode RT153 of the fifteenth reset transistor form an integrated structure.

In an exemplary embodiment, as shown in FIG. 17, the fourth conductive layer may include a second sub-reset initial signal line RSTV1_2, a fourth sub-reset clock line RCK2_2, a second sub-reset clock line RCK1_2, a second sub-scan initial signal line GSTV_2, a fourth sub-scan clock line GCK2_2, a second sub-scan clock line GCK1_2, a fourth sub-reset initial signal line RSTV2_2, an eighth sub-scan clock line RCK4_2, and a sixth sub-scan clock line RCK3_2.

Figure 18:
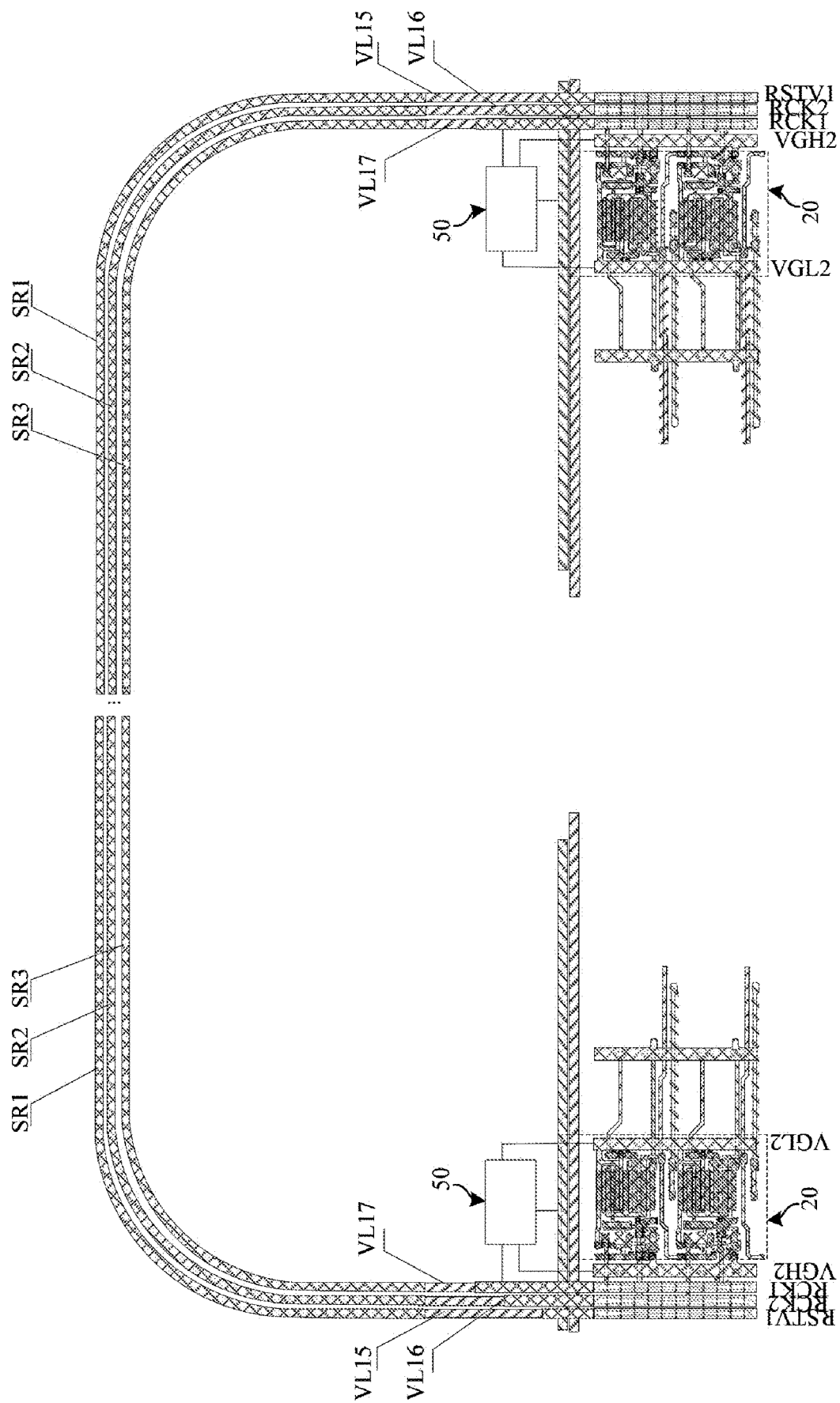
FIG. 18 is a schematic diagram of a portion of a display panel provide by an exemplary embodiment.

FIG. 18 is a schematic diagram of a portion of a display panel provided by an exemplary embodiment. As shown in FIG. 18, the display panel provided by the exemplary embodiment may further include a fifteenth connection electrode VL15 to a seventeenth connection electrode VL17 located in the first conductive layer, and a first connection line SR1, a second connection line SR2 and a third connection line SR3 located in the third conductive layer.

In an exemplary embodiment, the fifteenth connection electrode VL15 is connected to the first sub-reset initial signal line of the first reset initial signal line RSTV1 and the first connection line SR1 through the vias on the second insulation layer and the third insulation layer, respectively.

In an exemplary embodiment, the sixteenth connection electrode VL16 is connected to the third sub-reset clock line of the second reset clock line RCK2 and the second connection line SR2 through the vias on the second insulation layer and the third insulation layer, respectively.

In an exemplary embodiment, the seventeenth connection electrode VL17 is connected to the first sub-reset clock line of the first reset clock line RCK1 and the third connection line SR3 through the vias on the second insulation layer and the third insulation layer, respectively.

In an exemplary embodiment, the display panel may further include an electrostatic discharge circuit 50, a third power supply line SL1 located in the second conductive layer, and a fourth power supply line SL2 located in the first conductive layer.

In an exemplary embodiment, the third power supply line SL1 and the fourth power supply line SL2 continuously provide a voltage stabilization signal.

In an exemplary embodiment, the electrostatic discharge circuit may be connected to a second high-level signal line, a second low-level signal line, a third power supply line SL1 and a first sub-reset clock line of a first reset clock line RCK1.

In an exemplary embodiment, damage due to discharge breakdown caused by static electricity accumulation in the signal line may be prevented by arrangement of the electrostatic discharge circuit, so as to release the static electricity accumulated in the signal line and achieve the protection of the signal line.

In an exemplary embodiment, there may be a plurality of electrostatic discharge circuits that respectively protect the signal lines.

In an exemplary embodiment, the electrostatic discharge circuit may include two discharge transistors, wherein one electrode of each discharge transistor is connected to its own gate, thereby forming an equivalent diode connection. A signal line to be protected is connected between the two "diodes", and another two terminals of the two "diodes" are respectively connected to one high-level signal line and one low-level signal line. Therefore, when an instantaneous high voltage (e.g., 100V) occurs due to accumulation of positive charges in the signal line, one of the "diodes" is turned on to discharge the positive charges in the signal line, and when an instantaneous low voltage (e.g., −100V) occurs due to accumulation of negative charges in the signal line, the other of the "diodes" is turned on to discharge the negative charges in the signal line.

In an exemplary embodiment, the active layer may be a metal oxide layer. The metal oxide layer may be made of an oxide containing indium and tin, an oxide containing tungsten and indium, an oxide containing tungsten and indium and zinc, an oxide containing titanium and indium, an oxide containing titanium and indium and tin, an oxide containing indium and zinc, an oxide containing silicon and indium and tin, or an oxide containing indium or gallium and zinc, etc. The metal oxide layer may be a single layer, double layers or multi layers.

In an exemplary embodiment, the first conductive layer, the second conductive layer, the third conductive layer and the fourth conductive layer may be made of metal materials, such as any one or more of silver (Ag), copper (Cu), aluminum (Al) and molybdenum (Mo), or alloy materials of the above metals, such as aluminum neodymium alloy (AlNd) or molybdenum niobium alloy (MoNb), and may be a single-layer structure or a multi-layer composite structure such as Mo/Cu/Mo.

In an exemplary embodiment, the first insulation layer, the second insulation layer, the third insulation layer, the fourth insulation layer and the fifth insulation layer may be made of any one or more of Silicon Oxide (SiOx), Silicon Nitride (SiNx), and Silicon Oxynitride (SiON), and may be a single layer, a multi-layer, or a composite layer.

In an exemplary embodiment, the planarization layer may be made of an organic material, and the transparent conductive film may be made of indium tin oxide (ITO) or indium zinc oxide (IZO).

In an exemplary embodiment, the light emitting structure layer may include an anode, a pixel definition layer, an organic light emitting layer and a cathode. The anode is connected with a drain electrode of the drive transistor through a via, the organic light emitting layer is connected with the anode, the cathode is connected with the organic light emitting layer, and the organic light emitting layer emits light of a corresponding color under the drive of the anode and the cathode.

In an exemplary embodiment, the display panel may further include an encapsulation layer. Exemplarily, the encapsulation layer may include a first encapsulation layer, a second encapsulation layer, and a third encapsulation layer that are stacked. The first encapsulation layer and the third encapsulation layer may be made of an inorganic material, and the second encapsulation layer may be made of an organic material. The second encapsulation layer is disposed between the first encapsulation layer and the third encapsulation layer, so as to ensure that external water vapor cannot enter the light emitting device.

In an exemplary embodiment, the organic light emitting layer may include a Hole Injection Layer (HIL for short), a Hole Transport Layer (HTL for short), an Electron Block Layer (EBL for short), an Emitting Layer (EML for short), a Hole Block Layer (HBL for short), an Electron Transport Layer (ETL for short), and an Electron Injection Layer (EIL for short) that are stacked. In an exemplary embodiment, hole injection layers of all sub-pixels may be connected together to form a common layer, electron injection layers of all the sub-pixels may be connected together to form a common layer, hole transport layers of all the sub-pixels may be connected together to form a common layer, electron transport layers of all the sub-pixels may be connected together to form a common layer, hole block layers of all the sub-pixels may be connected together to form a common layer, emitting layers of adjacent sub-pixels may be overlapped slightly, or may be isolated from each other, and electron block layers of adjacent sub-pixels may be overlapped slightly, or may be isolated from each other.

In an exemplary embodiment, the display panel may further include other film layers, such as photo spacers, the present disclosure is not limited thereto.

FIG. 19 to FIG. 24 are schematic diagrams of a preparation process of a display panel according to an exemplary embodiment. A display panel according to an exemplary embodiment is described below with reference to FIG. 13, and FIG. 9 to FIG. 24.

(1) Forming an active layer on a substrate, which includes: depositing a semiconductor thin film on the substrate, and patterning the semiconductor thin film by a patterning process, to form the active layer. The active layer includes an active layer ET11 of the first light emitting transistor to an active layer ET101 of the tenth light emitting transistor, an active layer RT11 of the first reset transistor to an active layer RT101 of the tenth reset transistor, an active layer GT11 of the first scan transistor to an active layer GT81 of the eighth scan transistor, and an active layer RT111 of the eleventh reset transistor to an active layer RT181 of the eighteenth reset transistor, as show in FIG. 13.

In an exemplary embodiment, the active layer ET11 of the first light emitting transistor to the active layer ET21 of the second light emitting transistor form an integrated structure. The active layer ET61 of the sixth light emitting transistor and the active layer ET71 of the seventh light emitting transistor form an integrated structure. The active layer ET91 of the ninth light emitting transistor and the active layer ET101 of the tenth light emitting transistor form an integrated structure. The active layer ET11 of the first light emitting transistor, the active layer ET21 of the second light emitting transistor, the active layer ET31 of the third light emitting transistor, the active layer ET41 of the fourth light emitting transistor, the active layer ET51 of the fifth light emitting transistor, the active layer ET61 of the sixth light emitting transistor, the active layer ET81 of the eighth light emitting transistor, the active layer ET91 of the ninth light emitting transistor and the active layer ET101 of the tenth light emitting transistor extend along the first direction, and the active layer ET71 of the seventh light emitting transistor extends along the second direction.

In an exemplary embodiment, the active layer RT11 of the first reset transistor and the active layer RT21 of the second reset transistor form an integrated structure. The active layer RT61 of the sixth reset transistor and the active layer RT71 of the seventh reset transistor form an integrated structure. The active layer RT91 of the ninth reset transistor and the active layer RT101 of the tenth reset transistor form an integrated structure. The active layer RT11 of the first reset transistor, the active layer RT21 of the second reset transistor, the active layer RT31 of the third reset transistor, the active layer RT41 of the fourth reset transistor, the active layer RT51 of the fifth reset transistor, the active layer RT61 of the sixth reset transistor, the active layer RT81 of the eighth reset transistor, the active layer RT91 of the ninth reset transistor and the active layer RT101 of the tenth reset transistor extend along the first direction, and the active layer RT71 of the seventh reset transistor extends along the second direction.

In an exemplary embodiment, the active layer GT41 of the fourth scan transistor and the active layer GT51 of the fifth scan transistor form an integrated structure. The active layer GT61 of the sixth scan transistor and the active layer GT71 of the seventh scan transistor form an integrated structure. The active layer GT11 of the first scan transistor to the active layer GT81 of the eighth scan transistor extend along the first direction.

In an exemplary embodiment, the active layer RT141 of the fourteenth reset transistor and the active layer RT151 of the fifteenth reset transistor form an integrated structure. The active layer RT161 of the sixteenth reset transistor and the active layer RT171 of the seventeenth reset transistor form an integrated structure. The active layer RT111 of the eleventh reset transistor to the active layer RT181 of the eighteenth reset transistor extend along the first direction.

Figure 19:
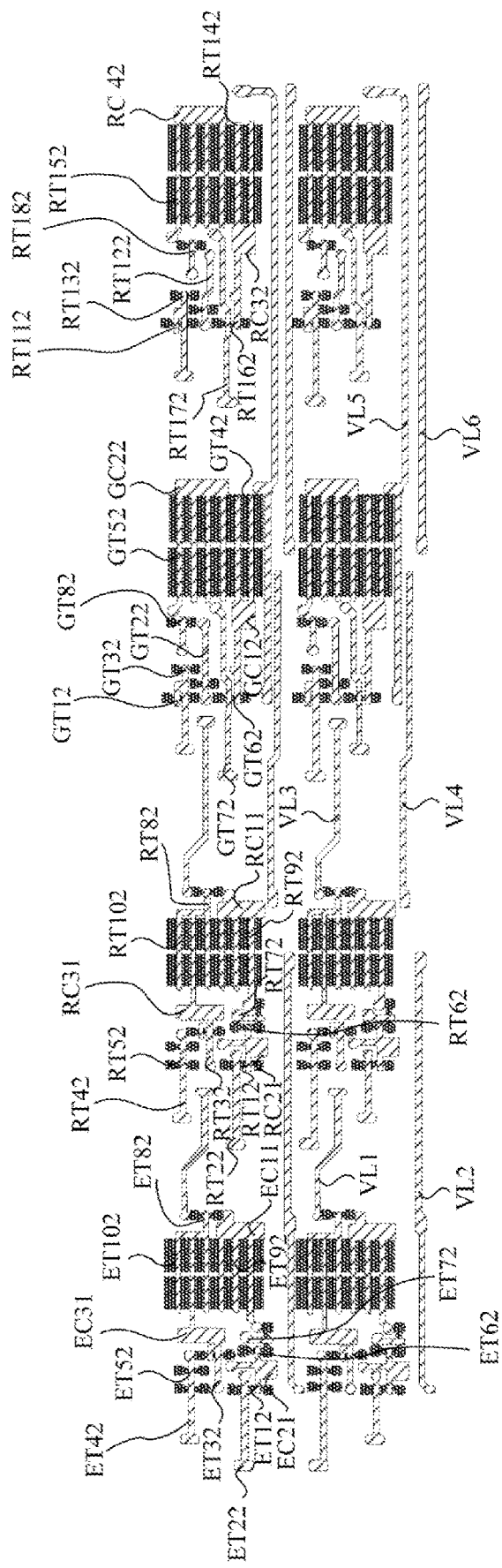
FIG. 19 is a schematic diagram after a first conductive layer is formed.

(2) Forming a first conductive layer, which includes depositing a first insulation thin film on a substrate on which an active layer is formed, patterning the first insulation thin film by a patterning process to form the first insulation layer, deposing a first metal thin film on the first insulation layer, and patterning the first metal thin film by a patterning process to form the first conductive layer. The first conductive layer includes a control electrode ET12 of the first light emitting transistor to a control electrode ET102 of the tenth light emitting transistor, a first electrode plate EC11 of the first light emitting capacitor, a first electrode plate EC21 of the second light emitting capacitor, a first electrode plate EC31 of the third light emitting capacitor, a control electrode RT12 of the first reset transistor to a control electrode RT102 of the tenth reset transistor, a first electrode plate RC11 of the first reset capacitor, a first electrode plate RC21 of the second reset capacitor, a first electrode plate RC31 of the third reset capacitor, a control electrode GT12 of the first scan transistor to a control electrode GT82 of the eighth scan transistor, a second electrode plate GC12 of the first scan capacitor, a second electrode plate GC22 of the second scan capacitor, a control electrode RT112 of the eleventh reset transistor to a control electrode RT182 of the eighteenth reset transistor, a second electrode plate RC32 of the third reset capacitor and a second electrode plate RC42 of the fourth reset capacitor, a first connection electrode VL1, a second connection electrode VL2, a third connection electrode VL3, a fourth connection electrode VL4, a fifth connection electrode VL5, the sixth connection electrode VL6, a fifteenth connection electrode, a sixteenth connection electrode, a seventeenth connection electrode and a fourth power supply line, as shown in FIG. 19, which is a schematic diagram after the first conductive layer is formed.

In an exemplary embodiment, the control electrode ET42 of the fourth light emitting transistor and the control electrode ET52 of the fifth light emitting transistor form an integrated structure. The control electrode ET32 of the third light emitting transistor, the first electrode EC31 of the third light emitting capacitor, the control electrode ET102 of the tenth light emitting transistor, and the control electrode ET82 of the eighth light emitting transistor form an integrated structure. The control electrode ET12 of the first light emitting transistor, the first electrode EC21 of the second light emitting capacitor, and the control electrode ET62 of the sixth light emitting transistor form an integrated structure. The control electrode ET92 of the ninth light emitting transistor and the first electrode plate EC11 of the first light emitting capacitor form an integrated structure.

In an exemplary embodiment, the control electrode RT42 of the fourth reset transistor and the control electrode RT52 of the fifth reset transistor form an integrated structure. The control electrode RT32 of the third reset transistor, the first electrode plate RC31 of the third reset capacitor, the control electrode RT102 of the tenth reset transistor, and the control electrode RT82 of the eighth reset transistor form an integrated structure. The control electrode RT12 of the first reset transistor, the first electrode plate RC21 of the second reset capacitor, and the control electrode RT62 of the sixth reset transistor form an integrated structure. The control electrode RT92 of the ninth reset transistor and the first electrode plate RC11 of the first reset capacitor form an integrated structure.

In an exemplary embodiment, the control electrode GT12 of the first scan transistor and the control electrode GT32 of the third scan transistor form an integrated structure. The control electrode GT42 of the fourth scan transistor, the control electrode GT62 of the sixth scan transistor and the second electrode plate GC12 of the first scan capacitor form an integrated structure. The control electrode GT52 of the fifth scan transistor and the second electrode plate GC22 of the second scan capacitor form an integrated structure.

In an exemplary embodiment, the control electrode RT112 of the eleventh reset transistor and the control electrode RT132 of the thirteenth reset transistor form an integrated structure. The control electrode RT142 of the fourteenth reset transistor, the control electrode RT142 of the fourteenth reset transistor and the second electrode plate RC32 of the third reset capacitor form an integrated structure. The control electrode RT152 of the fifteenth reset transistor and the second electrode RC42 of the fourth reset capacitor form an integrated structure.

Figure 20:
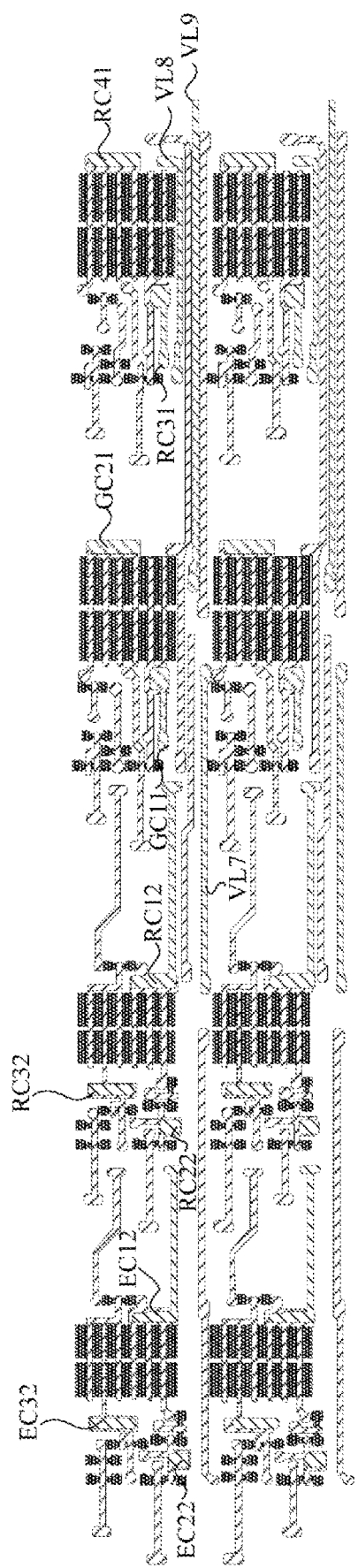
FIG. 20 is a schematic diagram after a second conductive layer is formed.

(3) Forming a second conductive layer, which includes depositing a second insulation thin film on a substrate on which the first conductive layer is formed, patterning the second insulation thin film by a pattern process to form a second insulation layer, depositing a second metal thin film on a substrate on which a second insulation layer is formed, and patterning the second metal thin film by a patterning process to form the second conductive layer. The second conductive layer includes a first electrode plate EC12 of the first light emitting capacitor, a second electrode plate EC22 of the second light emitting capacitor, a first electrode plate EC32 of the third light emitting capacitor, a second electrode plate RC12 of the first reset capacitor, a first electrode plate RC22 of the second reset capacitor, a second electrode plate RC32 of the third reset capacitor, a first electrode plate GC11 of the first scan capacitor, a second electrode plate GC21 of the second scan capacitor, a second electrode plate RC31 of the third reset capacitor, a second electrode plate RC41 of the fourth reset capacitor, a seventh connection electrode VL7, an eighth connection electrode VL8, a ninth connection electrode VL9 and a third power line, as shown in FIG. 20, which is a schematic diagram after the second conductive layer is formed.

Figure 21:
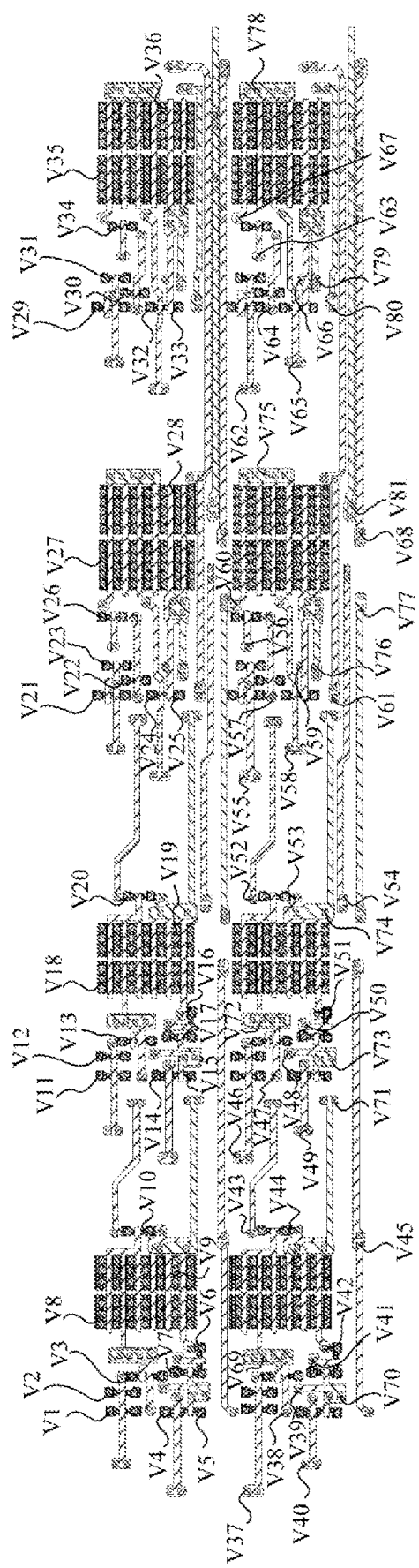
FIG. 21 is a schematic diagram after a third insulation layer is formed.

(4) Forming a third insulation layer, which includes depositing a third insulation thin film on the substrate on which the second conductive layer is formed, and patterning the third insulating thin film by a patterning process to form a third insulation layer, wherein the first insulation layer, the second insulation layer and the third insulation layer are provided with a first via V1 to a thirty-sixth via V36, the second insulation layer and the third insulation layer are provided with a thirty-seventh via V37 to a sixty-eighth via V68, and the third insulation layer is provided with a sixty-ninth via V69 to an eighty-first via V81, as shown in FIG. 21, which is a schematic diagram after the third insulation layer is formed.

In an exemplary embodiment, the first via V1 exposes the active layer of the fourth light emitting transistor, the second via V2 exposes the active layer of the fifth light emitting transistor, the third via V3 exposes the active layer of the third light emitting transistor, the fourth via V4 exposes the active layer of the second light emitting transistor, the fifth via V5 exposes the active layer of the first light emitting transistor, the sixth via V6 exposes the active layer of the seventh light emitting transistor, the seventh via V7 exposes the active layer of the sixth light emitting transistor, the eighth via V8 exposes the active layer of the tenth light emitting transistor, the ninth via V9 exposes the active layer of the ninth light emitting transistor, and the tenth via V10 exposes the active layer of the eighth light emitting transistor. The eleventh via V11 exposes the active layer of the fourth reset transistor, the twelfth via V12 exposes the active layer of the fifth reset transistor, the thirteenth via V13 exposes the active layer of the third reset transistor, the fourteenth via V14 exposes the active layer of the second reset transistor, the fifteenth via V15 exposes the active layer of the first reset transistor, the sixteenth via V16 exposes the active layer of the seventh reset transistor, the seventeenth via V17 exposes the active layer of the sixth reset transistor, the eighteenth via V18 exposes the active layer of the tenth reset transistor, the nineteenth via V19 exposes the active layer of the ninth reset transistor, and the twentieth via V20 exposes the active layer of the eighth reset transistor The twenty-first via V21 exposes the active layer of the first scan transistor, the twenty-second via V22 exposes the active layer of the second scan transistor, the twenty-third via V23 exposes the active layer of the third scan transistor, the twenty-fourth via V24 exposes the active layer of the seventh scan transistor, the twenty-fifth via V25 exposes the active layer of the sixth scan transistor, the twenty-sixth via V26 exposes the active layer of the eighth scan transistor, the twenty-seventh via V27 exposes the active layer of the fifth scan transistor, and the twenty-eighth via V28 exposes the active layer of the fourth scan transistor. The twenty-ninth via V29 exposes the active layer of the eleventh reset transistor, the thirtieth via V30 exposes the active layer of the twelfth reset transistor, the thirty-first via V31 exposes the active layer of the thirteenth reset transistor, the thirty-second via V32 exposes the active layer of the seventeenth reset transistor, the thirty-third via V33 exposes the active layer of the sixteenth reset transistor, the thirty-fourth via V34 exposes the active layer of the eighteenth reset transistor, the thirty-fifth via V35 exposes the active layer of the fifteenth reset transistor, and the thirty-sixth via V36 exposes the active layer of the fourteenth reset transistor. The thirty-seventh via V37 exposes the control electrode of the fourth light emitting transistor, the thirty-eighth via V38 exposes the control electrode of the third light emitting transistor, the thirty-ninth via V39 exposes the control electrode of the first light emitting transistor, the fortieth via V40 exposes the control electrode of the second light emitting transistor, the forty-first via V41 exposes the control electrode of the seventh light emitting transistor, the forty-second via V42 exposes the control electrode of the ninth light emitting transistor, the forty-third via V43 exposes the first connection electrode VL1, the forty-fourth via V44 exposes the first electrode plate of the first light emitting capacitor, the forty-fifth via V45 exposes the second connection electrode VL2, and the forty-sixth via V46 exposes the control electrode of the fourth reset transistor. The forty-seventh via V47 exposes the control electrode of the third reset transistor, the forty-eighth via V48 exposes the control electrode of the first reset transistor, the forty-ninth 49th via V49 exposes the control electrode of the second reset transistor, the fiftieth via V50 exposes the control electrode of the seventh reset transistor, the fifty-first via V51 exposes the control electrode of the ninth reset transistor, the fifty-second via V52 exposes the third connection electrode VL3, the fifty-third via V53 exposes the first electrode plate of the first reset capacitor, and the fifty-fourth via V54 exposes the fourth connection electrode. The fifty-fifth via V55 exposes the control electrode of the first scan transistor, the fifty-sixth via V56 exposes the control electrode of the eighth scan transistor, the fifty-seventh via V57 exposes the control electrode of the second scan transistor, the fifty-eighth via V58 exposes the control electrode of the seventh scan transistor, the fifty-ninth via V59 exposes the control electrode of the sixth scan transistor, the sixtieth via V60 exposes the control electrode of the fifth scan transistor, and the sixty-first via V61 exposes the fifth connection electrode VL5. The sixty-second via V62 exposes the control electrode of the eleventh reset transistor, the sixty-third via V63 exposes the control electrode of the eighteenth reset transistor, the sixty-fourth via V64 exposes the control electrode of the twelfth reset transistor, the sixty-fifth via V65 exposes the control electrode of the seventeenth reset transistor, the sixty-sixth via V66 exposes the control electrode of the sixteenth reset transistor, the sixty-seventh via V67 exposes the control electrode of the fifteenth reset transistor, and the sixty-eighth via V68 exposes the sixth connection electrode VL6. The sixty-ninth via V69 exposes the second electrode plate of the third light emitting capacitor, the seventieth via V70 exposes the second electrode plate of the second light emitting capacitor, the seventy-first via V71 exposes the second electrode plate of the first light emitting capacitor, the seventy-second via V72 exposes the second electrode plate of the third reset capacitor, the seventy-third via V73 exposes the second electrode plate of the second reset capacitor, the seventy-fourth via V74 exposes the second electrode plate of the first reset capacitor, the seventy-fifth via V75 exposes the first electrode plate of the second scan capacitor, the seventy-sixth via V76 exposes the first electrode plate of the first scan capacitor, the seventy-seventh via V77 exposes the seventh connection electrode VL7, the seventy-eighth via V78 exposes the first electrode plate of the fourth reset capacitor, the seventy-ninth via V79 exposes the first electrode plate of the third reset capacitor, the eightieth via V80 exposes the eighth connection electrode, and the eighty-first via V81 exposes the ninth connection electrode.

Figure 22:
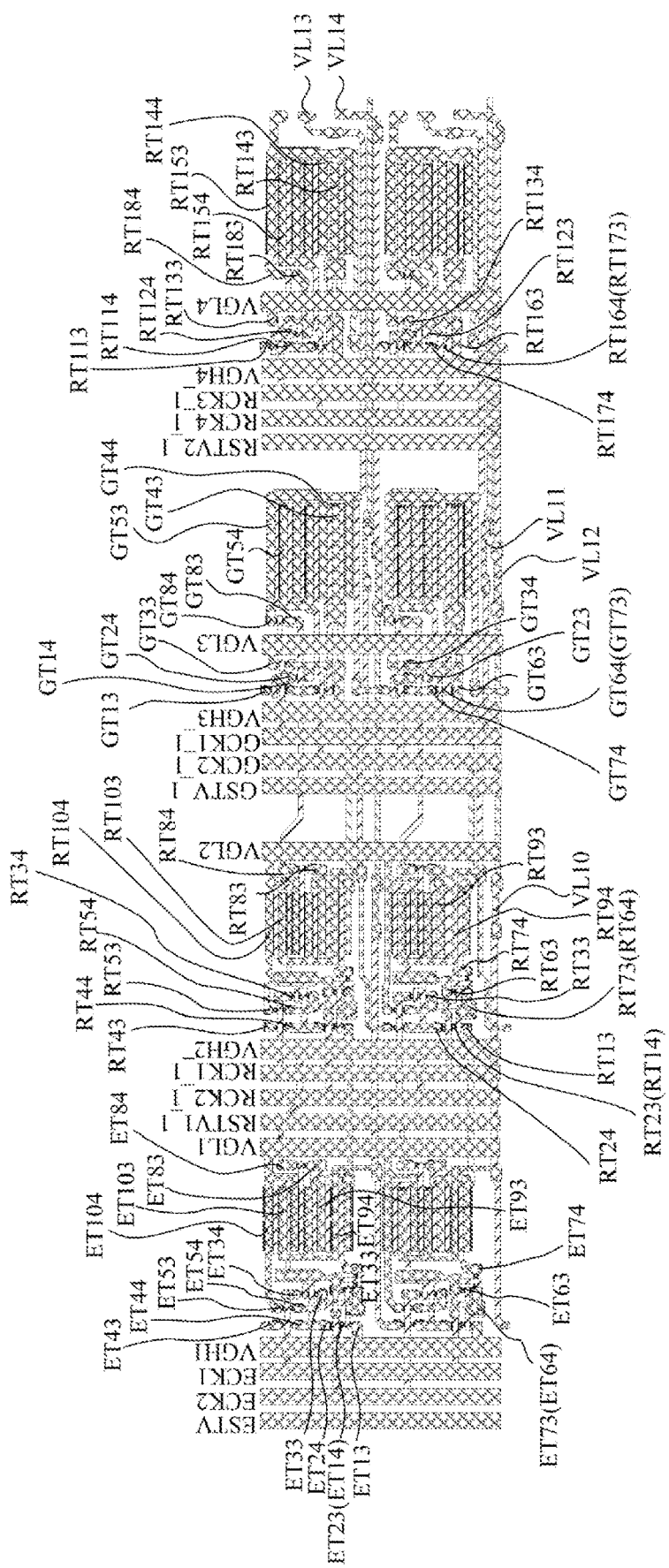
FIG. 22 is a schematic diagram after a third conductive layer is formed.

(5) Forming a third conductive layer, includes depositing a third metal thin film on the substrate on which the third insulation layer is formed, and patterning the third metal thin film by a patterning process to form the third conductive layer. The third conductive layer includes a tenth connection electrode VL10 to a fourteenth connection electrode VL14, a light emitting initial signal line ESTV, a second light emitting clock line ECK2, a first light emitting clock line ECK1, a first high-level signal line VGH1, a first low-level signal line VGL1, a first sub-reset initial signal line RSTV1_1, a third sub-reset clock line RCK2_1, a first sub-reset clock line RCK1_1, a second high-level signal line VGH2, a second low-level signal line VGL2, a first sub-scan initial signal line GSTV1, a third sub-scan clock line GCK2_1, a first sub-scan clock line GCK1_1, a third high-level signal line VGH3, a third low-level signal line VGL3, a third sub-reset initial signal line RSTV2_1, a fifth sub-reset clock line RCK3_1, a seventh sub-reset clock line RCK4_1, a fourth high-level signal line VGH4, a fourth low-level signal line VGL4, a first electrode ET13 of the first light emitting transistor, a second electrode ET24 of the second light emitting transistor, a first electrode ET33 and a second electrode ET34 of the third light emitting transistor, a first electrode ET43 and a second electrode ET44 of the fourth light emitting transistor, a first electrode ET53 and a second electrode ET54 of the fifth light emitting transistor, a first electrode ET63 and a second electrode ET64 of the sixth light emitting transistor, a first electrode ET73 and a second electrode ET74 of the seventh light emitting transistor, a first electrode ET83 and a second electrode ET84 of the eighth light emitting transistor, a first electrode ET93 and a second electrode ET94 of the ninth light emitting transistor, a first electrode ET103 and a second electrode ET104 of the tenth light emitting transistor, a first electrode RT13 of the first reset transistor, a second electrode RT24 of the second reset transistor, a first electrode RT33 and a second electrode RT34 of the third reset transistor, a first electrode RT43 and a second electrode RT44 of the fourth reset transistor, a first electrode RT53 and a second electrode RT54 of the fifth reset transistor, a first electrode RT63 and a second electrode RT64 of the sixth reset transistor, a first electrode RT73 and a second electrode RT74 of the seventh reset transistor, a first electrode RT83 and a second electrode RT84 of the eighth reset transistor, a first electrode RT93 and a second electrode RT94 of the ninth reset transistor, a first electrodes RT103 and a second electrode RT104 of the tenth reset transistor, a first electrode GT13 and a second electrode GT14 of the first scan transistor, a first electrode GT23 and a second electrode GT24 of the second scan transistor, a first electrode GT33 and a second electrode GT34 of the third scan transistor, a first electrode GT43 and a second electrode GT44 of the fourth scan transistor, a first electrode GT53 and a second electrode GT54 of the fifth scan transistor, a first electrode GT63 of the sixth scan transistor, a second electrode GT74 of the seventh scan transistor, a first electrode GT83 and a second electrode GT84 of the eighth scan transistor, a first electrode RT113 and a second electrode RT114 of the eleventh reset transistor, a first electrode RT123 and a second electrode RT124 of the twelfth reset transistor, a first electrode RT133 and a second electrode RT134 of the thirteenth reset transistor, a first electrode RT143 and a second electrode RT144 of the fourteenth reset transistor, a first electrode RT153 and a second electrode RT154 of the fifteenth reset transistor, a first electrode RT163 of the sixteenth reset transistor, a second electrode RT174 of the seventeenth reset transistor, and a first electrode RT183 and a second electrode RT184 of the eighteenth reset transistor, a first connection line, a second connection line, and a third connection line, as shown in FIG. 22, which is a schematic diagram after a third conductive layer is formed.

In an exemplary embodiment, the second electrode ET24 of the second light emitting transistor and the second electrode ET44 of the fourth light emitting transistor form an integrated structure. The first high-level signal line VGH1 and the first electrode ET13 of the first light emitting transistor form an integrated structure. The second electrode ET64 of the sixth light emitting transistor and the first electrode ET73 of the seventh light emitting transistor form an integrated structure. The first electrode ET53 of the fifth light emitting transistor, the second electrode ET104 of the tenth light emitting transistor and the first low-level signal line VGL1 form an integrated structure. The first electrode ET33 of the third light emitting transistor and the second electrode ET54 of the fifth light emitting transistor form an integrated structure. The second electrode ET94 of the ninth light emitting transistor and the first electrode ET103 of the tenth light emitting transistor form an integrated structure.

In an exemplary embodiment, the second electrode RT24 of the second reset transistor and the second electrode RT44 of the fourth reset transistor form an integrated structure. The second high-level signal line VGH2 and the first electrode RT13 of the first reset transistor form an integrated structure. The second electrode RT64 of the sixth reset transistor and the first electrode RT73 of the seventh reset transistor form an integrated structure. The first electrode RT53 of the fifth reset transistor, the second electrode RT104 of the tenth reset transistor, and the second low-level signal line VGL2 form an integrated structure. The first electrode RT33 of the third reset transistor and the second electrode RT54 of the fifth reset transistor form an integrated structure. The second electrode RT94 of the ninth reset transistor and the first electrode RT103 of the tenth reset transistor form an integrated structure.

In an exemplary embodiment, the second electrode GT14 of the first scan transistor and the second electrode GT74 of the seventh scan transistor form an integrated structure. The first electrode GT33 of the third scan transistor and the third low-level signal line VGL3 form an integrated structure. The first electrode GT63 of the sixth scan transistor and the third high-level signal line VGH3 form an integrated structure. The first electrode GT23 of the second scan transistor and the second electrode GT34 of the third scan transistor form an integrated structure. The second electrode GT44 of the fourth scan transistor and the first electrode GT53 of the fifth scan transistor form an integrated structure.

In an exemplary embodiment, the second electrode RT114 of the eleventh reset transistor and the second electrode RT174 of the seventeenth reset transistor form an integrated structure. The first electrode RT133 of the thirteenth reset transistor and the fourth low-level signal line VGL4 form an integrated structure. The first electrode RT163 of the sixth reset transistor and the fourth high-level signal line VGH4 form an integrated structure. The first electrode RT123 of the twelfth reset transistor and the second electrode RT134 of the thirteenth reset transistor form an integrated structure. The second electrode RT144 of the fourteenth reset transistor and the first electrode RT153 of the fifteenth reset transistor form an integrated structure.

In an exemplary embodiment, the first electrode ET43 of the fourth light emitting transistor and the second electrode ET44 of the fourth light emitting transistor are connected to an active layer of the fourth light emitting transistor through the first via. The first electrode ET53 of the fifth light emitting transistor and the second electrode ET54 of the fifth light emitting transistor are connected with an active layer of the fifth light emitting transistor through the second via. The first electrode ET33 of the third light emitting transistor and the second electrode ET34 of the third light emitting transistor are connected to an active layer of the third light emitting transistor through the third via. The second electrode ET24 of the second light emitting transistor is connected to an active layer of the second light emitting transistor through the fourth via. The first electrode ET13 of the first light emitting transistor is connected with the active layer of the first light emitting transistor through the fifth via. The first electrode ET73 of the seventh light emitting transistor and the second electrode ET74 of the seventh light emitting transistor are connected to an active layer of the seventh light emitting transistor through the sixth via. The first electrode ET63 of the sixth light emitting transistor and the second electrode ET64 of the sixth light emitting transistor are connected to an active layer of the sixth light emitting transistor through the seventh via. The first electrode ET103 of the tenth light emitting transistor and the second electrode ET104 of the tenth light emitting transistor are connected to an active layer of the tenth light emitting transistor through the eighth via. The first electrode ET93 of the ninth light emitting transistor and the second electrode ET94 of the ninth light emitting transistor are connected to an active layer of the ninth light emitting transistor through the ninth via. The first electrode ET83 of the eighth light emitting transistor and the second electrode ET84 of the eighth light emitting transistor are connected to an active layer of the eighth light emitting transistor through the tenth via. The control electrode of the fourth light emitting transistor is connected to one light emitting clock line and a second electrode ET34 of the third light emitting transistor through the thirty-seventh via, respectively. The second electrode ET44 of the fourth light emitting transistor is connected to a control electrode of the third light emitting transistor through the thirty-eighth via. The first electrode ET33 of the third light emitting transistor is connected to a control electrode of the first light emitting transistor through the thirty-ninth via. The control electrode of the second light emitting transistor is connected to another light emitting clock line and a first electrode ET63 of the sixth light emitting transistor through the fortieth via, respectively. The first electrode ET63 of the sixth light emitting transistor is connected to a control electrode of the seventh light emitting transistor through the forty-first via. The second electrode ET74 of the seventh light emitting transistor is connected to a control electrode of the ninth light emitting transistor through the forty-second via. The first connection electrode VL1 is connected to a second electrode ET84 of the eighth light emitting transistor and a second high-level signal line VGH2 through the forty-third via, respectively. The first electrode ET83 of the eighth light emitting transistor is connected to a first electrode plate of the first light emitting capacitor through the forty-fourth via. The second electrode ET94 of the ninth light emitting transistor is connected to a second connection electrode VL2 through the forty-fifth via. The first electrode ET63 of the sixth light emitting transistor is connected to a second electrode plate of the third light emitting capacitor through the sixty-ninth via. The first electrode ET73 of the seventh light emitting transistor is connected to a second electrode plate of the second light emitting capacitor through the seventieth via. The second electrode plate of the first light emitting capacitor is connected to a first electrode ET93 of the ninth light emitting transistor and a second high-level signal line VGH2 through the seventy-first via, respectively.

In an exemplary embodiment, the first electrode RT43 of the fourth reset transistor and the second electrode RT44 of the fourth reset transistor are connected to an active layer of the fourth reset transistor through the eleventh via. The first electrode RT53 of the fifth reset transistor and the second electrode RT54 of the fifth reset transistor are connected to an active layer of the fifth reset transistor through the twelfth via. The first electrode RT33 of the third reset transistor and the second electrode RT34 of the third reset transistor are connected to an active layer of the third reset transistor through the thirteenth via. The second electrode RT24 of the second reset transistor is connected to an active layer of the second reset transistor through the fourteenth via. The first electrode RT13 of the first reset transistor is connected to an active layer of the first reset transistor through the fifteenth via. The first electrode RT73 of the seventh reset transistor and the second electrode RT74 of the seventh reset transistor are connected to an active layer of the seventh reset transistor through the sixteenth via. The first electrode RT63 of the sixth reset transistor and the second electrode RT64 of the sixth reset transistor are connected to an active layer of the sixth reset transistor through the seventeenth via. The first electrode RT103 of the tenth reset transistor and the second electrode RT104 of the tenth reset transistor are connected to an active layer of the tenth reset transistor through the eighteenth via. The first electrode RT93 of the ninth reset transistor and the second electrode RT94 of the ninth reset transistor are connected to an active layer of the ninth reset transistor through the nineteenth via. The first electrode RT83 of the eighth reset transistor and the second electrode RT84 of the eighth reset transistor are connected to an active layer of the eighth reset transistor through the twentieth via. The control electrode of the fourth reset transistor is connected to one reset clock line and a second electrode RT34 of the third reset transistor through the forty-sixth via, respectively. The second electrode RT44 of the fourth reset transistor is connected to a control electrode of the third reset transistor through the forty-seventh via. The first electrode RT33 of the third reset transistor is connected to a control electrode of the first reset transistor through the forty-eighth via. The control electrode of the second reset transistor is connected to another reset clock line and a first electrode RT63 of the sixth reset transistor through the forty-ninth via, respectively. The first electrode RT63 of the sixth reset transistor is connected to a control electrode of the seventh reset transistor through the fiftieth via. The second electrode RT74 of the seventh reset transistor is connected to a control electrode of the ninth reset transistor through the fifty-first via. The third connection electrode VL3 is connected to a second electrode RT84 of the eighth reset transistor and a third high-level signal line VGH3 through the fifty-second via, respectively. The first electrode RT83 of the eighth reset transistor is connected to a first electrode plate of the first reset capacitor through the fifty-third via. The second electrode RT94 of the ninth reset transistor is connected to a fourth connection electrode VL4 through the fifty-fourth via. The first electrode RT63 of the sixth reset transistor is connected to a second electrode plate of the third reset capacitor through the seventy-second via. The first electrode RT73 of the seventh reset transistor is connected to a second electrode plate of the second reset capacitor through the seventy-third via. The second electrode plate of the first reset capacitor is connected to a first electrode RT93 of the ninth reset transistor and a third high-level signal line VGH3 through the seventy-fourth via, respectively.

In an exemplary embodiment, the first electrode GT13 of the first scan transistor and the second electrode GT14 of the first scan transistor are connected to an active layer of the first scan transistor through the twenty-first via. The first electrode GT23 of the second scan transistor and the second electrode GT24 of the second scan transistor are connected with an active layer of the second scan transistor through the twenty-second via. The first electrode GT33 of the third scan transistor and the second electrode GT34 of the third scan transistor are connected to an active layer of the third scan transistor through the twenty-third via. The second electrode GT74 of the seventh scan transistor is connected to an active layer of the seventh scan transistor through the twenty-fourth via. The first electrode GT63 of the sixth scan transistor is connected to an active layer of the sixth scan transistor through the twenty-fifth via. The first electrode GT83 of the eighth scan transistor and the second electrode GT84 of the eighth scan transistor are connected with an active layer of the eighth scan transistor through the twenty-sixth via. The first electrode GT53 of the fifth scan transistor and the second electrode GT54 of the fifth scan transistor are connected to an active layer of the fifth scan transistor through the twenty-seventh via. The first electrode GT43 of the fourth scan transistor and the second electrode GT44 of the fourth scan transistor are connected to an active layer of the fourth scan transistor through the twenty-eighth via. The control electrode of the first scan transistor is connected to one scan clock line and a second electrode GT24 of the second scan transistor though the fifty-fifth via. The third low-level signal line VGL3 is connected to a control electrode of the eighth scan transistor through the fifty-sixth via. The control electrode of the second scan transistor is connected to a second electrode GT14 of the first scan transistor and a first electrode GT83 of the eighth scan transistor through the fifty-seventh via, respectively. The control electrode of the seventh scan transistor is connected to another scan clock line and a second electrode GT54 of the fifth scan transistor through the fifty-eighth via. The first electrode GT23 of the second scan transistor is connected to a control electrode of the sixth scan transistor through the fifty-ninth via. The second electrode GT84 of the eighth scan transistor is connected to a control electrode of the fifth scan transistor through the sixtieth via. The fifth connection electrode VL5 is connected to a thirteenth connection electrode VL13 and a second electrode GT44 of the fourth scan transistor through the sixty-first via, respectively. The first electrode GT53 of the fifth scan transistor is connected to a first electrode plate of the second scan capacitor through the seventy-fifth via. The first electrode plate of the first scan capacitor is connected to a first electrode GT43 of the fourth scan transistor and a first electrode GT63 of the sixth scan transistor through the seventy-sixth via, respectively. The seventh connection electrode VL7 is connected to a tenth connection electrode and a twelfth connection electrode through the seventy-seventh via.

In an exemplary embodiment, the first electrode RT113 of the eleventh reset transistor and the second electrode RT114 of the eleventh reset transistor are connected to an active layer of the eleventh reset transistor through the twenty-ninth via. The first electrode RT123 of the twelfth reset transistor and the second electrode RT124 of the second reset transistor are connected to an active layer of the twelfth reset transistor through the thirtieth via. The first electrode RT133 of the thirteenth reset transistor and the second electrode RT134 of the thirteenth reset transistor are connected to an active layer of the thirteenth reset transistor through the thirty-first via. The second electrode RT174 of the seventeenth reset transistor is connected to an active layer of the seventeenth reset transistor through the thirty-second via. The first electrode RT163 of the sixteenth reset transistor is connected to an active layer of the sixteenth reset transistor through the thirty-third via. The first electrode RT183 of the eighteenth reset transistor and the second electrode RT184 of the eighteenth reset transistor are connected to an active layer of the eighteenth reset transistor through the thirty-fourth via. The first electrode RT153 of the fifteenth reset transistor and the second electrode RT154 of the fifteenth reset transistor are connected to an active layer of the fifteenth reset transistor through the thirty-fifth via. The first electrode RT143 of the fourteenth reset transistor and the second electrode RT144 of the fourteenth reset transistor are connected to an active layer of the fourteenth reset transistor through the thirty-sixth via. The control electrode of the eleventh reset transistor is connected to one reset clock line and a second electrode RT124 of the twelfth reset transistor though the sixty-second via. The fourth low-level signal line VGL4 is connected to a control electrode of the eighteenth reset transistor through the sixty-third via. The control electrode of the twelfth reset transistor is connected to a second electrode RT114 of the eleventh reset transistor and a first electrode RT183 of the eighteenth reset transistor through the sixty-fourth via, respectively. The control electrode of the seventeenth reset transistor is connected to another reset clock line and a second electrode RT154 of the fifteenth reset transistor through the sixty-fifth via. The first electrode RT123 of the twelfth reset transistor is connected to a control electrode of the sixteenth reset transistor through the sixty-sixth via. The second electrode RT184 of the eighteenth reset transistor is connected to a control electrode of the fifteenth reset transistor through the sixty-seventh via. The sixth connection electrode VL6 is connected to a twelfth connection electrode VL12 and a fourteenth connection electrode VL14 through the sixty-eighth via, respectively. The first electrode RT153 of the fifteenth reset transistor is connected to a first electrode plate of the fourth reset capacitor through the seventy-eighth via. The first electrode plate of the third reset capacitor is connected to a first electrode RT143 of the fourteenth reset transistor and a first electrode RT163 of the sixteenth reset transistor through the seventy-ninth via, respectively. The eighth connection electrode VL8 is connected to a second electrode RT144 of the fourteenth reset transistor through the eightieth via. The ninth connection electrode VL9 is connected to an eleventh connection electrode VL11 through the eighty-first via.

Figure 23:
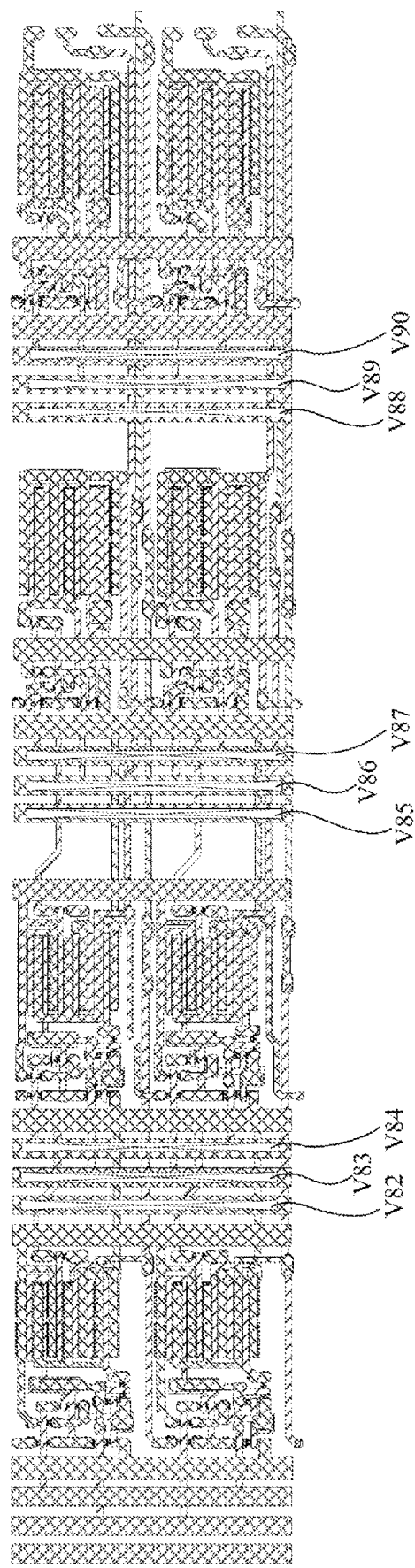
FIG. 23 is a schematic diagram after a fourth insulation layer is formed.

(6) Forming a fourth insulation layer, which includes depositing a fourth insulation thin film on a substrate on which the third conductive layer is formed, patterning the fourth insulation thin film by a patterning process to form the fourth insulation layer, wherein the fourth insulation layer is provided with an eighty-second via V82 to a ninetieth via V90. As shown in FIG. 23, FIG. 23 is a schematic diagram after a fourth insulation layer is formed.

The eighty-second via V82 exposes a first sub-reset initial signal line. The eighty-third via V83 exposes a fourth sub-reset clock line. The eighty-fourth via V84 exposes a first sub-reset clock line. The eighty-fifth via V85 exposes a first sub-scan initial signal line. The eighty-sixth via V86 exposes a third sub-scan clock line. The eighty-seventh via V87 exposes a first sub-scan clock line. The eighty-eighth via V88 exposes a third sub-reset initial signal line. The eighty-ninth via V89 exposes a seventh sub-reset clock line. The ninetieth via V90 exposes a fifth sub-reset clock line.

Figure 24:
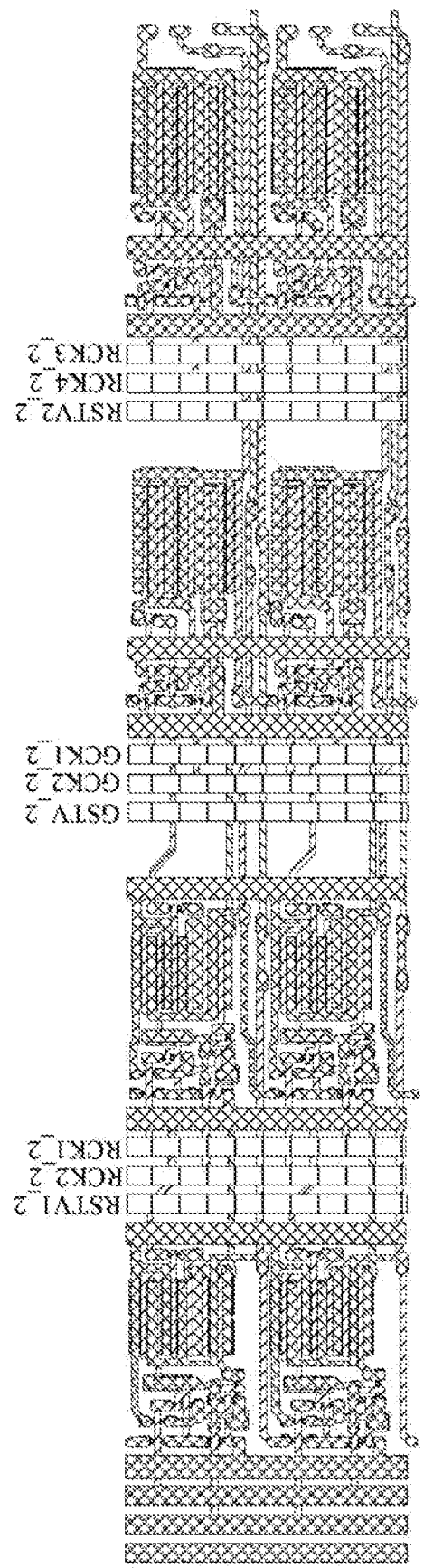
FIG. 24 is a schematic diagram after a fourth conductive layer is formed.

(7) Forming a fourth conductive layer, which includes depositing a fourth metal thin film on the substrate on which the fourth insulation layer is formed, and patterning the fourth metal thin film by a patterning process to form the fourth conductive layer. The fourth conductive layer includes a second sub-reset initial signal line RSTV1_2, a fourth sub-reset clock line RCK2_2, a second sub-reset clock line RCK1_2, a second sub-scan initial signal line GSTV_2, a fourth sub-scan clock line GCK2_2, a second sub-scan clock line GCK1_2, a fourth sub-reset initial signal line RSTV2_2, an eighth sub-scan clock line RCK4_2, and a sixth sub-scan clock line RCK3_2, as shown in FIG. 24, which is a schematic diagram after the fourth conductive layer is formed.

In an exemplary embodiment, the second sub-reset initial signal line RSTV1_2 is connected to a first sub-reset initial signal line through the eighty-second via. The fourth sub-reset clock line RCK2_2 is connected to a third sub-reset clock line RCK2_1 through the eighty-third via. The second sub-reset clock line RCK1_2 is connected to a first sub-reset clock line RCK1_1 through the eighty-fourth via. The second sub-scan initial signal line GSTV_2 is connected to a first sub-scan initial signal line through the eighty-fifth via. The fourth sub-scan clock line GCK2_2 is connected to a third sub-scan clock line through the eighty-sixth via. The second sub-scan clock line GCK1_2 is connected to a first sub-scan clock line through the eighty-seventh via. The fourth sub-reset initial signal line RSTV2_2 is connected to a third sub-reset initial signal line through the eighty-eighth via. The eighth sub-scan clock line RCK4_2 is connected to a seventh sub-reset clock line through the eighty-ninth via. The sixth sub-scan clock line RCK3_2 is connected to a fifth sub-reset clock line through the ninetieth via.

(8) Forming a planarization layer, which includes depositing a fourth insulation thin film on the substrate on which the fourth conductive layer is formed, patterning the fifth insulation thin film by a patterning process to form the fifth insulation layer, coating a planarization thin film on the substrate on which the fifth insulation layer is formed, and forming the planarization layer through masking, exposure, and development of the planarization thin film.

(9) Forming a transparent conductive layer, which includes: depositing a transparent conductive thin film on the substrate where the planarization layer is formed, and patterning the transparent conductive thin film by a patterning process to form a transparent conductive layer, wherein the transparent conductive layer includes a first electrode formed in each light emitting device.

(10) Forming a pixel definition layer, which includes coating a pixel definition thin film on the substrate where the transparent conductive layer is formed, and forming the pixel definition layer through masking, exposure, and development processes, wherein the pixel definition layer is formed in each light emitting device, and an opening region exposing the first electrode is formed in the pixel definition layer in each light emitting device.

(11) Forming an organic light emitting layer, which includes forming an organic light emitting layer in the opening region of the formed pixel definition layer and on the pixel definition layer, wherein the organic light emitting layer is connected with the first electrode.

(12) Forming a second electrode, which includes coating a conductive thin film on the substrate where the organic light emitting layer is formed, and patterning the conductive thin film by a patterning process, to form a second electrode, wherein the second electrode covers the organic light emitting layer in each light emitting device, and the second electrode is connected with the organic light emitting layer.

(13) Forming an encapsulation layer. Herein the encapsulation layer is formed on the substrate where the second electrode is formed. The encapsulation layer includes a first encapsulation layer made of an inorganic material, a second encapsulation layer made of an organic material, and a third encapsulation layer made of an inorganic material. The first encapsulation layer is disposed on the second electrode, the second encapsulation layer is disposed on the first encapsulation layer, and the third encapsulation layer is disposed on the second encapsulation layer, to form a stacked structure of inorganic material/organic material/inorganic material.

In an exemplary embodiment, the pixel definition layer may be made of polyimide, acrylic, or polyethylene terephthalate.

In an exemplary embodiment, the second electrode may be made of any one or more of magnesium (Mg), silver (Ag), aluminum (Al), copper (Cu), and lithium (Li), or an alloy made of any one or more of the above metals.

An embodiment of the present disclosure further provides a display apparatus, including a display panel.

In an exemplary embodiment, the display apparatus may be any product or component with any display function, such as a display, a television, a mobile phone, a tablet computer, a navigator, a digital photo frame, and a wearable display product.

The display panel is the display panel in accordance with any one of the preceding embodiments, and their implementation principles and implementation effects are similar, and will not be repeated herein.

The accompanying drawings of the present disclosure only involve the structures involved in the embodiments of the present disclosure, and other structures may refer to usual designs.

For the sake of clarity, in the accompanying drawings used for describing the embodiments of the present disclosure, a thickness and dimension of a layer or a micro structure is enlarged. It may be understood that when an element such as a layer, a film, a region, or a substrate is described as being "on" or "under" another element, the element may be "directly" located "on" or "under" the another element, or there may be an intermediate element between the two elements.

Although the embodiments disclosed in the present disclosure are as above, the described contents are only embodiments used for convenience of understanding the present disclosure but are not intended to limit the present disclosure. Any person skilled in the art to which the present disclosure pertains may make any modification and variation in forms and details of implementation without departing from the spirit and scope disclosed in the present disclosure. However, the scope of patent protection of the present disclosure is still subject to the scope defined by the appended claims.

The invention claimed is:

1. A display panel, comprising: a substrate comprising a display region and a non-display region, wherein the display region is provided with at least one light emitting signal line, at least one first reset signal line and sub-pixels arranged in an array, and at least one sub-pixel comprises a light emitting device and a pixel circuit; wherein the pixel circuit is connected with an anode of the light emitting device;

the pixel circuit is respectively connected with a first reset signal line and a light emitting signal line, wherein the first reset signal line is configured to provide a reset control signal to the pixel circuit to reset the anode of the light emitting device, and the light emitting signal line is configured to provide a light emitting control signal to the pixel circuit to provide a drive current to the anode of the light emitting device;

for a first reset signal line and a light emitting signal line connected with a same pixel circuit, when a signal of the first reset signal line is an effective level signal, a signal of the light emitting signal line is an ineffective level signal, and when the signal of the first reset signal line is the ineffective level signal, the signal of the light emitting signal line is the effective level signal; and a duration for which the signal of the light emitting signal line is the ineffective level signal is equal to a duration for which the signal of the first reset signal line is the effective level signal.

2. The display panel according to claim 1, wherein the display region is further provided with at least one second reset signal line, at least one scan signal line, at least one initial signal line, and at least one data signal line; and the pixel circuit is connected with a second reset signal line, a scan signal line, an initial signal line, and a data signal line, respectively.

3. The display panel according to claim 2, wherein the pixel circuit comprises a first transistor to a seventh transistor and a storage capacitor;

a control electrode of the first transistor is connected to a second reset terminal, a first electrode of the first transistor is connected to an initial signal terminal, a second electrode of the first transistor is connected to a second node, a control electrode of the second transistor is connected to a scan signal terminal, a first electrode of the second transistor is connected to the second node, and a second electrode of the second transistor is connected to a third node; a control electrode of the third transistor is connected to the second node, a first electrode of the third transistor is connected to a first node, and a second electrode of the third transistor is connected to the third node; a control electrode of the fourth transistor is connected to the scan signal terminal, a first electrode of the fourth transistor is connected to a data signal terminal, and a second electrode of the fourth transistor is connected to the first node; a control electrode of the fifth transistor is connected with a light emitting signal terminal, a first electrode of the fifth transistor is connected with a first power supply terminal, and a second electrode of the fifth transistor is connected with the first node; a control electrode of the sixth transistor is connected with the light emitting signal terminal, a first electrode of the sixth transistor is connected with the third node, and a second electrode of the sixth transistor is connected with a light emitting device; a control electrode of the seventh transistor is connected with the scan signal terminal, a first electrode of the seventh transistor is connected with the initial signal terminal, a second electrode of the seventh transistor is connected with a first electrode of the light emitting device, a first terminal of the storage capacitor is connected with the first power supply terminal, and a second terminal of the storage capacitor is connected with the second node; and for a pixel circuit in a sub-pixel of an i-th row and a j-th column, the scan signal terminal is connected to an i-th scan signal line, a first reset terminal is connected to an i-th first reset signal line, a second reset terminal is connected to an i-th second reset signal line, the initial signal terminal is connected to an i-th initial signal line, the light emitting signal terminal is connected to an i-th light emitting signal line, and the data signal terminal is connected to a j-th data signal line, wherein, $1 \leq i \leq M$, $1 \leq j \leq N$, M is a total number of rows of the sub-pixels, and N is a total number of columns of the sub-pixels.

4. The display panel according to claim 2, wherein the non-display region is provided with a scan drive circuit providing a drive signal to the scan signal line, a light emitting drive circuit providing a drive signal to the light emitting signal line, a first reset drive circuit providing a drive signal to the first reset signal line, and a second reset drive circuit providing a drive signal to the second reset signal line;

wherein the light emitting drive circuit is located at a side of the display region, and the first reset drive circuit is located between the light emitting drive circuit and the display region; the scan drive circuit is located between the first reset drive circuit and the display region; and the second reset drive circuit is located between the scan drive circuit and the display region.

5. The display panel according to claim 4, wherein the non-display region is further provided with a light emitting initial signal line, a second light emitting clock line, a first light emitting clock line, a first high-level signal line, a first low-level signal line, a first reset initial signal line, a second reset clock line, a first reset clock line, a second high-level signal line, a second low-level signal line, a scan initial signal line, a second scan clock line, a first scan clock line, a third high-level signal line, a third low-level signal line, a second reset initial signal line, a third reset clock line, a fourth reset clock line, a fourth high-level signal line and a fourth low-level signal line;

the light emitting initial signal line, the second light emitting clock line, the first light emitting clock line and the first high-level signal line are located on a side of the light emitting drive circuit away from the display region, and the first low-level signal line is located on a side of a light emitting shift register close to the display region; the second light emitting clock line is located on a side of the initial light emitting signal line close to the display region, the first light emitting clock line is located on a side of the second light emitting clock line close to the display region, and the first high-level signal line is located on a side of the first light emitting clock line close to the display region;

the first reset initial signal line, the second reset clock line, the first reset clock line and the second high-level signal line are located on a side of the first reset drive circuit away from the display region, the second low-level signal line is located on a side of the first reset drive circuit close to the display region, the first reset initial signal line is located on a side of the first low-level signal line close to the display region, the second reset clock line is located on a side of the first reset initial signal line close to the display region, the first reset clock line is located on a side of the second reset clock signal line close to display region, and the second high-level signal line is located on a side of the first reset clock line close to the display region;

the scan initial signal line, the second scan clock line, the first scan clock line and the third high-level signal line are located on a side of the scan drive circuit away from the display region, the scan initial signal line is located on a side of the second low-level signal line close to the display region, the second scan clock line is located on a side of the scan initial signal line close to the display region, a first scan clock line is located on a side of the second scan clock line close to the display region, the third high-level signal line is located on a side of the first scan clock line close to the display region, and the third low-level signal line is located on a side of the third high-level signal line close to the display region; and the second reset initial signal line, the third reset clock line, the fourth reset clock line and the fourth high-level signal line are located on a side of the second reset drive circuit away from the display region, wherein the second reset initial signal line is located on a side of the third low-level signal line close to the display region, the fourth reset clock line is located on a side of the second reset initial signal line close to the display region, the third reset clock line is located on a side of the fourth reset clock line close to the display region, the fourth high-level signal line is located on a side of the third reset clock line close to the display region, and the fourth low-level signal line is located on a side of the fourth high-level signal line close to the display region.

6. The display panel according to claim 2, wherein the light emitting drive circuit comprises a plurality of light emitting shift registers, and the first reset drive circuit comprises a plurality of first reset shift registers;

the light emitting shift register comprises a plurality of light emitting transistors and a plurality of light emitting capacitors, and the first reset shift register comprises a plurality of reset transistors and a plurality of reset capacitors; and a connection relationship between the plurality of light emitting transistors and the plurality of light emitting capacitors in the light emitting shift register is the same as a connection relationship between the plurality of reset transistors and the plurality of reset capacitors in the first reset shift register.

7. The display panel according to claim 6, wherein the plurality of light emitting shift registers in the light emitting drive circuit are cascaded; wherein each light emitting shift register comprises a first light emitting transistor to a tenth light emitting transistor, and a first light emitting capacitor to a third light emitting capacitor;

a control electrode of the first light emitting transistor is connected with the first node, a first electrode of the first light emitting transistor is connected with the first power supply terminal, a second electrode of the first light emitting transistor is connected with a first electrode of the second light emitting transistor, a control electrode of the second light emitting transistor is connected with the second clock signal terminal, a second electrode of the second light emitting transistor is connected with the second node, a control electrode of the third light emitting transistor is connected with the second node, a first electrode of the third light emitting transistor is connected with the first node, a second electrode of the third light emitting transistor is connected with the first clock signal terminal, a control electrode of the fourth light emitting transistor is connected with the first clock signal terminal, a first electrode of the fourth light emitting transistor is connected with the signal input terminal, a second electrode of the fourth light emitting transistor is connected with the second node, a control electrode of the fifth light emitting transistor is connected with the first clock signal terminal, a first electrode of the fifth light emitting transistor is connected with the second power supply terminal, a second electrode of the fifth light emitting transistor is connected with the first node, a control electrode of the sixth light emitting transistor is connected with the first node, a first electrode of the sixth light emitting transistor is connected with the second clock signal terminal, a second electrode of the sixth light emitting transistor is connected with a first electrode of the seventh light emitting transistor, the second electrode of the sixth light emitting transistor is connected with the third node, a control electrode of the seventh light emitting transistor is connected with the second clock signal terminal, the first electrode of the seventh light emitting transistor is connected with the third node, a second electrode of the seventh light emitting transistor is connected with the fourth node, a control electrode of the eighth light emitting transistor is connected with the first node, a first electrode of the eighth light emitting transistor is connected with the fourth node, a second electrode of the eighth light emitting transistor is connected with the first power supply terminal, a control electrode of the ninth light emitting transistor is connected with the fourth node, a first electrode of the ninth light emitting transistor is connected with the first power supply terminal, a second electrode of the ninth light emitting transistor is connected with the signal output terminal, a control electrode of the tenth light emitting transistor is connected with the first node, a first electrode of the tenth light emitting transistor is connected with the signal output terminal, a second electrode of the tenth light emitting transistor is connected with the second power supply terminal, a first electrode plate of the first light emitting capacitor is connected with the fourth node, a second electrode plate of the first light emitting capacitor is connected with the first power supply terminal, a first electrode plate of the second light emitting capacitor is connected with the first node, a second electrode plate of the second light emitting capacitor is connected with the third node, a first electrode plate of the third light emitting capacitor is connected with the second node, and a second electrode plate of the third light emitting capacitor is connected with the second clock signal terminal, and a signal input terminal of a light emitting shift register of a first stage is connected with the light emitting initial signal line, a signal output terminal of a light emitting shift register of an i-th stage is connected with a signal input terminal of a light emitting shift register of an (i+1)-th stage, a first power supply terminal of a light emitting shift register of each stage is connected with the first high-level signal line and the second high-level signal line, a second power supply terminal of a light emitting shift register of each stage is connected with the first low-level signal line, first clock signal terminals of light emitting shift registers of odd-numbered stages are connected with the first light emitting clock line, second clock signal terminals of light emitting shift registers of odd-numbered stages are connected with the second light emitting clock line, first clock signal terminals of light emitting shift registers of even-numbered stages are connected with the second light emitting clock line, and second clock signal terminals of light emitting shift registers of even-numbered stages are connected with the first light emitting clock line.

8. The display panel according to claim 7, wherein the plurality of first reset shift registers in the first reset drive circuit are cascaded; each first reset shift register comprises a first reset transistor to a tenth reset transistor, and a first reset capacitor to a third reset capacitor;

a control electrode of the first reset transistor is connected with the first node, a first electrode of the first reset transistor is connected with the first power supply terminal, a second electrode of the first reset transistor is connected with a first electrode of the second reset transistor, a control electrode of the second reset transistor is connected with the second clock signal terminal, a second electrode of the second reset transistor is connected with the second node, a control electrode of the third reset transistor is connected with the second node, a first electrode of the third reset transistor is connected with the first node, a second electrode of the third reset transistor is connected with the first clock signal terminal, a control electrode of the fourth reset transistor is connected with the first clock signal terminal, a first electrode of the fourth reset transistor is connected with the signal input terminal, a second electrode of the fourth reset transistor is connected with the second node, a control electrode of the fifth reset transistor is connected with the first clock signal terminal, a first electrode of the fifth reset transistor is connected with the second power supply terminal, a second electrode of the fifth reset transistor is connected with the first node, a control electrode of the sixth reset transistor is connected with the first node, a first electrode of the sixth reset transistor is connected with the second clock signal terminal, a second electrode of the sixth reset transistor is connected with a first electrode of the seventh reset transistor, the second electrode of the sixth reset transistor is connected with the third node, a control electrode of the seventh reset transistor is connected with the second clock signal terminal, the first electrode of the seventh reset transistor is connected with the third node, a second electrode of the seventh reset transistor is connected with the fourth node, a control electrode of the eighth reset transistor is connected with the first node, a first electrode of the eighth reset transistor is connected with the fourth node, a second electrode of the eighth reset transistor is connected with the first power supply terminal, a control electrode of the ninth reset transistor is connected with the fourth node, a first electrode of the ninth reset transistor is connected with the first power supply terminal, a second electrode of the ninth reset transistor is connected with the signal output terminal, a control electrode of the tenth reset transistor is connected with the first node, a first electrode of the tenth reset transistor is connected with the signal output terminal, a second electrode of the tenth reset transistor is connected with the second power supply terminal, a first electrode plate of the first reset capacitor is connected with the fourth node, a second electrode plate of the first reset capacitor is connected with the first power supply terminal, a first electrode plate of the second reset capacitor is connected with the first node, a second electrode plate of the second reset capacitor is connected with the third node, a first electrode plate of the third reset capacitor is connected with the second node, and a second electrode plate of the third light emitting capacitor is connected with the second clock signal terminal; and a signal input terminal of a first reset shift register of a first stage is connected with the first reset initial signal line, a signal output terminal of a first reset shift register of an i-th stage is connected with a signal input terminal of a first reset shift register of an (i+1)-th stage, a first power supply terminal of a first reset shift register of each stage is connected with the second high-level signal line and the third high-level signal line, a second power supply terminal of a first reset shift register of each stage is connected with the second low-level signal line, first clock signal terminals of first reset shift registers of odd-numbered stages are connected with the first reset clock line, second clock signal terminals of first reset shift registers of odd-numbered stages are connected with the second reset clock line, first clock signal terminals of first reset shift registers of even-numbered stages are connected with the second reset clock line, and second clock signal terminals of first reset shift registers of even-numbered stages are connected with the first reset clock line.

9. The display panel according to claim 8, wherein the scan drive circuit comprises a plurality of cascaded scan shift registers; each scan shift register comprises a first scan transistor to an eighth scan transistor, a first scan capacitor and a second scan capacitor;

a control electrode of the first scan transistor is connected with the first clock signal terminal, a first electrode of the first scan transistor is connected with the signal input terminal, and a second electrode of the first scan transistor is connected with the first node; a control electrode of the second scan transistor is connected with the first node, a first electrode of the second scan transistor is connected with the second node, and a second electrode of the second scan transistor is connected with the first clock signal terminal; a control electrode of the third scan transistor is connected with the first clock signal terminal, a first electrode of the third scan transistor is connected with the second power supply terminal, and a second electrode of the third scan transistor is connected with the second node; a control electrode of the fourth scan transistor is connected with the second node, a first electrode of the fourth scan transistor is connected with the first power supply terminal, and a second electrode of the fourth scan transistor is connected with the signal output terminal; a control electrode of the fifth scan transistor is connected with the third node, a first electrode of the fifth scan transistor is connected with the signal output terminal, and a second electrode of the fifth scan transistor is connected with the second clock signal terminal; a control electrode of the sixth scan transistor is connected with the second node, a first electrode of the sixth scan transistor is connected with the first power supply terminal, and a second electrode of the sixth scan transistor is connected with a first electrode of the seventh scan transistor; a control electrode of the seventh scan transistor is connected with the second clock signal terminal, and a second electrode of the seventh scan transistor is connected with the first node; a control electrode of the eighth scan transistor is connected with the second power supply terminal, a first electrode of the eighth scan transistor is connected with the first node, and a second electrode of the eighth scan transistor is connected with the third node; a first electrode plate of the first scan capacitor is connected with the first power supply terminal, and a second electrode plate of the first scan capacitor is connected with the second node; and a first electrode plate of the second scan capacitor is connected with the signal output terminal, and a second electrode plate of the second scan capacitor is connected with the third node;

a signal input terminal of a scan shift register of a first stage is connected with the scan initial signal line, and a signal output terminal of a scan shift register of an i-th stage is connected with a signal input terminal of a scan shift register of an (i+1)-th stage; a first power supply terminal of a scan shift register of each stage is connected with the third high-level signal line; a second power supply terminal of a scan shift register of each stage is connected with the third low-level signal line; and first clock signal terminals of scan shift registers of odd-numbered stages are connected with the first scan clock line, second clock signal terminals of scan shift registers of odd-numbered stages are connected with the second scan clock line, first clock signal terminals of scan shift registers of even-numbered stages are connected with the second scan clock line, and second clock signal terminals of scan shift registers of even-numbered stages are connected with the first scan clock line.

10. The display panel according to claim 9, wherein the second reset drive circuit comprises a plurality of cascaded second reset shift registers; each second reset drive circuit comprises an eleventh reset transistor to an eighteenth reset transistor, a third reset capacitor and a fourth reset capacitor, a control electrode of the eleventh reset transistor is connected with the first clock signal terminal, a first electrode of the eleventh reset transistor is connected with the signal input terminal, a second electrode of the eleventh reset transistor is connected with the first node, a control electrode of the twelfth reset transistor is connected with the first node, a first electrode of the twelfth reset transistor is connected with the second node, a second electrode of the twelfth reset transistor is connected with the first clock signal terminal, a control electrode of the thirteenth reset transistor is connected with the first clock signal terminal, a first electrode of the thirteenth reset transistor is connected with the second power supply terminal, a second electrode of the thirteenth reset transistor is connected with the second node, a control electrode of the fourteenth reset transistor is connected with the second node, a first electrode of the fourteenth reset transistor is connected with the first power supply terminal, a second electrode of the fourteenth reset transistor is connected with the signal output terminal, a control electrode of the fifteenth reset transistor is connected with the third node, a first electrode of the fifteenth reset transistor is connected with the signal output terminal, a second electrode of the fifteenth reset transistor is connected with the second clock signal terminal, a control electrode of the sixteenth reset transistor is connected with the second node, a first electrode of the sixteenth reset transistor is connected with the first power supply terminal, a second electrode of the sixteenth reset transistor is connected with a first electrode of the seventeenth reset transistor, a control electrode of the seventeenth reset transistor is connected with the second clock signal terminal, a second electrode of the seventeenth reset transistor is connected with the first node, a control electrode of the eighteenth reset transistor is connected with the second power supply terminal, a first electrode of the eighteenth reset transistor is connected with the first node, a second electrode of the eighteenth reset transistor is connected with the third node, a first electrode plate of the third reset capacitor is connected with the first power supply terminal, a second electrode plate of the third reset capacitor is connected with the second node, a first electrode plate of the fourth reset capacitor is connected with the signal output terminal, and a second electrode plate of the fourth reset capacitor is connected with the third node;

a signal input terminal of a second reset shift register of a first stage is connected with the second reset initial signal line, and a signal output terminal of a second reset shift register of an i-th stage is connected with a signal input terminal of a second reset shift register of an (i+1)-th stage; a first power supply terminal of a second reset shift register of each stage is connected with the fourth high-level signal line; a second power supply terminal of a second reset shift register of each stage is connected with the fourth low-level signal line; and first clock signal terminals of second reset shift registers of odd-numbered stages are connected with the third reset clock line, second clock signal terminals of second reset shift registers of odd-numbered stages are connected with the fourth reset clock line, first clock signal terminals of second reset shift registers of even-numbered stages are connected with the fourth reset clock line, and second clock signal terminals of second reset shift registers of even-numbered stages are connected with the third reset clock line.

11. The display panel according to claim 2, wherein the scan initial signal line comprises a first sub-scan initial signal line and a second sub-scan initial signal line arranged in different layers and connected to each other; the first scan clock line comprises a first sub-scan clock line and a second sub-scan clock line arranged in different layers and connected with each other; the second scan clock line comprises a third sub-scan clock line and a fourth sub-scan clock line arranged in different layers and connected with each other; the first reset initial signal line comprises a first sub-reset initial signal line and a second sub-reset initial signal line arranged in different layers and connected with each other; the first reset clock line comprises a first sub-reset clock line and a second sub-reset clock line arranged in different layers and connected with each other; the second reset clock line comprises a third sub-reset clock line and a fourth sub-reset clock line arranged in different layers and connected with each other; the second reset initial signal line comprises a third sub-reset initial signal line and a fourth sub-reset initial signal line arranged in different layers and connected with each other; the third reset clock line comprises a fifth sub-reset clock line and a sixth sub-scan clock line arranged in different layers and connected with each other; the fourth reset clock line may comprise a seventh sub-reset clock line and an eighth sub-scan clock line arranged in different layers and connected to each other;

an orthographic projection of the first sub-scan initial signal line on the substrate is at least partially overlapped with an orthographic projection of the second sub-scan initial signal line on the substrate; an orthographic projection of the first sub-scan clock line on the substrate is at least partially overlapped with an orthographic projection of the second sub-scan clock line on the substrate; an orthographic projection of the third sub-scan clock line on the substrate is at least partially overlapped with an orthographic projection of the fourth sub-scan clock line on the substrate; an orthographic projection of the first sub-reset initial signal line on the substrate is at least partially overlapped with an orthographic projection of the second sub-reset initial signal line on the substrate; an orthographic projection of the first sub-reset clock line on the substrate is at least partially overlapped with an orthographic projection of the second sub-reset clock line on the substrate; an orthographic projection of the third sub-reset clock line on the substrate is at least partially overlapped with an orthographic projection of the fourth sub-reset clock line on the substrate; an orthographic projection of the third sub-reset initial signal line on the substrate is at least partially overlapped with an orthographic projection of the fourth sub-reset initial signal line on the substrate; an orthographic projection of the fifth sub-reset clock line on the substrate is at least partially overlapped with an orthographic projection of the sixth sub-scan clock line on the substrate; and an orthographic projection of the seventh sub-reset clock line on the substrate is at least partially overlapped with an orthographic projection of the eighth sub-scan clock line on the substrate.

12. The display panel according to claim 11, wherein the non-display region is further provided with a first connection electrode to a fourteenth connection electrode;

the first connection electrode to the sixth connection electrode are arranged in a same layer, the seventh connection electrode to the ninth connection electrode are arranged in a same layer, and the tenth connection electrode to the fourteenth connection electrode are arranged in a same layer; and the first connection electrode is connected to the second high-level signal line, the second connection electrode is respectively connected to the signal output terminal of the light emitting shift register and the tenth connection electrode, the third connection electrode is connected to the third high-level signal line, the fourth connection electrode is respectively connected to the signal output terminal of the first reset shift register and the eleventh connection electrode, the fifth connection electrode is respectively connected to the signal output terminal of the scan drive circuit and the thirteenth connection electrode, the sixth connection electrode is respectively connected to the twelfth connection electrode and the fourteenth connection electrode, the seventh connection electrode is respectively connected to the tenth connection electrode and the twelfth connection electrode, the eighth connection electrode is respectively connected to the signal output terminal of the second reset shift register and the second reset signal line, the ninth connection electrode is respectively connected to the eleventh connection electrode and the first reset signal line, the thirteenth connection electrode is connected with the scan signal line, and the fourteen connection electrode is connected with the light emitting signal line.

13. The display panel according to claim 12, further comprising a drive circuit layer and a light emitting structure layer stacked on the substrate sequentially; wherein the drive circuit layer comprises an active layer, a first insulation layer, a first conductive layer, a second insulation layer, a second conductive layer, a third insulation layer, a third conductive layer, a fourth insulation layer and a fourth conductive layer which are stacked sequentially on the substrate;

the active layer comprises an active layer of a first light emitting transistor to an active layer of a tenth light emitting transistor, an active layer of a first reset transistor to an active layer of a tenth reset transistor, an active layer of a first scan transistor to an active layer of an eighth scan transistor, an active layer of an eleventh reset transistor to an active layer of an eighteenth reset transistor;

the first conductive layer comprises a control electrode of the first light emitting transistor to a control electrode of the tenth light emitting transistor, a first electrode plate of the first light emitting capacitor to a first electrode plate of the third light emitting capacitor, a control electrode of the first reset transistor to a control electrode of the tenth reset transistor, a first electrode plate of the first reset capacitor to a first electrode plate of the third reset transistor, a control electrode of the first scan transistor to a control electrode of the eighth scan transistor, a second electrode plate of the first scan capacitor, a second electrode plate of the second scan capacitor, a control electrode of the eleventh reset transistor to a control electrode of the eighteenth reset transistor, a second electrode plate of the third reset capacitor, a second electrode of the fourth reset capacitor and a first connection electrode to a sixth connection electrode;

the second conductive layer comprises a second electrode plate of the first light emitting capacitor to a second electrode plate of the third light emitting capacitor, a second electrode plate of the first reset capacitor to a second electrode plate of the third reset capacitor, a first electrode plate of the first scan capacitor, a first electrode plate of the second scan capacitor, a first electrode plate of the third reset capacitor, a first electrode plate of the fourth reset capacitor, and a seventh connection electrode to a ninth connection electrode;

the third conductive layer comprises a tenth connection electrode to a fourteenth connection electrode, a light emitting initial signal line, a second light emitting clock line, a first light emitting clock line, a first high-level signal line, a first low-level signal line, a first sub-reset initial signal line, a third sub-reset clock line, a first sub-reset clock line, a second high-level signal line, a second low-level signal line, a first sub-scan initial signal line, a third sub-scan clock line, a first sub-scan clock line, a third high-level signal line, a third low-level signal line, a third sub-reset initial signal line, a fifth sub-reset clock line, a seventh sub-reset clock line, a fourth high-level signal line, a fourth low-level signal line, first and second electrodes of the first light emitting transistor to first and second electrodes of the tenth light emitting transistor, first and second electrodes of first reset transistor to first and second electrodes of tenth reset transistor, first and second electrodes of the first scan transistor to first and second electrodes of the eighth scan transistor, first and second electrodes of the eleventh reset transistor to first and second electrodes of the eighteenth reset transistor; and the fourth conductive layer comprises a second sub-reset initial signal line, a fourth sub-reset clock line, a second sub-reset clock line, a second sub-scan initial signal line, a fourth sub-scan clock line, a second sub-scan clock line, a fourth sub-reset initial signal line, an eighth sub-scan clock line, and a sixth sub-scan clock line.

14. The display panel according to claim 13, wherein the non-display region is further provided with a fifteenth connection electrode to a seventeenth connection electrode located in the first conductive layer, and a first connection line, a second connection line and a third connection line located in the third conductive layer;

the fifteenth connection electrode is respectively connected to the first sub-reset initial signal line of the first reset initial signal line, and the first connection line;

the sixteenth connection electrode is respectively connected to the third sub-reset clock line of the second reset clock line, and the second connection line; and the seventeenth connection electrode is respectively connected to the first sub-reset clock line of the first reset clock line and the third connection line.

15. A display apparatus, comprising the display panel according to claim 1.

16. The display panel according to claim 13, wherein the active layer of the first light emitting transistor, the active layer of the second light emitting transistor, the active layer of the third light emitting transistor, the active layer of the fourth light emitting transistor, the active layer of the fifth light emitting transistor, the active layer of the sixth light emitting transistor, the active layer of the eighth light emitting transistor, the active layer of the ninth light emitting transistor and the active layer of the tenth light emitting transistor extend along the first direction, and the active layer of the seventh light emitting transistor extends along the second direction.

17. The display panel according to claim 13, wherein the active layer of the first reset transistor, the active layer of the second reset transistor, the active layer of the third reset transistor, the active layer of the fourth reset transistor, the active layer of the fifth reset transistor, the active layer of the sixth reset transistor, the active layer of the eighth reset transistor, the active layer of the ninth reset transistor and the active layer of the tenth reset transistor extend along the first direction, and the active layer of the seventh reset transistor extends along the second direction.

18. The display panel according to claim 13, wherein a conductive portion connected between the active layer of the first reset transistor and the active layer of the second reset transistor is reused as a second electrode of the first reset transistor and a first electrode of the second reset transistor.

19. The display panel according to claim 13, wherein a conductive portion connected between the active layer of the sixth scan transistor and the active layer of the seventh scan transistor is reused as a second electrode of the sixth scan transistor and a first electrode of the seventh scan transistor.

20. The display panel according to claim 2, further comprising an electrostatic discharge circuit, a third power supply line located in a second conductive layer, and a fourth power supply line located in a first conductive layer.

* * * * *